United States Patent
Kanno et al.

(10) Patent No.: US 7,217,963 B2
(45) Date of Patent: *May 15, 2007

(54) SEMICONDUCTOR INTEGRATED CIRCUIT DEVICE

(75) Inventors: Yusuke Kanno, Tokyo (JP); Hiroyuki Mizuno, Tokyo (JP); Naohiko Irie, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/320,751

(22) Filed: Dec. 30, 2005

(65) Prior Publication Data

US 2006/0102934 A1    May 18, 2006

Related U.S. Application Data

(63) Continuation of application No. 10/921,854, filed on Aug. 20, 2004, now Pat. No. 7,023,058.

(30) Foreign Application Priority Data

Nov. 13, 2003   (JP)   ............................ 2003-384237
Jun. 23, 2004   (JP)   ............................ 2004-185475

(51) Int. Cl.
    *H01L 29/73*   (2006.01)
(52) U.S. Cl. ...................... 257/207; 257/369; 257/758; 257/E29.255
(58) Field of Classification Search ................ 257/371, 257/758, 773, 204, 207, 369, E29.255

See application file for complete search history.

(56) References Cited

U.S. PATENT DOCUMENTS

| 5,293,005 | A  | * | 3/1994 | Yamamura | ................... 174/251 |
| 6,275,083 | B1 |   | 8/2001 | Martinez et al. | |
| 6,545,525 | B2 |   | 4/2003 | Itoh et al. | |
| 6,870,412 | B2 |   | 3/2005 | Cho | |
| 6,906,952 | B2 |   | 6/2005 | Yoshida et al. | |

OTHER PUBLICATIONS

Yamada, T., et al, "A 133MHz 170Mw 10μA Standby Application Processor for 3G Cellular Phones," 2000 IEEE International Solid-State Circuits Conference; ISSCC 2002/Session 22/Multimedia Signal Processing, pp. 370-371, 474-475, USA.

(Continued)

*Primary Examiner*—T. N. Quach
(74) *Attorney, Agent, or Firm*—Antonelli, Terry, Stout & Kraus, LLP.

(57) ABSTRACT

In a low power consumption mode in which prior data is retained upon power shutdown, the return speed thereof is increased. While use of an existent data retaining flip-flop may be considered, this is not preferred since it increases area overhead such as enlargement of the size of a cell. A power line for data retention for power shutdown is formed with wirings finer than a usual main power line. Preferably, power lines for a data retention circuit are considered as signal lines and wired by automatic placing and mounting. For this purpose, terminals for the power line for data retention are previously designed by providing the terminals therefor for the cell in the same manner as in the existent signal lines. Additional layout for power lines is no longer necessary for the cell, which enables a decrease in the area and design by an existent placing and routing tool.

23 Claims, 42 Drawing Sheets

OTHER PUBLICATIONS

Mutoh, S., et al, "FA 10.4: A 1V Multi-Threshold Voltage CMOS DSP With An Efficient Power Management Technique for Mobile Phone Application," ISSCC96/Session 10/Low-Power & Communication signal Processing; Feb. 1996, 3 pgs.; USA.

Zyuban, V. and Kosonocky, Stephen V., "Low Power Integrated Scan-Retention Mechanism," ISLPED '02, Aug. 12-14, 2002, Monterey, CA, USA. pp. 98-102.

Ito, Kiyoo, "Super LSI Memory," first published Nov. 5, 1994., cover page, pp. 270-271, and 378. [in Japanese]. Japan.

* cited by examiner

FIG. 28A
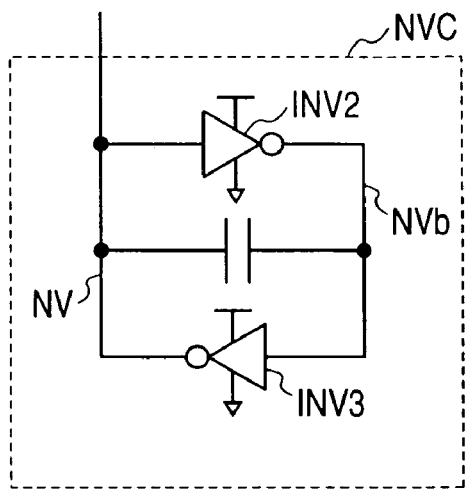
FIG. 28B
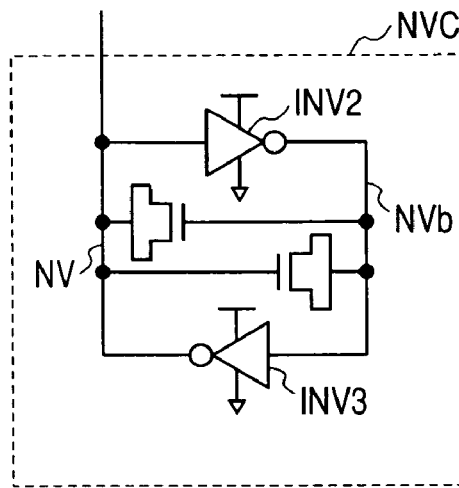
FIG. 28C
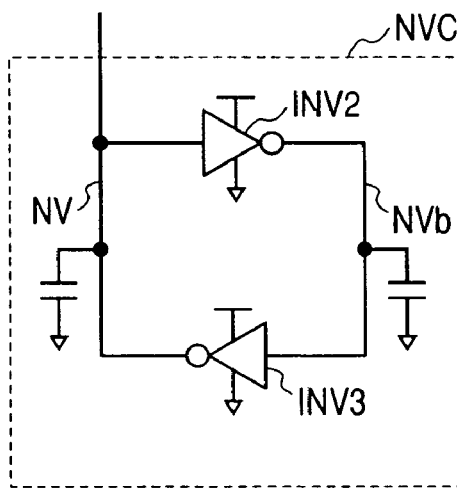
FIG. 28D
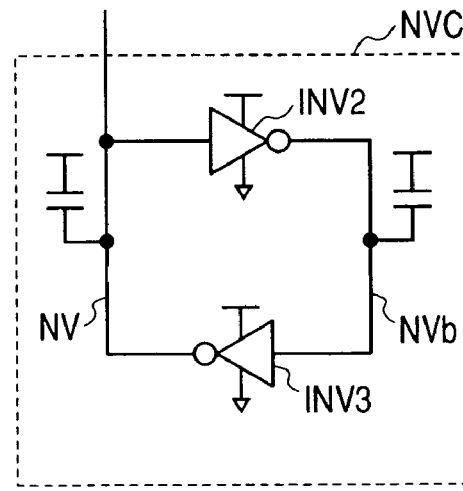
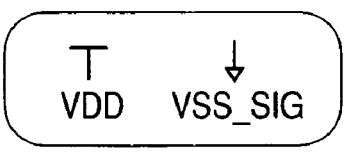

FIG. 34

| STATE | STATE OF POWER SUPPLY | | | TRANSITION METHOD | RETURN METHOD | RETURN TIME | CONSUMPTION CURRENT | INTERNAL INFORMATION |
|---|---|---|---|---|---|---|---|---|
| | AE1 | AE2 | AE3 | | | | | |
| NORMAL OPERATION | ON | ON | ON | | | | SEVERAL 100 mA | NON-VOLATILE |
| STBY1 | OFF | ON (CLK OFF) | ON | STBCR SET | EXTERNAL INTERRUPT | SEVERAL 100 us | ~100 μA | NON-VOLATILE |
| STBY2 | ON (CLK OFF) | ON (CLK OFF) | ON | STBCR SET | EXTERNAL INTERRUPT | SEVERAL 100 us | SEVERAL 10 mA | NON-VOLATILE |
| STBY3 | OFF | OFF | ON | STBCR SET | RESET | SEVERAL 100 ms | ~10 μA | VOLATILE |
| POWER OFF | OFF | OFF | OFF | | | | | VOLATILE |

SEMICONDUCTOR INTEGRATED CIRCUIT DEVICE

CROSS-REFERENCE TO RELATED APPLICATIONS

This application is a continuation of U.S. application Ser. No. 10/921,854, filed Aug. 20, 2004 (now U.S. Pat. No. 7,023,058); the entire contents of which is incorporated herein by reference.

CLAIM FOR PRIORITY

The present application claims priority from Japanese application JP 2003-384237 filed on Nov. 13, 2003, and Japanese application JP 2004-185475 filed on Jun. 23, 2004, the contents of which are hereby incorporated by reference into this application.

FIELD OF THE INVENTION

The present invention concerns a semiconductor integrated circuit device which is particularly useful when applied to system LSIs or micro processors.

BACKGROUND OF THE INVENTION

In system LSIs used for a gizmo (personal digital assistant (PDA), hand-held device) typically represented by mobile telephones, there has been an increasing demand for long time operation by a battery of restricted capacity. Particularly, in a mobile telephone, it is extremely important to reduce the power consumption during a long waiting time (a state in which the power source is turned on, but processing under high load is not conducted) in order to satisfy the requirement for long time operation. One of the methods includes stopping all clocks of the system LSI in the standby mode (referred to as a software standby state which is called a standby mode with gating of the system clock distribution). In the software standby state, since clocks in the system LSI are stopped upon entering the standby mode, the consumption of current by the circuit operation in the system LSI is reduced to substantially zero. Accordingly, the standby current in the standby mode consists only of the consumption of current due to leakage current.

However, in a case of using an insulated gate type field effect transistor using a modern fine process (in the present application, the insulated gate type field effect transistor is referred to as a MISFET), various kinds of leakage current are extremely large, being typically represented by a sub-threshold leakage current caused by lowering of the threshold voltage of transistors in accordance with the voltage lowering of the power voltage or gate tunneling leakage current caused by reduction of the thickness of the gate insulation film in a MISFET. Since the standby current consumes power, a long waiting time cannot be attained.

With the situations described above, a method for effecting shut down of the power for the system LSI during the standby mode (referred to as the U-standby mode) has been proposed by T. Yamada, et al., "A 133 MHz 170 mW 10 μA Standby Application Processor for 3G Cellular Phones". ISSCC 2002, February, pp. 370–371 (Non-patent Document 1). In the U-standby mode, the supply of power is shut down except for circuits of a minimal number required for returning when it enters into the waiting state. As a result, not only the consumption of current by the circuit operation, but also the consumption of current due to leakage current are reduced substantially to zero, and the standby current can be reduced to substantially zero.

Then, when both of them are compared in view of the returning time from the standby mode, they are as described below. At first, in the software standby state, since the internal status of the system LSI (such as a register value) can be retained also in the standby mode, it is possible to return from the standby mode by interruption. Accordingly, the time required for returning is about equal to the time necessary for restarting the clocks, and so it can be returned at high speed. On the contrary, in the U-standby mode, since the internal status of the system LSI is destroyed by the power shutdown, it cannot be returned from the standby mode only by interruption, and so resetting is necessary for the return to operation. The resetting includes booting of the software necessary for the initialization and operation of the system LSI and needs a long time. Since software booting needs a number of instructions to be conducted, the processing time is particularly long. In a the case of returning from the U-standby mode, the interruption is not conducted for the interruption request as it is, but resetting is first applied and then processing corresponding to the interruption request is conducted after booting of the software.

Further, as disclosed in S. Mutoh, et al., "A 1V Multi-Threshold Voltage CMOS DSP with an Efficient Power Management Technique for Mobile Phone Application, ISSCC 1996, February, pp. 168–169 (Non-patent Document 2), and V. Zyuban, et al., "Low Power Integrates Scan-Retention Mechanism", ISLPED 2002, August, pp. 98–102 (Non-patent Document 3), it has been proposed to supply power to a portion of the data retention circuits in the circuit block under power shutdown in the standby mode to retain the data also in the standby mode. Specifically, a latch circuit supplied with power even in a standby mode is disposed to the flip-flop in the circuit block and it operates to retain the internal data also during power shutdown by the latch circuit, thereby enabling a return to the original state at high speed.

SUMMARY OF THE INVENTION

The present inventors have studied the data retention circuits as described above and have found that they involve the following considerations. FIG. 2 shows the circuit arrangement of a flip-flop with data retention in a power down mode as disclosed in Non-patent Document 3. This circuit has a constitution in which power for the main latch part (master latch) is shut down during the standby mode, and data is retained during the standby mode by the sub-latch part (scan/retention latch) which is usually supplied with power. The power supply for the main latch part and combinational circuits connected therewith is connected by way of a power switch to an unillustrated virtual power line, and it shows the necessity for a virtual power line directly connected with the main latch part and combinational circuits connected therewith in addition to the power line (VDD, GND). Accordingly, it has been found that for the layout of the circuit constitution shown in FIG. 3, at least three power lines, i.e., VDD, VSS, and a virtual power line are necessary (in a case of providing a power switch on one side of VDD or VSS), and at least three power lines have to be laid out for one cell.

This is attributable to the fact that a general system LSI is laid out by arranging standard cells (hereinafter simply referred to as cells) by automatic placing and routing using CAD. FIG. 3 is a view showing a layout for an integrated circuit constituted by placing the cells. However, only the cells and the main power lines are illustrated, with signal wirings, etc. being omitted. The cells are represented by rectangles 301 and 302. Each cell is mounted with circuits for attaining basic logic, such inverters, NANDs or the like. A desired logic circuit is obtained by laying out the cells and wiring them to each other. While the scale of the circuits is different depending on the basic logic attained by the cells, it is typical to align the cell height (direction y) and vary the cell width (direction x) in accordance with the circuit. This is attributable to conducting the layout for main power lines in a mesh-like form. That is, since power lines 303a to 303g extending in the direction x are placed in the first metal layer substantially at an equal distance relative to each other to supply power necessary for circuit operation, the layout for the main power lines and the layout for the cells are aligned.

Under the design environment for the layout, even when only a portion of the cells require wirings both for the power line and the virtual power line (flip-flop), such power lines and virtual power lines have to be wired also for other cells not requiring data retention during power shutdown (for example, an inverter, NAND circuit, etc.). Accordingly, if a power line identical with the virtual power line is further laid out relative to the first metal layer, the cell height will be increased and the effect on the entire layout is no longer negligible. On the other hand, if it is intended to further layout the main power line while fixing the height of the cell as it is by utilizing the wiring channel for signal lines, there may be a worry that the degree of freedom for the signal line is extremely restricted.

As described above, no consideration has been given to the layout for retaining data in flip-flop cells that are distributed and placed as described above also during power shutdown and for suppressing the overhead of the circuit area under the existent design environment for layout.

In accordance with the present invention, notice has been taken of the fact on that the data retention circuit for retaining data during power shutdown requires no such large current supply performance as required for normal operation, and it has been determined to supply an operation voltage by a power line that is smaller in size than the usual main power line. Preferably, the power line for the data retention circuit is considered as a signal line and is wired upon placing and routing by using CAD. This is adaptable for the CAD-assisted design environment for a layout. In this case, the power terminals for the data retention circuit are previously disposed to the cell in the same manner as for the usual signal line terminals. This no longer requires an additional layout for the power lines in the cell to enable area saving and, in addition, design by existent placing and routing tools is enabled.

The returning time from the power shutdown can be shortened drastically, and, therefor, the overhead to the circuit area can be decreased.

BRIEF DESCRIPTION OF THE DRAWINGS

FIG. 28A is a schematic circuit diagram showing a modified embodiment of a nonvolatile flip-flop for improving the noise immunity;

FIG. 28B is a schematic circuit diagram showing a modified embodiment of a nonvolatile flip-flop for improving the noise immunity;

FIG. 28C is a schematic circuit diagram showing a modified embodiment of a nonvolatile flip-flop for improving the noise immunity;

FIG. 28D is a schematic circuit diagram showing a modified embodiment of a nonvolatile flip-flop for improving the noise immunity;

FIG. 34 is a comparison table for low current consumption modes;

DETAILED DESCRIPTION OF THE PREFERRED EMBODIMENTS

Figure 1:
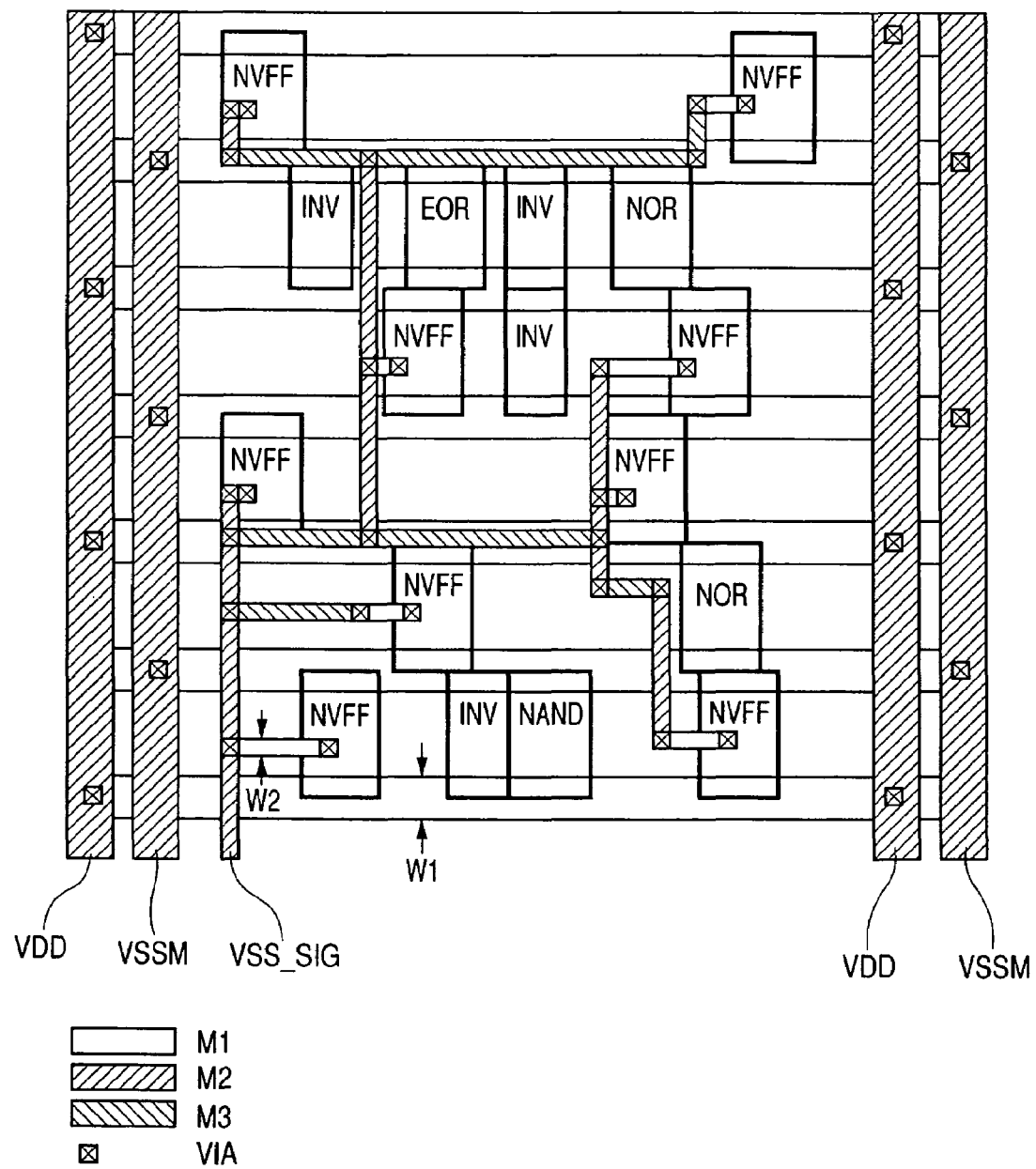
FIG. 1 is a diagram showing an example of a layout for power lines in accordance with the present invention.
Figure 2:
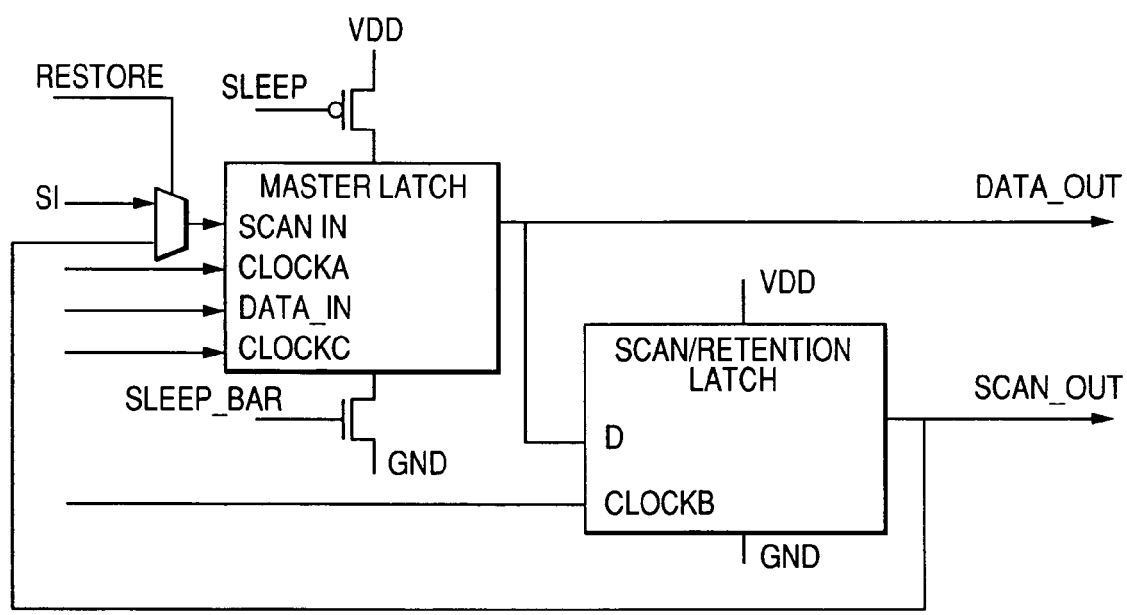
FIG. 2 is a schematic diagram which shows an example of a flip-flop for data retention.

FIG. 1 shows an embodiment of a layout image of chip wirings in accordance with the present invention. The drawing shows an example in which usual main power lines, that is, power lines VDD (for example, at 1.2 V) and virtual power lines VSSM (0 V), and a power line for data retention VSS_SIG (0 V) for a nonvolatile flip-flop NVFF (hereinafter referred to nonvolatile FF) are wired. In this example, since it is assumed that the power line on the ground side (low potential side) is placed under shut down control during a standby mode, the power line on the low potential side constitutes the virtual power line VSSM. In the placing and routing tool, the virtual power line VSSM is considered as a substantial ground line of the cells. As illustrated in the drawing, the power line VSS_SIG is connected with terminals of the nonvolatile FF NVFF dispersed in a circuit block by the placing and routing tool by using CAD by way of an optional route and by using optional wiring layers.

By wiring the power line VSS_SIG as described above, since a layout can be produced by placing and routing by using CAD while replacing existent flip-flop cells with nonvolatile FF cells without changing the layout dimension of each of the functional circuits (cells), such as inverter circuits or NAND circuits, the design can be facilitated.

Now, the wiring widths in a predetermined wiring layer (first metal layer M1 in the drawing) will be compared. Assuming that the wiring width for the main power line is W1, the wiring width for the power line for data retention VSS_SIG is W2, and the wiring width for a signal line not illustrated (wiring connected with the input/output terminal of the cell) is W3, a relation: W1>W2=W3 is established. Taking the process scattering for the wiring width into consideration, a relation: (W1−W2)>(W3−W2) is established.

Figure 4:
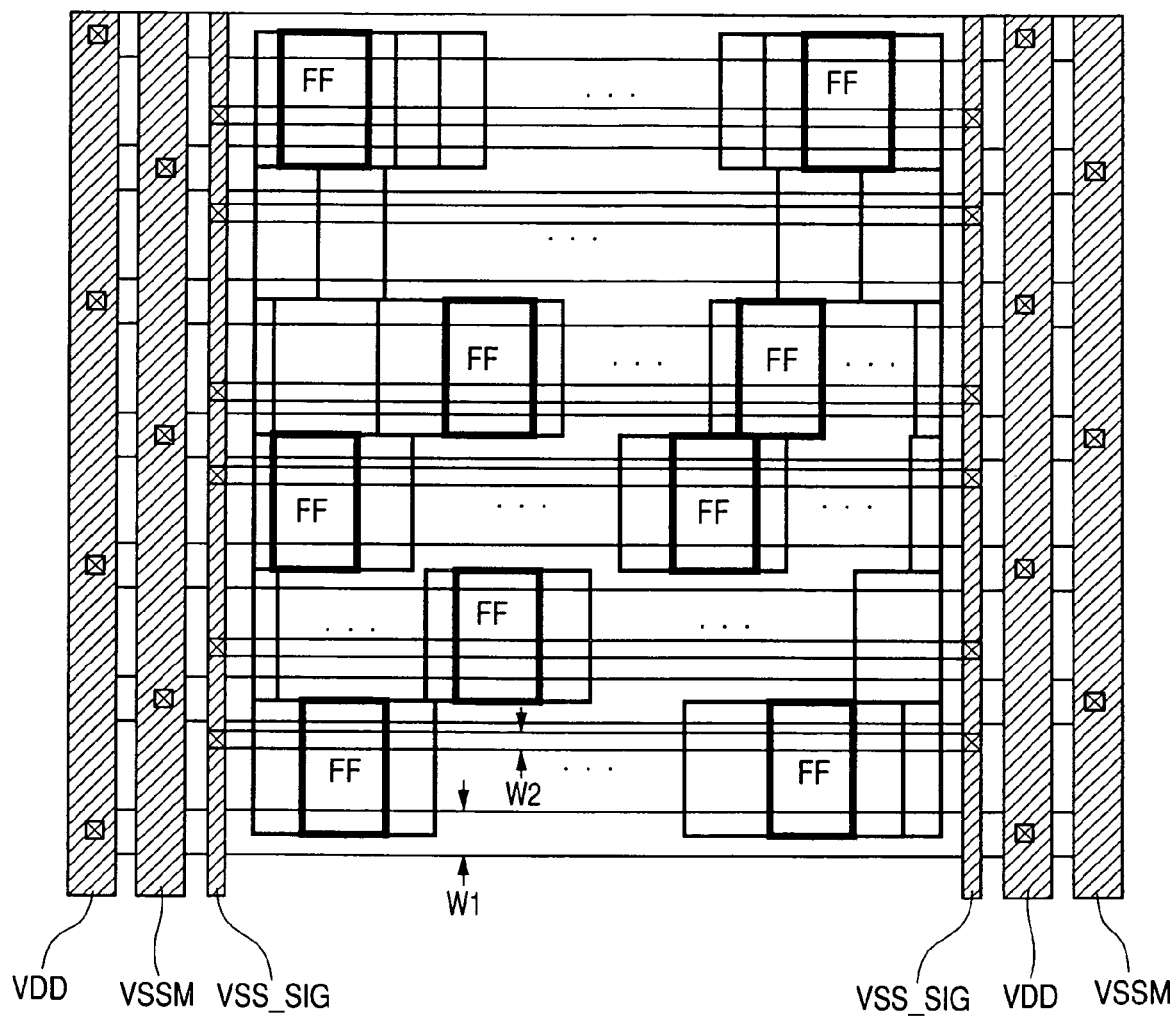
FIG. 4 is a diagram showing another example of a layout for power lines in accordance with the present invention.
Figure 5:
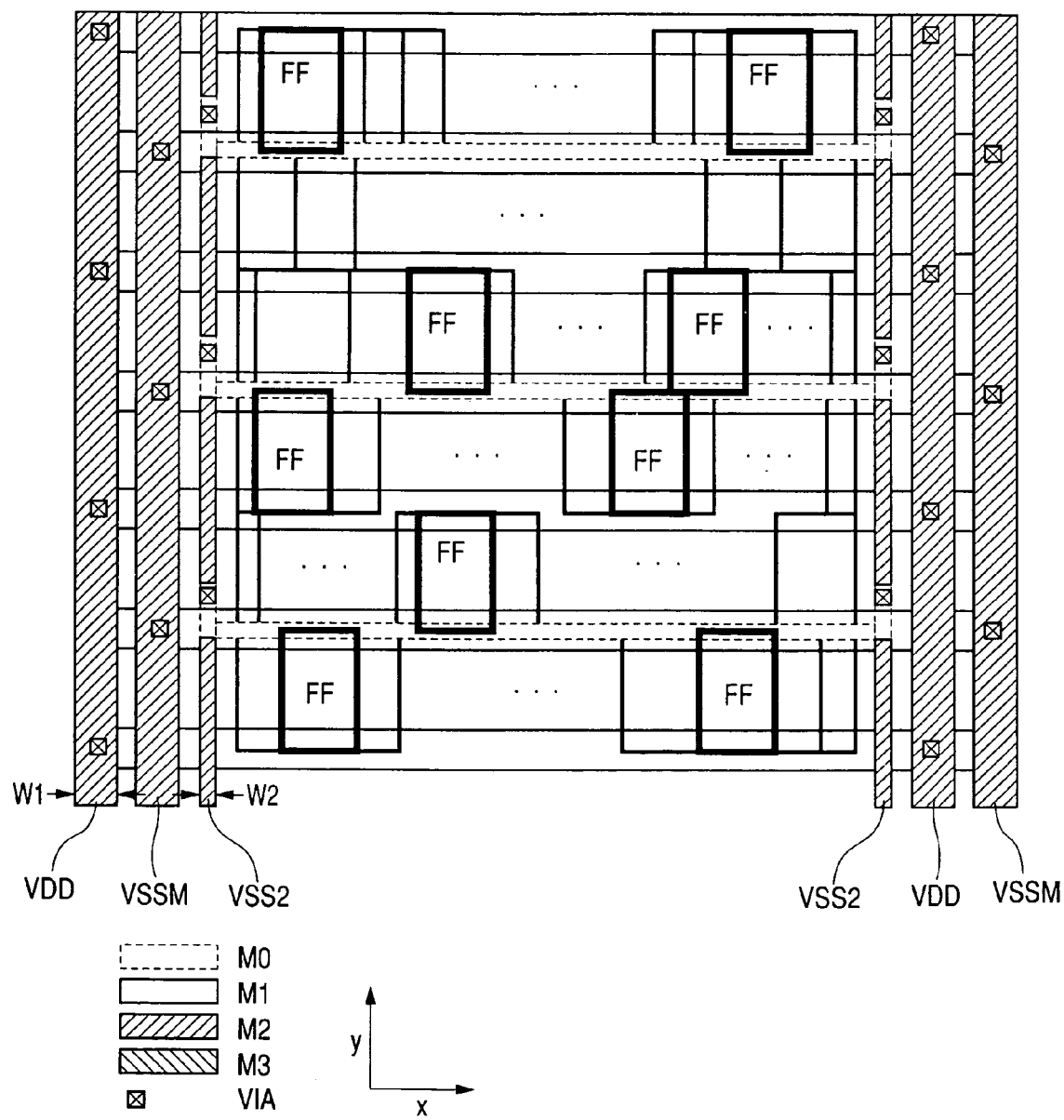
FIG. 5 is a diagram showing a further example of a layout for power lines in accordance with the present invention.

FIG. 4 and FIG. 5 show other examples of the wiring layout. The degree of freedom of the wire connection in this example is less than that of the example in FIG. 1, but it has an advantage in that layout can be carried out simply in a case where the wiring channel has a margin. It has a feature in the layout of suppressing the area overhead by additional wirings by decreasing the wiring width for the power line for data retention VSS_SIG to less than that of the main power line, while taking notice of the fact that the current supply performance of the power line for data retention VSS_SIG may be smaller than that of the main power line. In FIG. 4, the power line for data retention VSS_SIG, having a narrower wiring width compared with that of the main power line, is arranged in parallel in a layer identical with the main power line. This sometimes requires increasing the height of the cell. On the other hand, in FIG. 5, the power line for data retention VSS_SIG of a narrower wiring width compared with that of the main power line, is arranged in the layer below the main power line M1 (for example, metal 0 layer M0). This may save the consumption of the wiring channel and needs no increase for the cell height. Accordingly, the layout in FIG. 5 can be more compact than the layout in FIG. 4. However, since the material for the metal is often different in layer M0 generally, the resistance of the wiring may possibly be increased. The wiring form of the type shown in FIG. 5 is the result of a known wiring method in a so-called substrate bias control of controlling the substrate electrode for the circuit independently of the power line. Also, in this case, assuming the wiring width of the main power line is W1, the wiring width for the power line for data retention VSS_SIG is W2, and the wiring width of the not illustrated signal line is W3, a relation: (W1−W2)>(W3−W3) is established.

Figure 3:
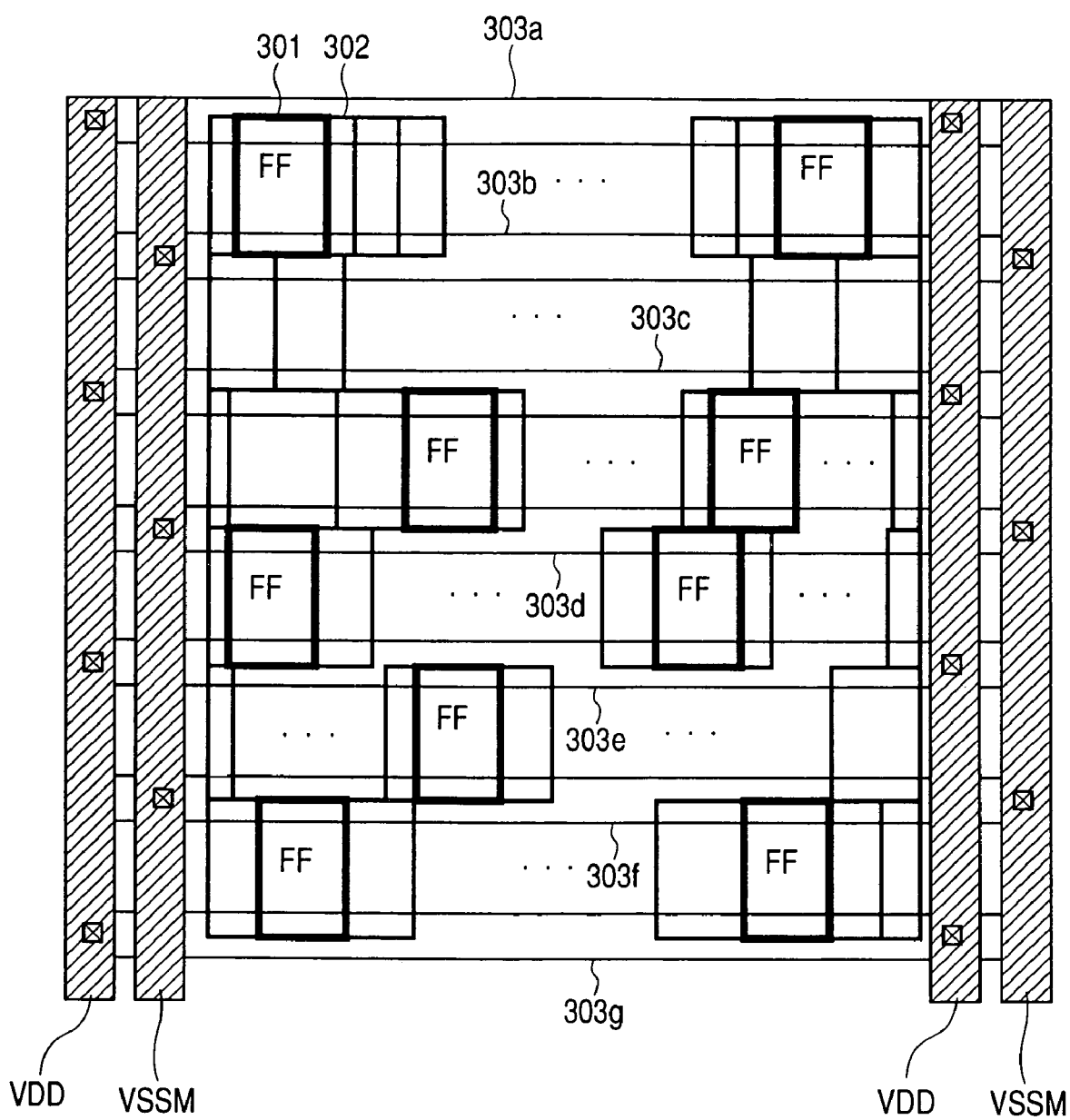
FIG. 3 is a diagram which shows an example of a semiconductor integrated circuit formed by laying out standard cells.

The reason why the power line for data retention of a nonvolatile FF NVFF can be wired by a method different from that of the existent main power line will be described more specifically. Generally, it is necessary that the resistance of the main power line should be lowered in order to maintain the speed of a MISFET constituting a functional block. For this purpose, the main power lines are wired in a mesh, as shown in FIG. 3. However, since it may suffice that the power supplied during the power shutdown state of the nonvolatile FF NVFF may be such that the leakage current during the standby mode can be supplied, an increase in the resistance of the wiring gives no significant problem. For example, assuming that the size of a MISFET necessary for retaining data of one nonvolatile FF NVFF during standby mode is 1 μm by the gate width and that the gate voltage for flowing 1 nA per unit width (1 μm) at a normal temperature (25° C.) of constituting MISFET is 0.15 V, the leakage current during the standby mode per one nonvolatile FF NVFF is about 30 pA. Assuming that the rate of the flip-flops in a chip is about 4000 N/mm$^2$ and considering a chip of 7 mm×7 mm in size, the total number of the all nonvolatile FF NVFF is 196,000, and the leakage current is about 6 μA. Even when it is assumed that the number is larger by a factor of 1.5 considering the scattering in the manufacture (threshold value variation: 100 mV) and high temperature (45° C.), the leakage current is about 180 μA. Since the current only at such a level is necessary, the power line for data retention during power shutdown for a nonvolatile FF NVFF does not need the use of a general main power line structure.

However, at a high temperature, such as 80° C., since the DC current increases, there may be a worry of electromigration for fine wirings. Also, in such a case, since the current necessary for individual cells is still small, this can be coped with by enlargement of the wiring width for wiring at the base for branching on the side of the controlled circuit in the standby mode STBYC through which a great amount of current flows, or by increasing the number of through holes at the portion. In the layout shown in FIG. 5, it can be coped with by increasing the width of the power line existing in the longitudinal direction.

Figure 6:
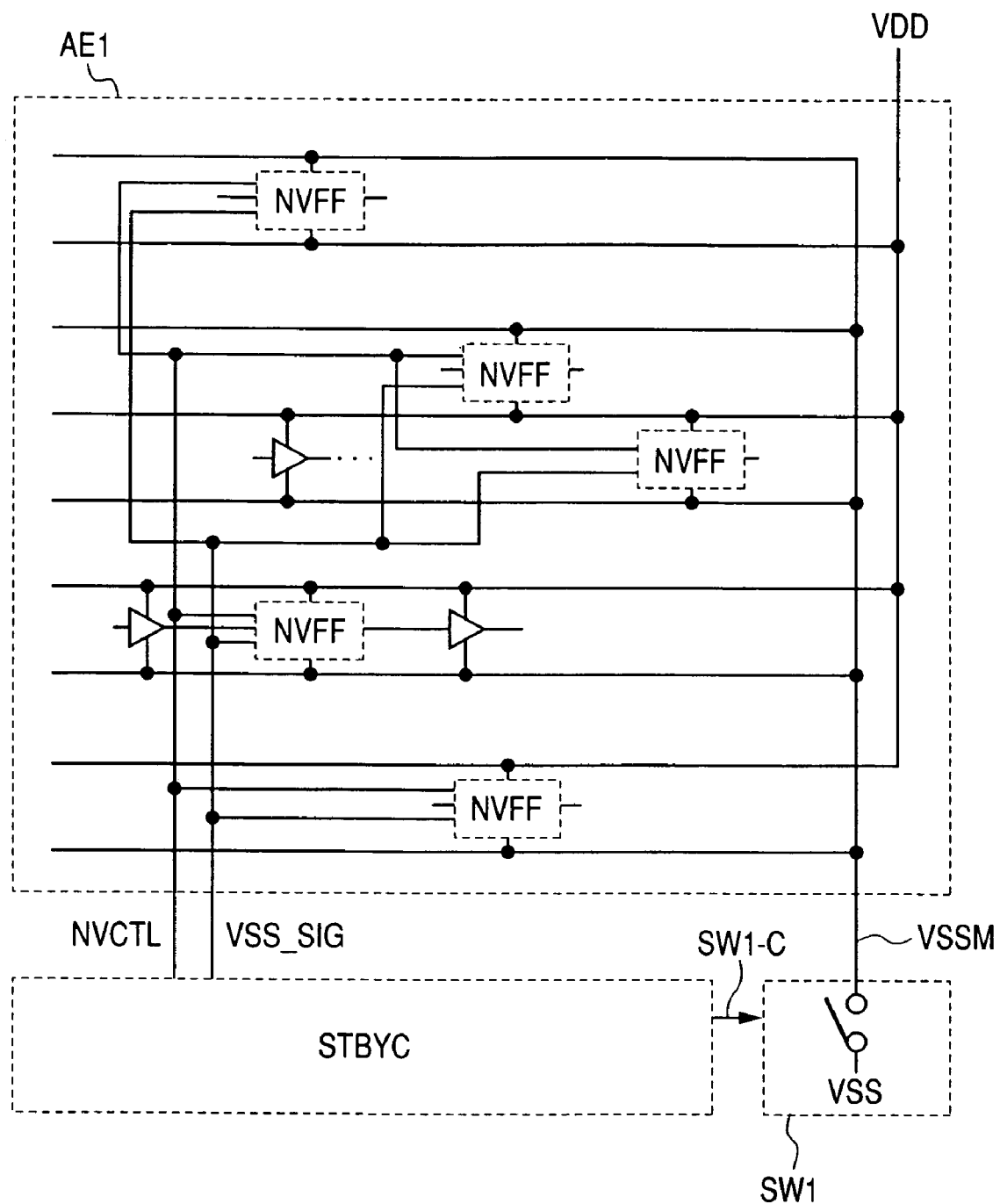
FIG. 6 is a schematic circuit diagram showing wirings in which the invention is applied to a case of power shutdown on the ground side.

Now, connection between each of the circuit elements will be described. FIG. 6 shows an example of power shut-down from the ground side during the standby mode corresponding to the layout in FIG. 1, and this is a circuit diagram also including the control system therefor. It shows a functional block AE1 put under power shut-down control during the standby mode, a power switching circuit SW1 for controlling the power supply to the function block AE1 and a control circuit in standby mode STBYC for controlling the nonvolatile FF NVFF and the power switching circuit SW1 of the function block AE1. As will be described later in conjunction with FIG. 32, a central processing unit CPU (hereinafter referred to simply as a CPU), a digital signal processor (hereinafter referred to simply as a DSP) and embedded circuit modules, such as an MPEG accelerator, are integrated, for example, in the function block AE1. Power is normally supplied to the control circuit in the standby mode STBYC, and the power is supplied continuously unless the power is shut down from the outside of the chip. The function block AE1 has a feature in that logic circuits are integrated and the nonvolatile FF NVFF of the invention is used for the flip-flop thereof. In a case where the function block AE1 is placed under power shut-down control, the control circuit in the standby mode STBYC conducts shutdown control for the power switching circuit SW1 by a control signal SW1-C and controls the nonvolatile FF NVFF by an NVFF control signal group NVCTL. Further, the power line for data retention VSS_SIG during power shut-down for the nonvolatile FF NVFF is also supplied with power from the control circuit in the standby mode STBYC and is connected by way of an optional route to the nonvolatile FF NVFF in the function block AE1. The connection may be in the form of a daisy chain, or it may be connected in a tree type. It may also be wired freely using a placing and routing method by placing and routing using CAD. In FIG. 6, the circuit is drawn such that the power line for data retention VSS_SIG is connected from one terminal of the control circuit in, standby mode STBYC to all of the nonvolatile FF NVFF, but it may be connected from two or more of the terminals of the control circuit in the standby mode STBYC to the nonvolatile FF NVFF. Such a constitution can decrease the number of nonvolatile FF NVFF connected per one terminal of the control circuit in the standby mode STBYC, to provide the advantage of lowering the current supply performance required for the power line for data retention VSS_SIG. However, since it is necessary to previously group the nonvolatile FF NVFF on every terminal in a case of wiring using a placing and routing tool, this complicates the layout step.

Figure 7A:
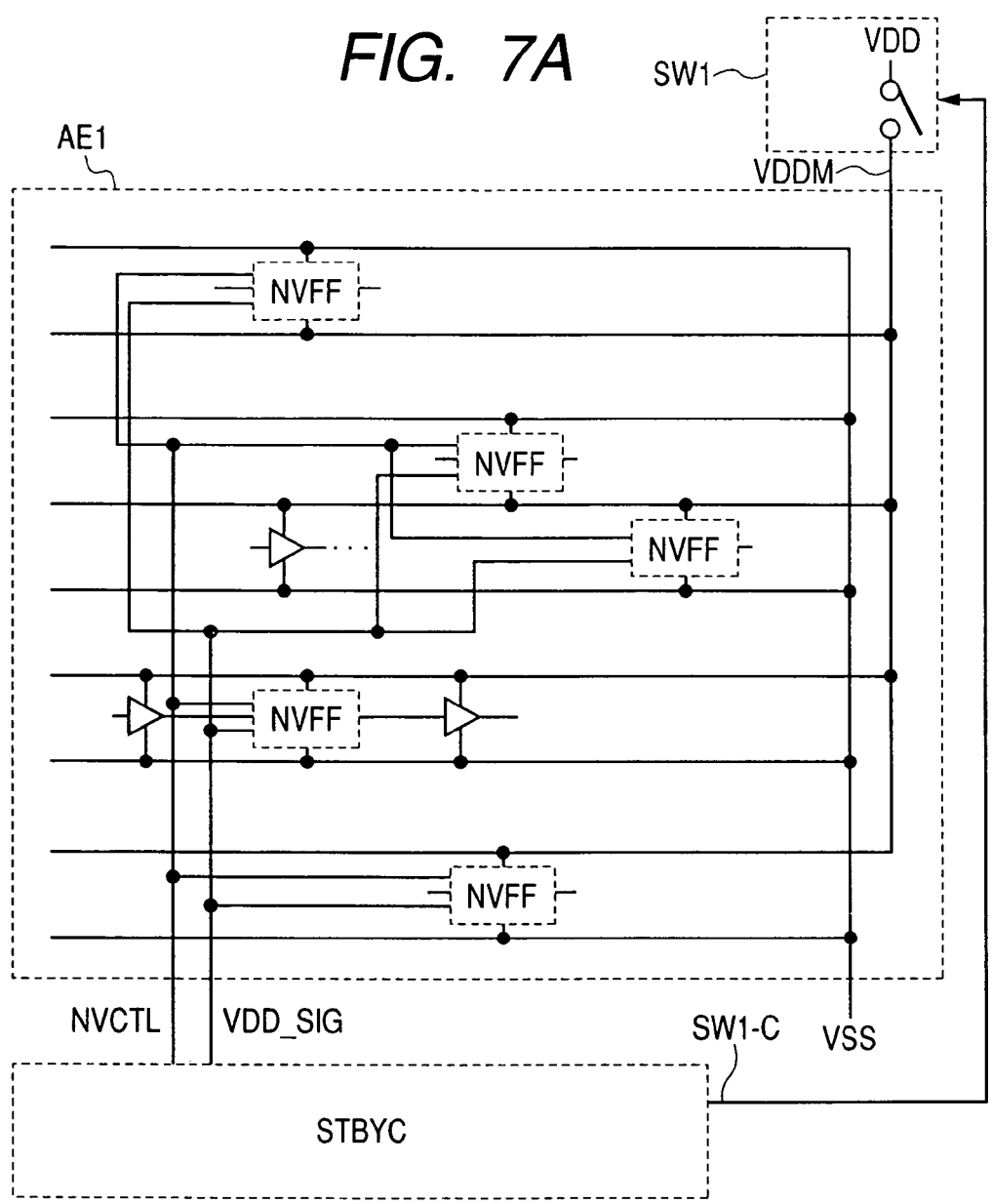
FIG. 7A is a schematic circuit diagram showing wirings in which the invention is applied to a case of power shutdown on the high voltage side.
Figure 7B:
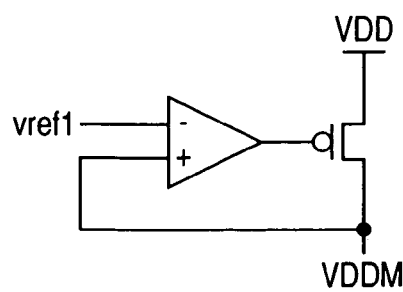
FIG. 7B is a schematic diagram which shows an example of a circuit constituting a power switch SW1 by a voltage regulator.

FIG. 7A shows another example of the connection between each of the circuit elements. In this case, the function block AE1 is power-shutdown on the high potential side (VDD) by the power switching circuit SW1, and control is conducted by a control signal SW1-C from the control circuit in the standby mode STBYC. The NVFF control signal group NVSTL and the power line for data retention VSS_SIG are identical with those in FIG. 6. The constitution of FIG. 7A is effective in a case where the function block AE1 supplies internal power while regulating the external power. The power switching circuit SW1 may be replaced with a regulator. FIG. 7B shows an example of such a constitution. The circuit is disclosed in "Super LSI Memory" written by Kiyoo Ito, in page 271, published from Baifukan (first print issued in 1994).

Figure 8:
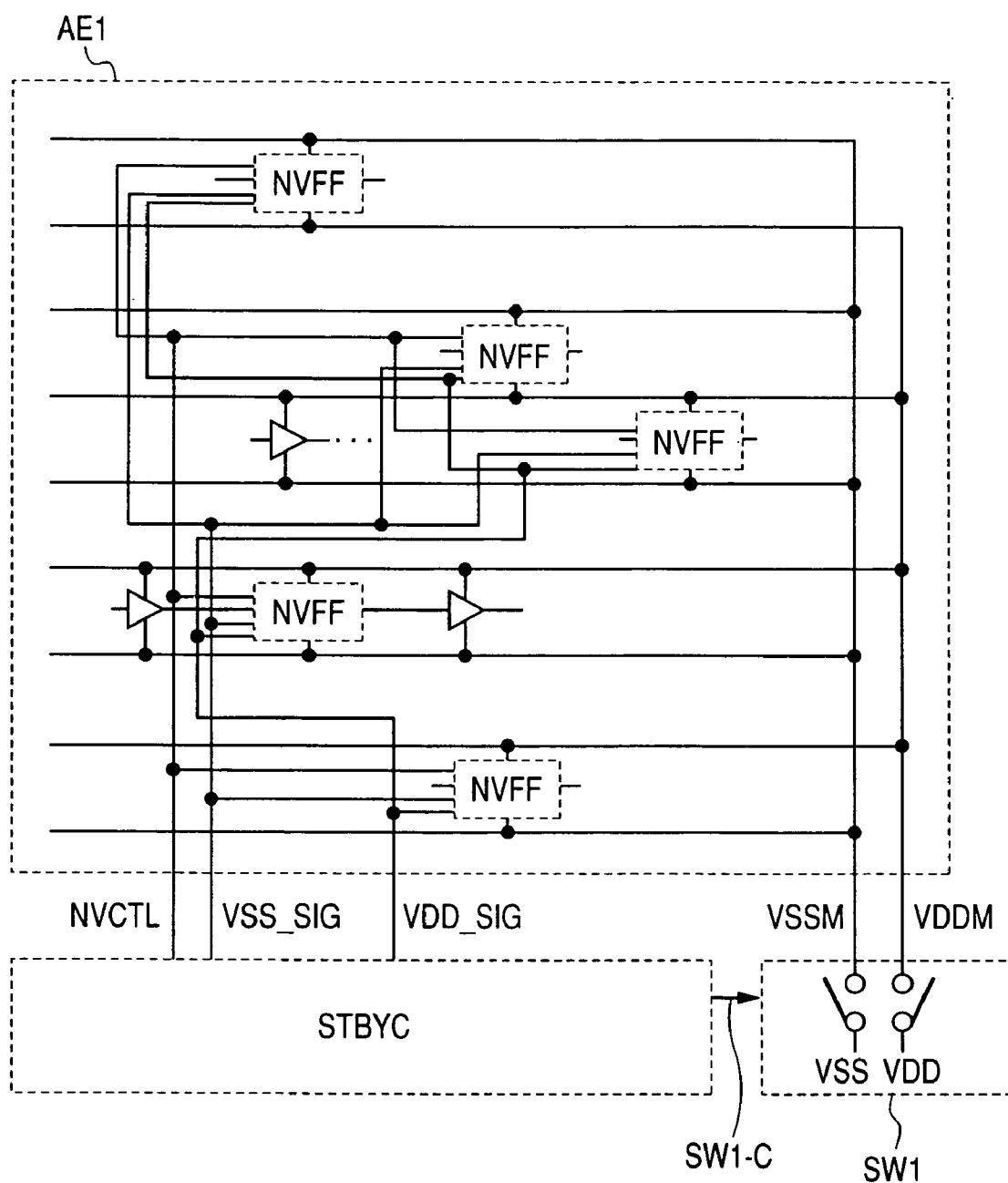
FIG. 8 is a schematic circuit diagram showing wirings in which the invention is applied to a case of power shutdown both on the ground side and the high voltage side.

FIG. 8 shows a further example of the connections between each of the circuit elements. Power shut-down to the function block AE1 is conducted by shutting down both the high potential side power line for data retention VDD and the low potential side power line for data retention VSS by the power switching circuit SW1. The control is conducted by the control signal SW1-C from the control circuit in the standby mode STBYC. This example has a feature in that it requires two types of power line for data retention, that is, a power line for data retention VDD_SIG on the high potential side and a power line for data retention VSS_SIG on the low potential side.

As described above, the invention is applicable for shutting down on any of the low potential side and the high potential side. An example of shutting down the power on the low potential side will be described. That is, unless otherwise specified, a global grounded power supplied to each of the cells in the chip is provided by a virtual power line VSSM by way of the N-type MISFET for power switching from a real grounded VSS, and the ground power supplied to the nonvolatile part is provided by a power line VSS_SIG. While there is no particular restriction, the power shutdown N-type MISFET is constituted with a MISFET having a large gate dielectric film thickness and a high threshold voltage, for example, an I/O circuit, etc. The subthreshold leakage current flowing through the circuit in the standby mode can be decreased effectively by using this type of N-type MISFET, which has large threshold voltage, and a so-called gate tunneling leakage current flowing through the circuit can also be reduced effectively by means of the thick gate dielectric film. In this case, the control signal SW1-C has an amplitude in accordance with a high voltage for an I/O, for example (3.3 V).

As one of the features, the invention has a mechanism of retaining the internal data for a CPU and embedded circuit modules by a nonvolatile FF NVFF present in the modules, and, desirably, it adopts a design method of wiring the power line for data retention to the nonvolatile FF NVFF as a signal line. The difference between the signal power line used for the nonvolatile FF NVFF and a general main power line in view of the apparatus is that, since the signal power line is connected ad hoc in the design stage of placing and routing the cells, the wiring does not have a neat geometrical pattern and takes a random connection, as shown in FIG. 1. It has an advantageous effect of increasing the degree of design freedom due to free wiring by the placing and routing tool, and so it is capable of providing an efficient layout.

Figure 9A:
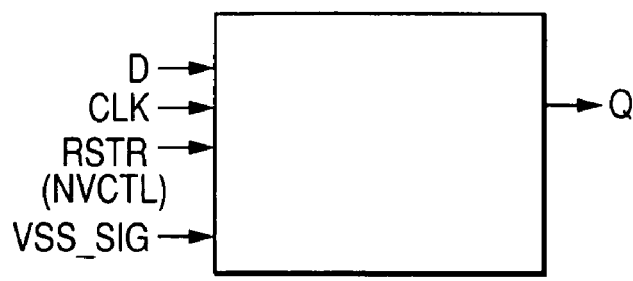
FIG. 9A is a diagram showing the symbols for the cell of a nonvolatile flip-flop in accordance with the invention.

FIGS. 9A to 9D are views showing symbols for the nonvolatile FF cell (NVFF cell) used in the placing and routing tool. FIG. 9A shows an example of using only one signal line RSTR as a data retention control signal group NVCTL of a nonvolatile FF NVFF. The NVFF cell comprises each of input pins for D (data input pin), CLK (clock pin), RSTR (nonvolatile FF control pin), and VSS_SIG (signal power input pin) and output pins for Q (data output pin).

Figure 9B:
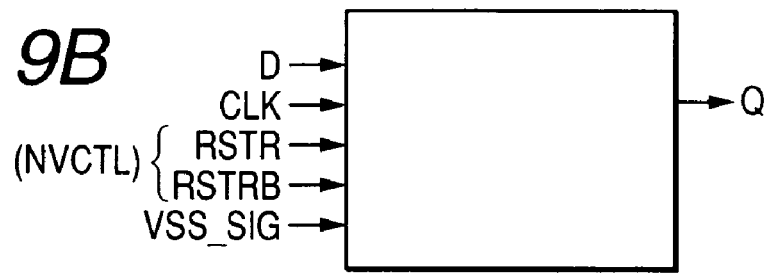
FIG. 9B is a diagram showing the symbols for the cell of a nonvolatile flip-flop in accordance with the invention.

On the other hand, FIG. 9B shows an example of using two signals lines RSTR and RESTRb as a data retention control signal group NVCTL of the nonvolatile FF NVFF. The NVFF cell comprises each of input pins for D (data input pin), CLK (clock pin), RSTR and RSTRb (nonvolatile FF control pin) and VSS_SIG (signal power line input pin) and output pins for Q (data output pin).

Figure 9C:
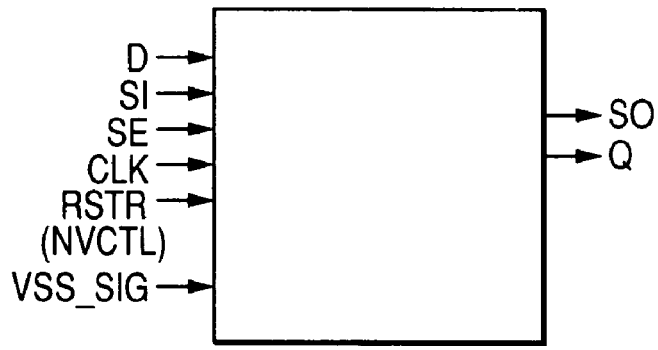
FIG. 9C is a diagram showing the symbols for the cell of a nonvolatile flip-flop in accordance with the invention.

FIG. 9C shows an example of a nonvolatile FF with a scan function in a case of using only one signal line RSTR as a data retention control signal group NVCTL thereof. The NVFF cell has a feature of comprising each of inputs for D (data input pin), SI (scan data input pin), SE (scan enable pin), CLK (clock pin), RSTR (nonvolatile FF control pin), VSS_SIG (signal power input pin), and each of output pins for Q (data output pin) and SO (scan data output pin).

Figure 9D:
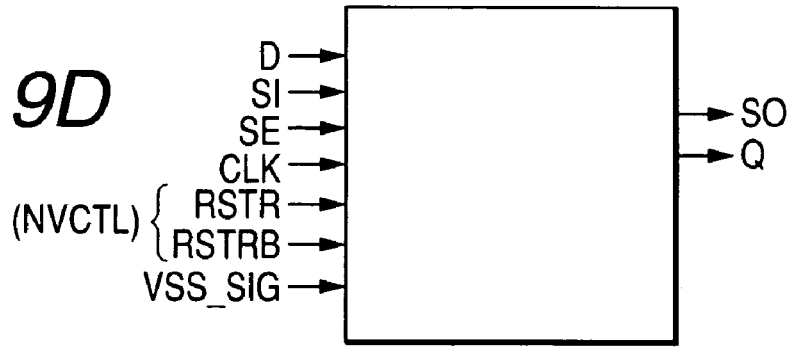
FIG. 9D is a diagram showing the symbols for the cell of a nonvolatile flip-flop in accordance with the invention.

FIG. 9D also shows an example of a nonvolatile FF with a scan function, in a case of using two signal lines RSTR and RSTRb as the data retention control signal group NVCTL. The NVFF cell has a feature of comprising each of inputs for D (data input pin), SI (scan data input pin), SE (scan enable pin), CLK (clock pin), RSTR and RSTRb (nonvolatile FF control pins) and VSS_SIG (signal power input pin), and each of output pins for Q (data output pin), and SO (scan data output pin).

The cell symbols illustrated here are only examples, and the cells may be constituted such that the group of output signal lines output inverted signals.

Figure 10:
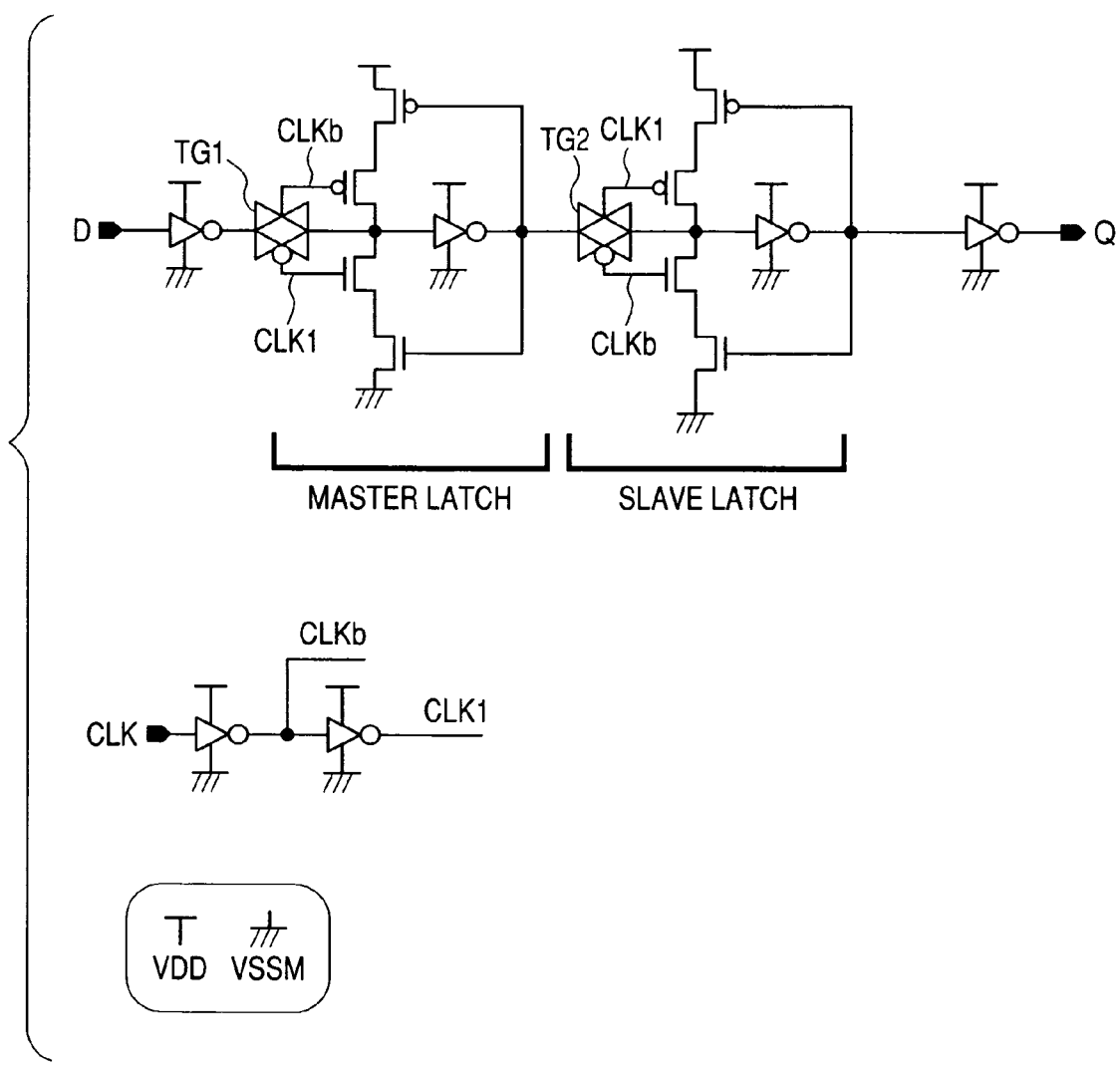
FIG. 10 is a schematic circuit diagram showing an example of a master-slave latch.

Now, a concrete example of the nonvolatile FF will be described. FIG. 10 shows a master-slave latch (flip-flop circuit) not having a data retention function upon power shutdown. Combinational circuits are connected before and after the master-slave latch to constitute a synchronous circuit.

In the circuit shown in FIG. 10, a transmission gate TG1 of the master latch is closed to latch data upon the rising edge of a clock (CLK: L→H), while a transmission gate TG2 of the slave latch opens to output the data taken in the master latch to the output Q. On the other hand, at the falling edge of the clock (CLK: H→L), the transmission gate TG1 of the master latch opens while the transmission gate TG2 of the slave latch is closed to retain the data in the slave latch.

Figure 11:
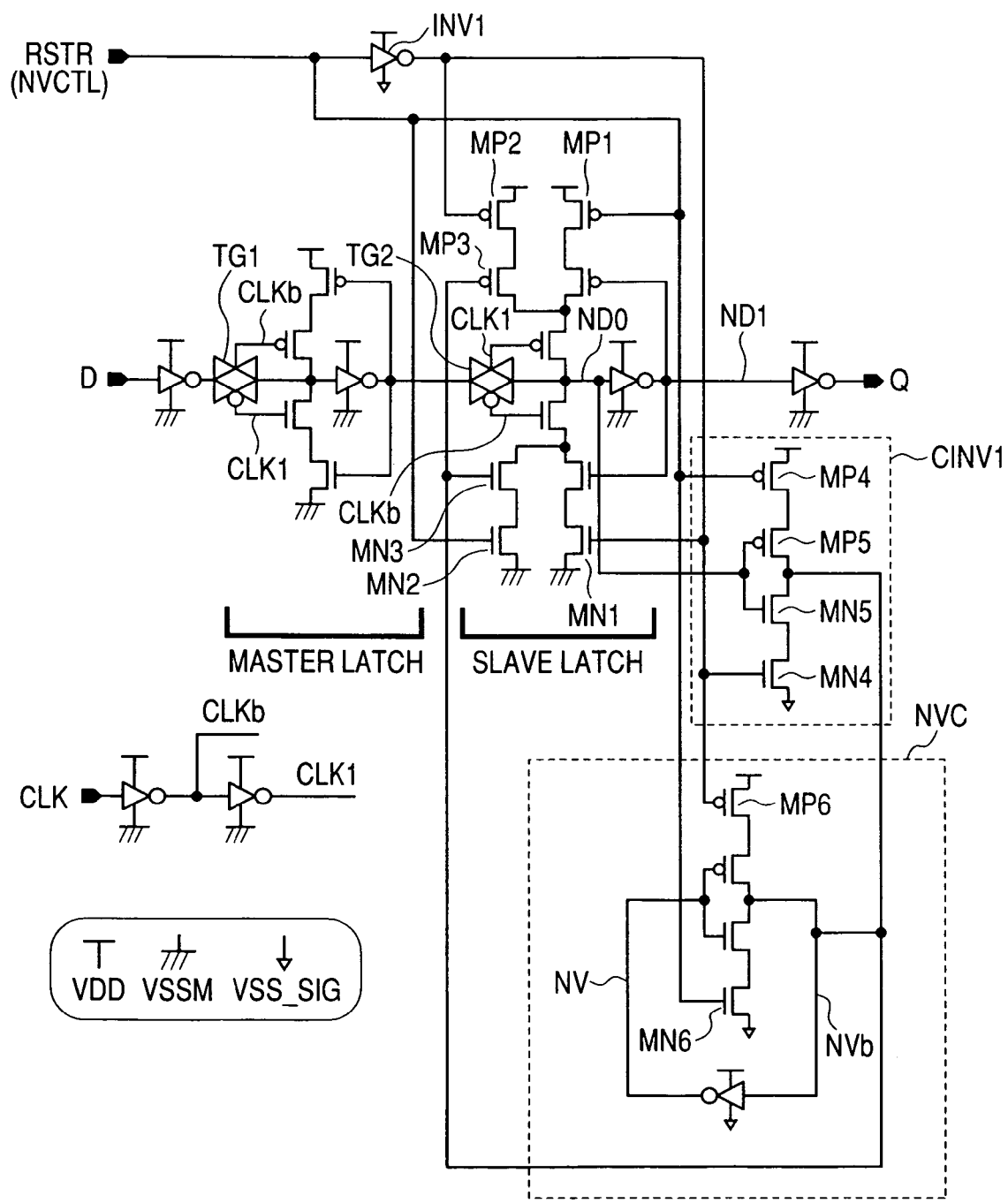
FIG. 11 is a schematic circuit diagram showing a nonvolatile flip-flop (master-slave latch) in accordance with the invention.

FIG. 11 shows an example of a nonvolatile master-slave latch in accordance with the invention. It is different from the master-slave latch shown in FIG. 10 in that it additionally provides a control signal RSTR, a non-volatile circuit NVC, control MOS (MP1, MN1) for the slave latch, a clocked inverter C1NV1 in the connection interface for the NVC and a slave latch (constituted with MP4, MP5, MN4, and MN5), a selector (MP2, MP3, MN2, MN3) for writing back NVC data to the slave latch, and VSS_SIG as a power source to circuits necessary upon power shutdown, such the as NVC.

Figure 12:
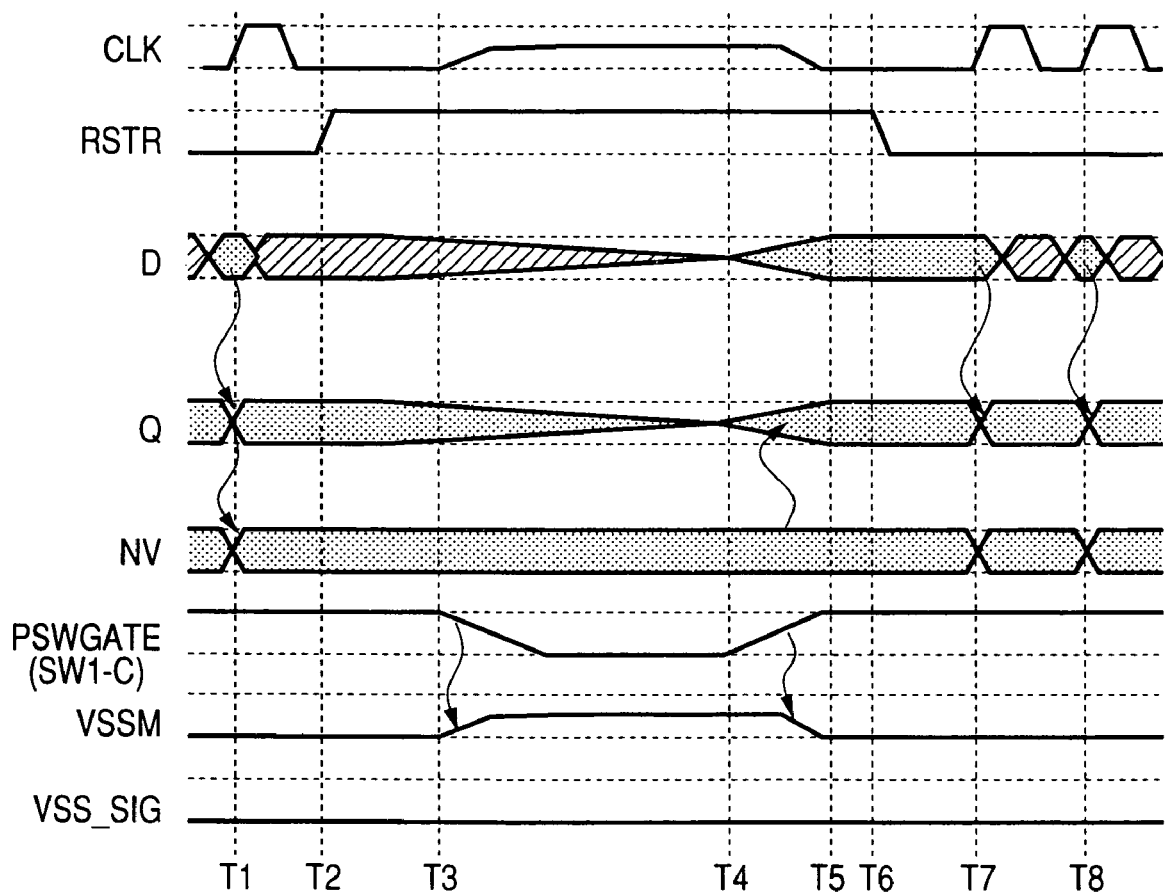
FIG. 12 is an operation waveform chart of the circuit shown in FIG. 11.

FIG. 12 is an operation waveform chart showing the operation and a control method of the nonvolatile master-slave latch shown in FIG. 11.

Time T1 shows a clock rising state during normal operation. At the level of the control signal RSTR=LO, since the transistors MP2 and MN2 are turned OFF and the transistors MP1 and MN1 are turned ON in FIG. 11, the function of a slave latch is logically identical with that of the circuit in FIG. 10. Therefore, the input data is outputted to output Q in accordance with the rising of the clock CLK. In this case, since the clocked inverter CINV1 inserted between the node ND0 and the node NVb in the nonvolatile circuit NVC is open, the level at the node ND0 is transferred to the nonvolatile circuit NVC and the data is written into the node NV. In this stage, however, since MP6 and MN6 in FIG. 11 are OFF, the loop which is connecting NV and NVb for the nonvolatile circuit NVC is opened.

Now, the operation of the data storing to the nonvolatile circuit NVC of the nonvolatile FF NVFF in the power shut-down mode will be described. At time T2, the control signal RSTR is at first turned to the level HI. In this case, the loop of the nonvolatile circuit NVC is closed by the turning ON of the transistors MP6 and MN6. At the same time, the clocked inverter CINV1 is shut down by the turning OFF of the transistors MP4 and MN4, by which the route from the slave latch to the nonvolatile circuit NVC is disconnected. In this case, the transistors MP1 and MN1 are turned OFF, while the transistors MP2 and MN2 are turned ON, by which the level at the NVb is fed back from the nonvolatile circuit NVC instead of the level at the node ND1 in the slave latch. Since the transmission gate TG2 in the master latch is closed, if the input value at the input node D becomes the intermediate level, there is no current flow in the powered circuit, generally.

Then, power shutdown control is conducted at T3. It is assumed here that the power on the ground side is shut down by the N-type MISFET. The PSWGATE signal, which corresponds to the control signal SW1-C, controls power switching by asserting LO. In a case of a using thick-gate-oxide MISFET which often is used in I/O circuitry, for example, the voltage amplitude of the PSWGATE is the same as that of the I/O circuit (for example, 3.3 V). By such control, the virtual power line VSSM is shut down from the actual ground and the potential of the virtual power line VSSM is caused to rise toward a high potential side (VDD) by the leakage current of the internal circuit. While the example of FIG. 12 shows just an intermediate level between VDD and 0 V, it actually rises to a level infinitely nearer to VDD due to conditions such as the scale of the circuits to be integrated, the temperature and the MISFET threshold voltage. Accordingly, the usual circuit can no longer retain the data.

The time interval between the times T3 and T2 has to be decided by taking into account the time which the whole data of the nonvolatile FFs in the chip evacuate their own NVC. Therefore, a method may be considered, for example, of using a driver having a small driving capability for driving the RSTR signal line, measuring the time until the driver output level exceeds a certain threshold value and starting power shut-down control after waiting for a period several times as long as the measured time.

When power shut-down control is conducted, the potential for the virtual power line VSSM increases and other retained data than in the nonvolatile circuit NVC disappears. Also, in this case, since the power for the nonvolatile circuit NVC and the inverter INV1 inputted with the control signal RSTR is supplied by the power line for data retention VSS_SIG, the internal node NV of the nonvolatile circuit NVC can retain a desired value.

On the other hand, in the power-on control, the PSWGATE signal is driven to the level HI at time T4. Then, the potential on the virtual power line VSSM is gradually driven to 0 V and the master-slave latch is put into a state capable of retaining data. The data from the nonvolatile circuit NVC is at first written back by way of the transistors MP3 and MN3 to the slave latch. Since the control signal RSTR is HI level (VDD) and the inversion signal thereof is also kept at Lo level (0 V) by INV1, the data of the nonvolatile circuit NVC is undisturbed during the operation of the master-slave latch in the power-on sequence. In the standby mode, since the power for the driving circuit of the clock signal CLK is also shut down, the LO level of the clock CLK cannot be kept exactly at the ground level (0 V). However, it is no problem that the clock signal is controlled such that the level LO is rapidly outputted after the application of power.

After complete the turning ON of the power switch, the control signal RSTR is dropped to LO at time T6 after confirming that the potential for the vertical ground line VSSM has been dropped to 0 V. Thus, the transistors MP2 and MN2 in FIG. 11 are turned OFF, and, therefore, the feedback loop from the nonvolatile circuit NVC is opened. At the same time the transistors MP1 and MN1 are turned ON to establish a feedback loop from the node ND1. Further, the transistors MP4 and MN4 are turned ON to form a signal path from the slave latch to the nonvolatile circuit NVC, and the transistors MP6 and MN6 are turned OFF to open the loop of the latch in the nonvolatile circuit NVC. Thus, the nonvolatile master-slave latch in FIG. 11 can perform the normal function in the usual operation. That is, the normal operation of the master-slave latch of capturing data at the rising edge of the clock as shown at time T7, T8 is attained.

With the constitution described above, a data retention mechanism in the power shutdown state is provided without substantial degradation of the characteristics of the conventional master-slave latch. Therefore, data retention in the power shutdown state can be obtained easily and at reduced cost in case of applying this nonvolatile master-slave latch to a system LSI.

In FIG. 11, the control signal RSTR generates an inverted signal by way of the inverter INV1 at the inside of the nonvolatile FF NVFF. This is because the OFF operation of the clocked inverter and the latch formation of the nonvolatile circuit NVC cannot be conducted effectively in a case where a large difference is present for the arrival time between the RSTR signal and the inverted signal thereof, with the result that this causes destruction of data. As in this constitution, in a case where the inverted signal for the RSTR signal is generated in the nonvolatile FF NVFF, therefore, the difference of the arrival time between these two signals can be minimized, and the problem described above is overcome. Further, since the number of the pins is smaller compared with the constitution in which both the control signal RSTR and its inverted signal are received, it also provides the effect of decreasing the number of wirings for routing, thereby facilitating the wiring.

Figure 13:
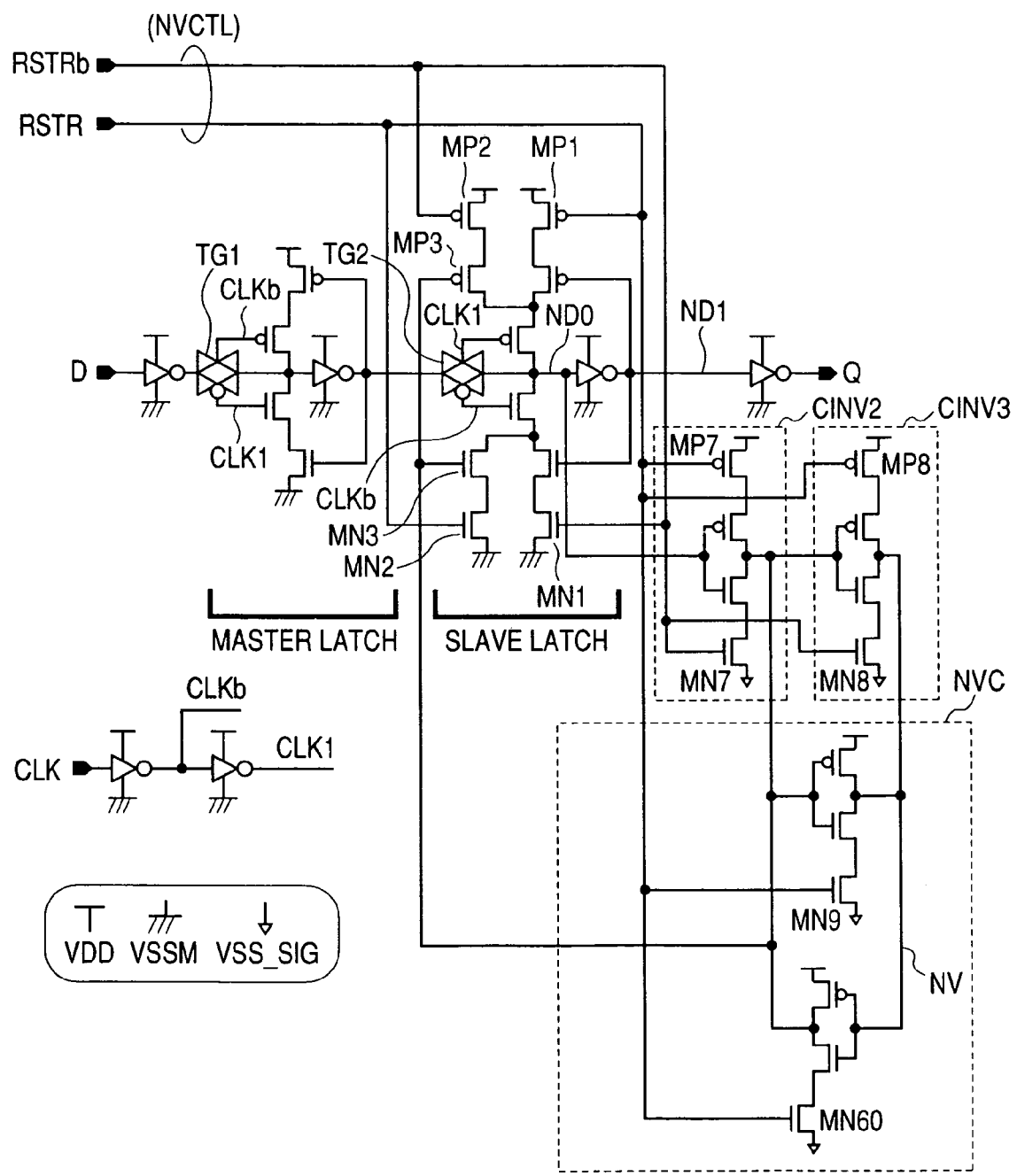
FIG. 13 is a schematic circuit diagram showing another example of a nonvolatile flip-flop (master-slave latch) in accordance with the invention.

FIG. 13 shows an example of controlling the nonvolatile control signal NVCTL by using the two signals RSTR and RSTRb which are complementary to each other. This is different from FIG. 11 in that two clocked inverters CINV2 and CINV3 are provided, and in that the nonvolatile circuit NVC is constituted with inverters having switches in the form of transistors MN9 and MN10. In the drawing, MISFETs as for power shutdown of the clocked inverters CINV2 and CINV3 are designed to be provided independently by transistors MN7, MN8, MP7, and MP8, but they may be used in common for two clocked inverters. In the same manner, transistors MN9 and MN10, operating as the power switch for the nonvolatile circuit NVC, may also be used in common between both of them. This provides a benefit of further saving the area.

Figure 14:
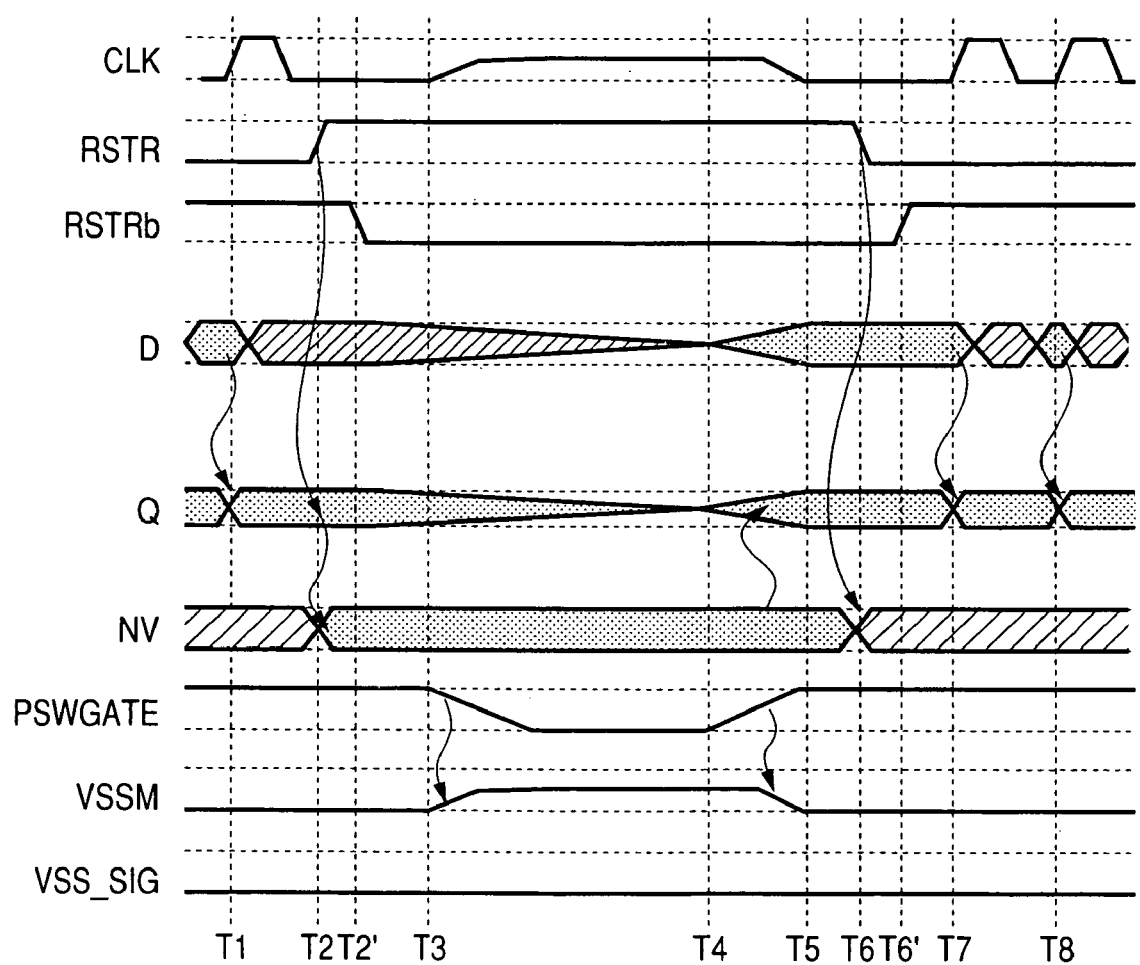
FIG. 14 is an operation waveform chart of the circuit shown in FIG. 13.

FIG. 14 is an operation waveform chart showing the operation and the control method of the nonvolatile master-slave latch shown in FIG. 13. At time T1, since the control signal RSTR=LO, this shows a rising edge of the clock during normal operation. This is because transistors MP2 and MN2 are OFF and the transistors MP1 and MN1 are ON (shown in FIG. 13) when the control signal RSTR=LO (accordingly, control signal RSTRb=HI). This situation, which is the same as that described above to illustrate FIG. 12, provides a logically identical function with that of the master-slave latch shown in FIG. 10. Corresponding to the rising edge of the clock signal CLK, the input data D is outputted to the output Q. In this stage, in the example of this constitution, since the clocked inverters CINV2 and CINV3 inserted between the node ND0 and the node NV in the nonvolatile circuit NVC are open, the data is transferred to the node NV in the nonvolatile circuit NVC. However, in this stage, since the transistors MP9 and MN10 in FIG. 13 are OFF, the loop of the nonvolatile circuit NVC is not closed.

Now, the operation of storing the data by the nonvolatile circuit NVC in the nonvolatile FF NVFF when the power shut down is conducted will be described. At time T2, the RSTR signal is at first put to the level HI. In this case, the loop of the nonvolatile circuit NVC shown in FIG. 13 is closed by the turning ON of the transistors MP9 and MN10, and the path of the clocked inverters CINV2 and CINV3 between the slave latch and the nonvolatile circuit NVC to the ground level is shut down by the turning OFF of transistors MN7 and MN8. In this case, since the transistor MN2 is turned ON and the transistor MP1 is turned OFF, the path of the slave latch to the high potential side power line in the usual operation is disconnected, and the current path of the driver MN3 for feedback on the ground side of MN3 is formed such that feedback from the nonvolatile circuit NVC can be inputted. Then, when the RSTRb signal is put to the level LO at time T2', switching MISFETs MP7 and MP8 on the high potential side power line for the clocked inverters CINV2 and CINV3 are shut down to isolate the slave latch and the nonvolatile circuit NVC. At the same time, the transistor MP2 is turned ON and the transistor MN1 is turned OFF, by which the feedback loop for the slave latch in the normal operation is opened and the feedback loop from the nonvolatile circuit NVC is completely closed. Thus, even when each node of the slave latch takes any value during normal operation, this has no effect on the nonvolatile circuit NVC. Since the transmission gate TG2 of the master latch is closed in this case, there is no effect when the defined value for the input D may be changed. Further, it is necessary for the time interval between T2 and T2' that it allows the RSTR signal to reach the level HI in the entire chip. This can be attained by using a driver of small driving capability as the driver for driving the RSTR signal, measuring the time until the output of the driver reaches a predetermined threshold value or higher, and putting the RSTRb signal to the level LO after a period several times as long as the measured time. This is because the wiring route is generally different between the RSTR signal and the RSTRb signal, and the difference of delay between these two signals cannot be assured on the premise of using the placing and routing tool. In a case where each of the RSTR signal and the RSTRb signal reaches an identical cell at an identical delay, that is, where wirings can be conducted in a substantially equal path, the interval between times T2 and T2' may also be controlled depending on the level of the RSTR signal returned to the control circuit in standby mode STBYC by providing a route for turning the RSTR signal from a predetermined position of the RSTR signal line to the control circuit in standby mode STBYC.

Then, power shut-down control is conducted at time T3 like that in FIG. 12. A case of shut-down for the ground power line by the N-type MISFET is assumed. For this purpose, control for putting the control signal PSWGATE (SW1-C) of the N-type MISFET to the level LO is conducted.

When power shutdown control is conducted, the potential of the virtual power line VSSM increases and retention data other than in the nonvolatile circuit NVC is eliminated. Since the power for the nonvolatile circuit NVC is supplied by the power line for data retention VSS_SIG, the internal node NV of the nonvolatile circuit NVC continues to hold a valid value.

On the other hand, in case of a power-on sequence, the PSWGATE signal is driven to the level HI at time T4. Then, the level of the virtual power line VSSM is gradually driven to 0V and the master-slave latch can hold data. The data from the nonvolatile circuit NVC is written back to the slave latch by way of MP3 and MN3. Since the RSTR signal is at HI level (VDD) and the RSTRb signal is also at Lo level (0 V), the data of the nonvolatile circuit NVC is undisturbed during the operation of the master-slave latch in the power-on sequence. Also, in this case, as described with reference to FIG. 12, since the power for the driving circuit of the clock signal CLK is also shut down, the LO level of the clock CLK cannot be kept exactly at the ground level (0 V). However, it is no problem that the clock signal is controlled such that the level LO is rapidly outputted after the application of power.

Then, after confirming that the power switch has been turned completely to ON and the potential of the virtual power line VSSM is put to 0 V, the RSTR signal is put to LO at time T6. Thus, the transistor MN2 in FIG. 13 is turned OFF, the current path on the ground side of the feedback loop from the nonvolatile circuit NVC is shut down, and the transistor MP1 is turned ON to form a high potential side current path for the feedback loop of the slave latch in a normal operation. At the same time, the transistors MP7 and MP8 are turned ON to form a high potential side current path in the signal loop from the slave latch to the nonvolatile circuit NVC, and the transistors MN9 and MN10 are turned OFF, by which the loop for the latch in the nonvolatile circuit NVC is opened.

Then, when the RSTRb signal is put to the level HI at the time T6', switching transistors MN7 and MN8 on the low potential side of the clocked inverters CINV2 and CINV3 are turned ON to connect the slave latch with the nonvolatile circuit NVC, the transistor MP2 is turned OFF, and the transistor MN1 is turned ON to completely close the feedback loop of the slave latch and open the feedback loop from the nonvolatile circuit NVC. Subsequently, the invented nonvolatile master-slave latch works as a normal Master-Slave latch.

Further, it is necessary that the time interval between the times T6 and T6' is long enough to allow the RSTR signal transmitted to the entire chip to reach the level LO. To realize this control, there is one method, for example, of using a driver having a small driving capability to drive the RSTR signal to LO, measuring the period until the driver output decreases to a certain threshold level or lower, and putting the RSTRb signal to the level HI after the period several times as long as the measured time.

Figure 15:
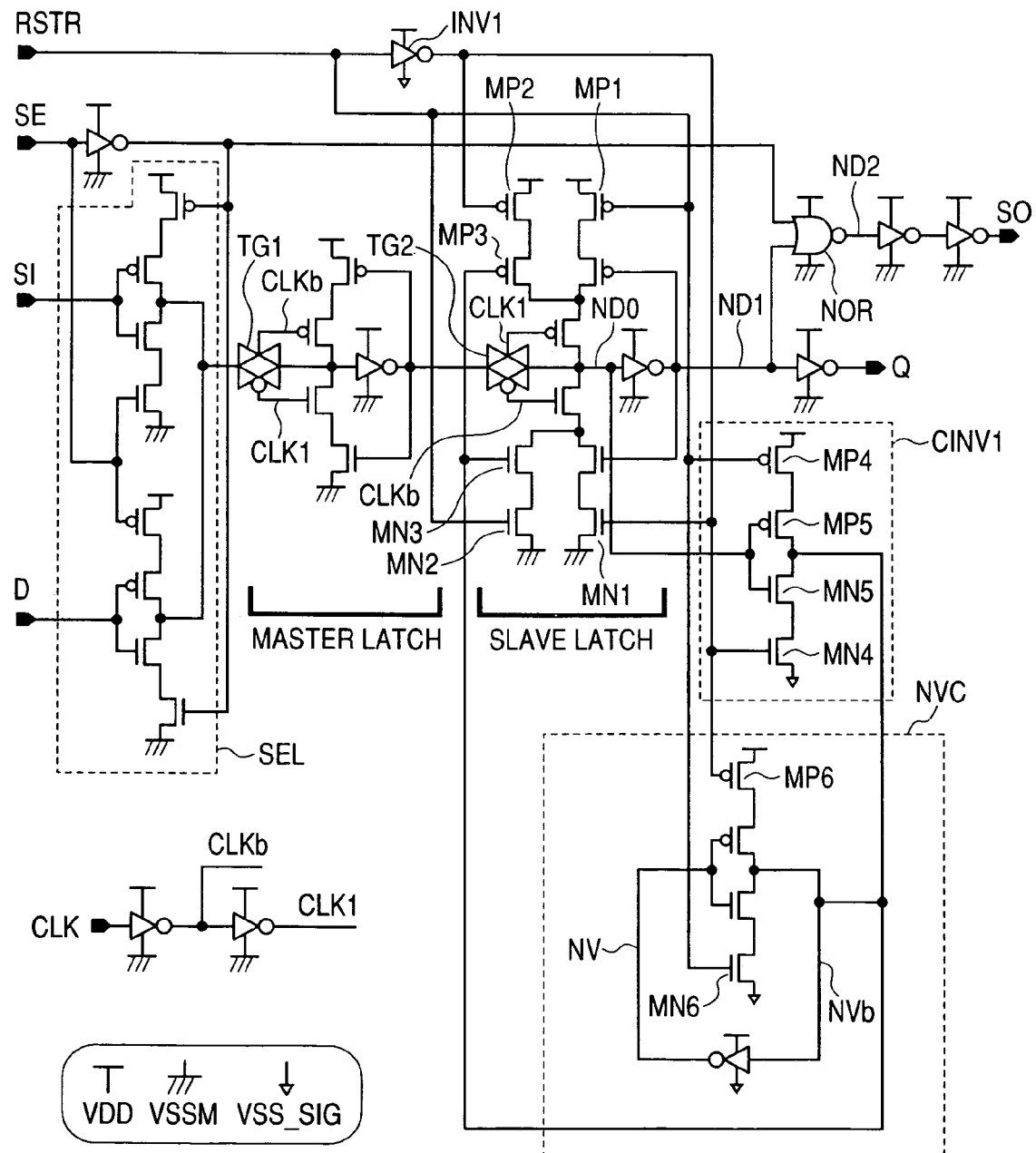
FIG. 15 is a schematic circuit diagram which shows a nonvolatile flip-flop (master-slave latch with scan function) in accordance with the invention.

FIG. 15 shows an example of a nonvolatile master-slave circuit additionally provided with a scan function. This is different from the constitution shown in FIG. 11 in that a scan input signal (SI), a scan enable signal (SE) and a scan output signal (SO) are added as terminals, and in that a selector circuit SEL, and an NOR circuit in communication with the scan output terminal SO and an inverter are provided. The selector circuit SEL corresponds to the inverter in communication with the input D in FIG. 11, and this is constituted as a clocked inverter, for which degradation of the speed may substantially be taken out of consideration so long as the width is properly designed. The selector circuit SEL selects either the data input signal D or the scan input signal SI by the SE signal and inputs the same to the latch. In a case where the SE signal is at the level HI, the scan input signal SI is selected, whereas the data input signal D is selected in a case where the SE signal is at the level LO.

At the rising edge of the clock signal CLK (CLK: L→H), the transmission gate TG1 of the master latch is closed to latch the data and the transmission gate TG2 of the slave latch is opened to output the data taken into the master latch to the output Q. On the other hand, at the falling edge of the clock signal CLK (CLK: H→L), the transmission gate TG1 of the master latch is opened and the transmission gate TG2 of the slave latch is closed to retain the data in the slave latch. In the series of clock operations, the scan output signal SO changes in synchronization with the clock signal depending on the value of the scan input signal SI where the SE signal is at HI, whereas it always outputs LO even when the value for the data input signal takes any value where the SE signal is at LO. Further, the basic operation is identical with that in FIG. 12 and quite the same operation is attained so long as the SE signal is at LO.

Figure 16:
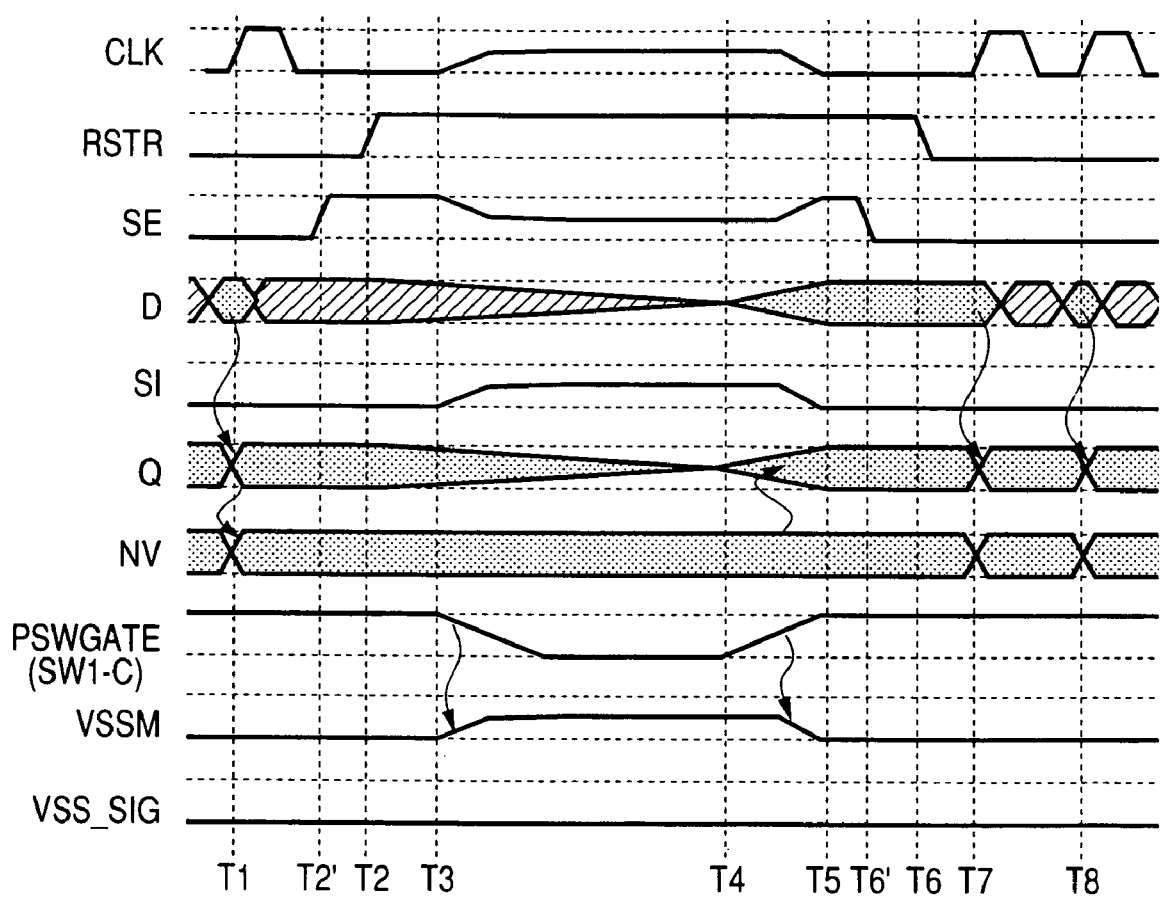
FIG. 16 is an operation waveform chart of the circuit shown in FIG. 15.

Further, when the data taking route to the nonvolatile circuit NVC is changed from the node ND0 to the node ND2, the load on the DQ pass can be reduced to provide an effect of increasing the speed. In this case, as shown in FIG. 16, it is necessary to put the SE signal to the level HI at the time T2" before putting the RSTR signal to the level HI, for reflecting the data of the slave latch on the NOR output. Then, the SE signal is desirably put to LO before the RSTR signal is put to the level LO. FIG. 16 shows a control example where the SE signal is put to the level LO at time T6" before the RSTR signal is put to level LO (time T6). In this case, the data is reflected to the master-slave latch in the next stage through a normal pass (data pass). In a case where the setting of the data through a scan pass is more effective, control for putting the SE signal to LO may be conducted after the RSTR signal has been put to the level LO.

Although not illustrated, the scan function can be applied also in a case of control by the complementary signal due to the RSTR signal and the RSTRb signal, as in FIG. 13. In this case, the scanning circuit as described above may be added to the part for the input D and the part for the output Q.

Figure 17:
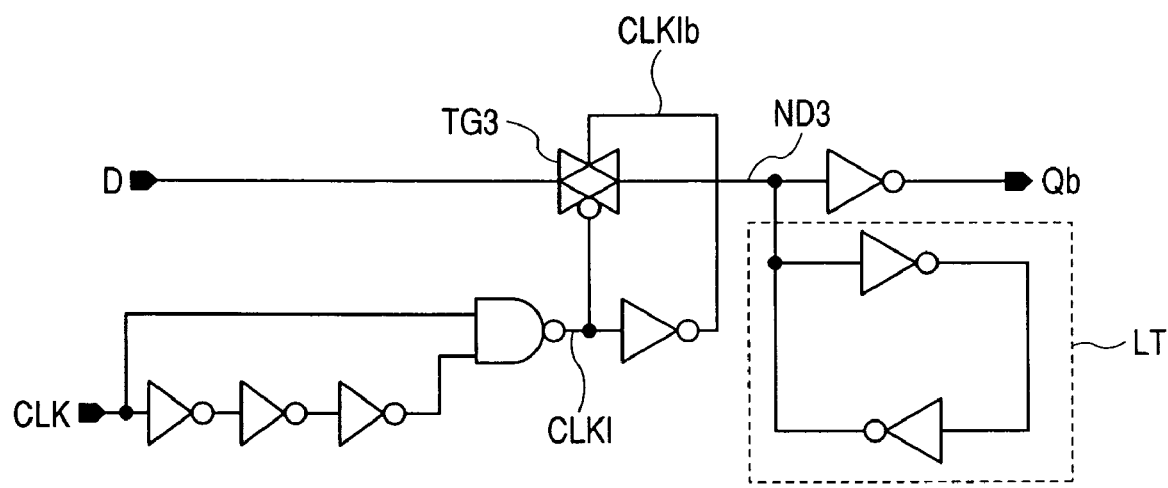
FIG. 17 is a schematic circuit diagram showing an example of a pulse latch.

While FIG. 10 to FIG. 16 show constitutional examples of the master-slave latch, the invention is applicable also to latch circuits having other forms. FIG. 17 is an example of a pulsed-latch circuit. The pulsed-latch circuit is a circuit in which a clock signal CLK and a delayed clock signal formed from passing the clock signal CLK through a delay circuit comprising three stages of inverters, are inputted to an NAND circuit, thereby generating a pulse upon rising of the clock signal, opening the transmission gate TG3 by using the pulse CLKI and the inverted pulse CLKIb inverted through the inverters and transmitting the input D to the output Qb in the succeeding stage. Since the transmission gate TG3 is closed upon completion of the pulse, the pulsed-latch circuit retains the data taken in the latch comprising the two stages of inverters disposed to the node ND3.

Figure 18A:
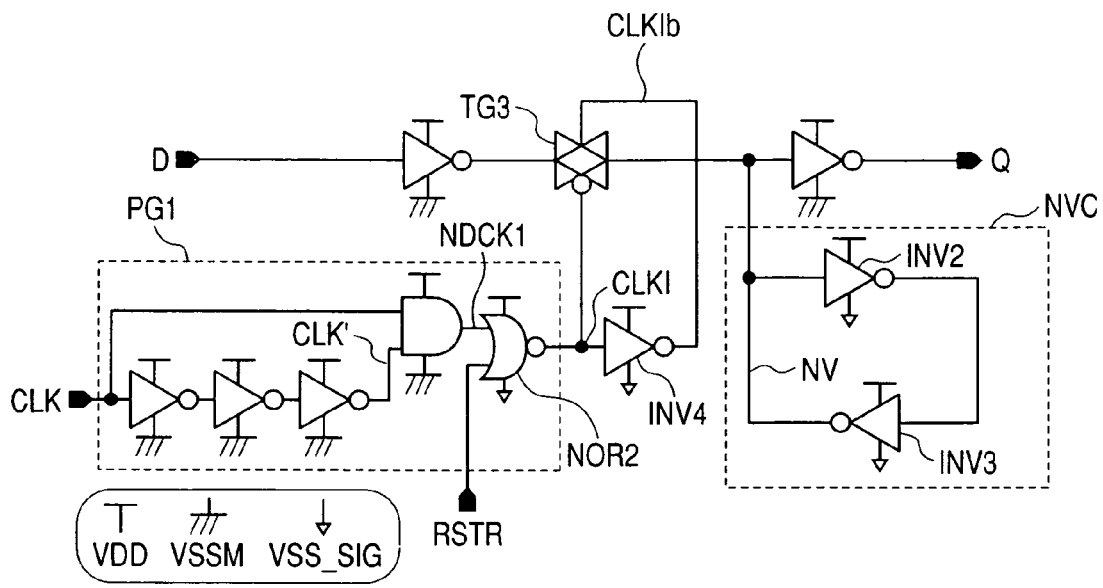
FIG. 18A is a schematic circuit diagram which shows a nonvolatile flip-flop (pulse latch) in accordance with the invention.
Figure 18B:
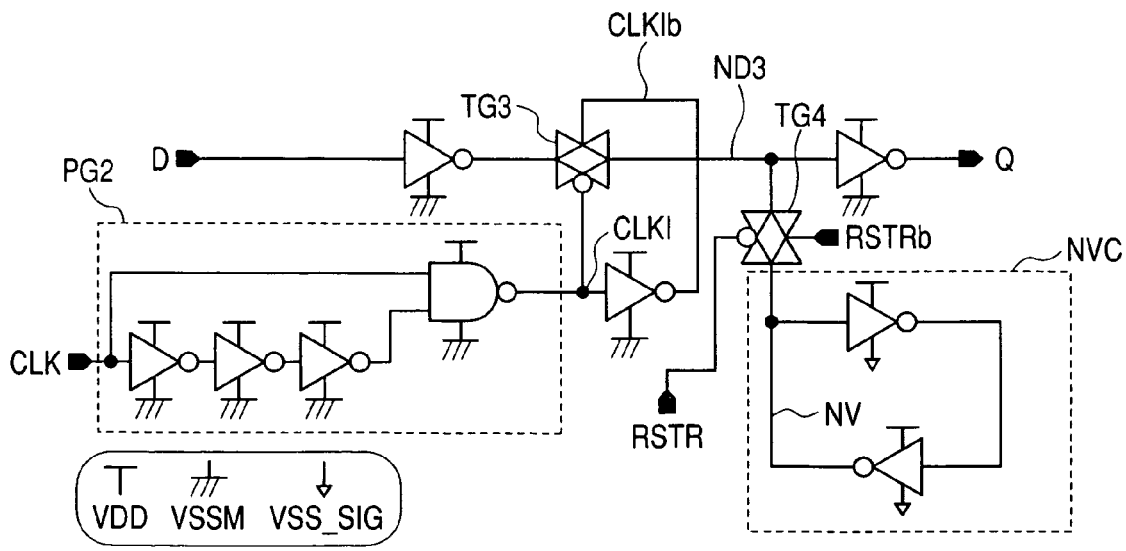
FIG. 18B is a schematic circuit diagram which shows a nonvolatile flip-flop (pulse latch) in accordance with the invention.

A constitutional example of applying the nonvolatile data retention function to a pulsed-latch circuit is shown in FIG. 18A and FIG. 18B. FIG. 18A shows a first constitutional example. This is different from the constitution shown in FIG. 17 at first in that the data is retained in the latch LT for data retention also during the power shutdown state by supplying the power from the power line for data retention VSS_SIG, and further by the fact that the pulse generator is constituted as an illustrated AND-NOR type circuit for controlling the pulse generator by the control signal RSTR, and by the fact that the power line for data retention VSS_SIG is used at least for the low potential power on the side of NOR, and the power line for data retention VSS_SIG is used for the low potential side power of the inverter that drives the pulse CLK1. In the example of FIG. 18A, the output Q is adapted as positive logic by providing an inverter to the input D. While this causes a delay for one stage of the logic gate, the positive logic can be transmitted to the succeeding stage and, further, more stable operation is possible for the fluctuation of the input data. For example, it provides high immunity for input signal fluctuation, even when the input D is at a higher potential than the high potential side power VDD due to noise. In this case, without this inverter, since the source-gate voltage difference of the transmission gate TG3, which should normally be in the OFF state, exceeds its threshold voltage, an invalid signal can be transferred to the succeeding stage. A constitution in which the input D is outputted after inversion, as shown in FIG. 17, without provision of the inverter is also possible. By using the power line for data retention VSS_SIG for the low potential side power of the driver NOR2 for driving the transmission gate TG3 and INV4, since the power can be applied also during power shut-down, it provides an effect capable of exact control. In this constitution, since the control signal can be constituted only with the RSTR signal, it provides an effect of facilitating the placing and routing by using CAD.

Figure 19:
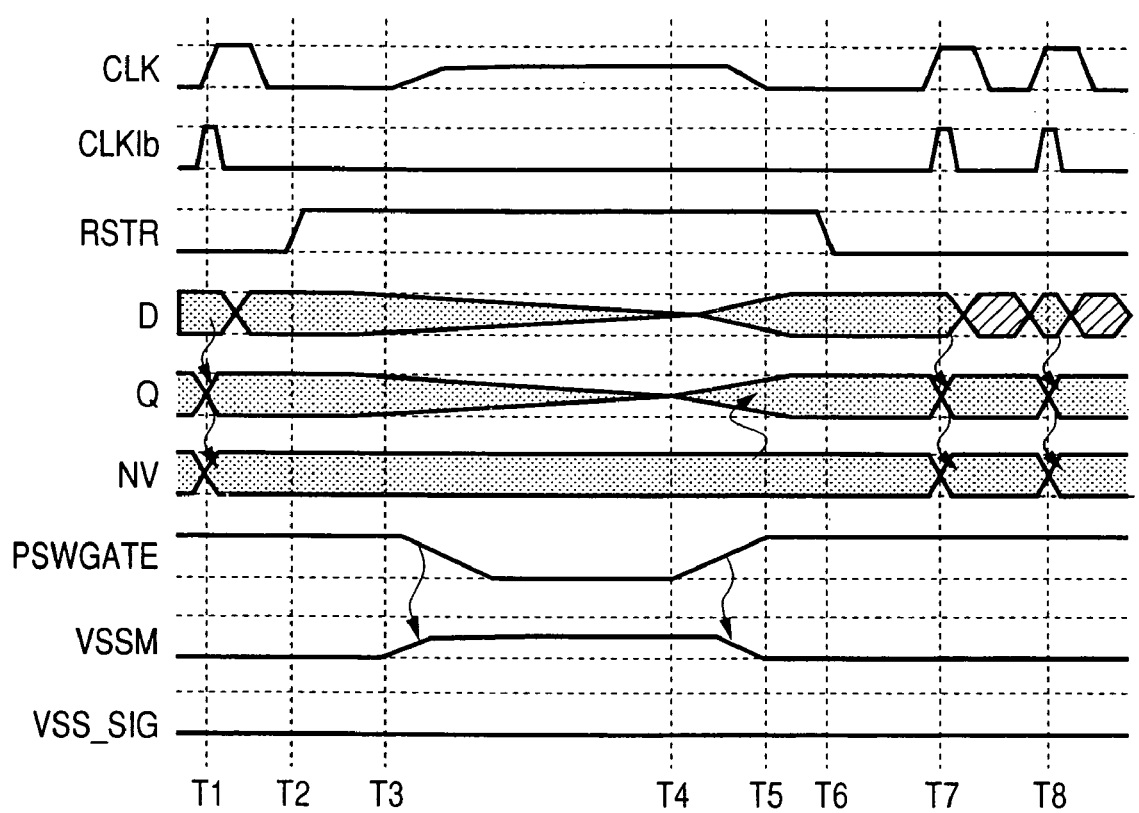
FIG. 19 is an operation waveform chart of the circuit shown in FIG. 18A.

FIG. 19 is an operation waveform chart showing the operation and the control method for the nonvolatile pulsed-latch circuit shown in FIG. 18A. At time T1, since the control signal RSTR=LO, this shows a clock rising state in the normal operation. This is because the NOR gate NOR2 shown in FIG. 18A outputs under inversion the pulse NDCK1 as it is in a case where the control signal RSTR=LO. Corresponding to the rising of the clock signal CLK, the pulse clocks CLKI and CLKIb generated by the pulse generator PG1 are put to the level HI and level LO, respectively. The pulse width is equal to a delay by the three stage inverter chain. When the pulse clock CLKI is put to LO and CLKIb is put to HI, the transmission gate TG3 is turned ON and the input data D is outputted. At the same time, data is transmitted to the node NV in the nonvolatile circuit NVC in the constitution shown in FIG. 18A.

Now, a description will be made of the operation of conducting power shut-down and retaining data in the nonvolatile circuit NVC. At time T2, the RSTR signal is at first put to the level HI. Then, NOR gate NOR2 outputs the level LO irrespective of the level of the pulse NDCKI.

Subsequently, power shut-down control is conducted at time T3. Like the example in FIG. 11, it is assumed herein that the potential of the virtual power line VSSM rises to a higher potential due to a leakage current in the internal circuit under the control of putting the PSWGATE signal to LO. The interval between the times T3 and T2 is set as a time sufficient to retract whole data of the nonvolatile FF NVFF in the chip. The timing control can be conducted by the same method as the timing control disclosed with reference to FIG. 11.

When power shutdown control is conducted, the potential of the virtual power line VSSM increases and other retained data than in the nonvolatile circuit NVC is eliminated. On the other hand, since the power for the nonvolatile circuit NVC is supplied from the power line for data retention VSS_SIG, the node NV in the nonvolatile circuit NVC can be retained continuously at a desired value.

Next, power-on sequence by turning on the power switch will be described. In this case, the PSWGATE signal is driven to the level HI at time T4. Then, the level for the virtual power line VSSM is gradually driven to 0 V and the data is transferred from the nonvolatile circuit NVC to the output Q. Since the power supply for the driving circuits of the clock signal CLK is also shut down, the level LO for the clock signal CLK cannot be kept exactly at the ground level (0 V). However, it is desired to control the clock signal CLK so as to rapidly output the level LO after the power is supplied.

Subsequently, after confirming that the power switch has been turned ON completely and the level of the virtual power line VSSM has been put to 0 V, the RSTR signal is put to LO at time T6. Thus, the NOR gate NOR2 outputs under inversion the NDCK1 as it is. Since it is necessary for a sufficient interval between times T5 and T6 to completely turn ON the power switch, it can be controlled by using, for example, an acknowledge signal from a power switch controller. Then, the normal operation of the pulsed-latch circuit of intaking data at the rising edge of the clock, as shown at time T7 and T8, can be attained.

This can provide a data retention mechanism upon power shut-down without substantial deterioration for the characteristics of the pulsed-latch circuit, and this can provide the advantage of data retention upon power shut-down at a reduced cost by the application of the pulsed-latch circuit to the system LSI.

FIG. 18B shows another example of the pulsed-latch circuit. This is different from the constitution shown in FIG. 17 in that the latch LT for data retention is connected with the power line for data retention VSS_SIG to make the data nonvolatile and a transmission gate TG4 is disposed to the connection route between the node ND3 and the node NV for the nonvolatile circuit NVC. In this case, two signals RSTR and RSTRb are necessary for the nonvolatile control signal. In this constitution, since the number of circuits requiring the power line for data retention VSS_SIG can be minimized, this can provide an effect of enhancing the current supply performance to the pulse generator PG2 requiring large current for the operation.

Figure 20:
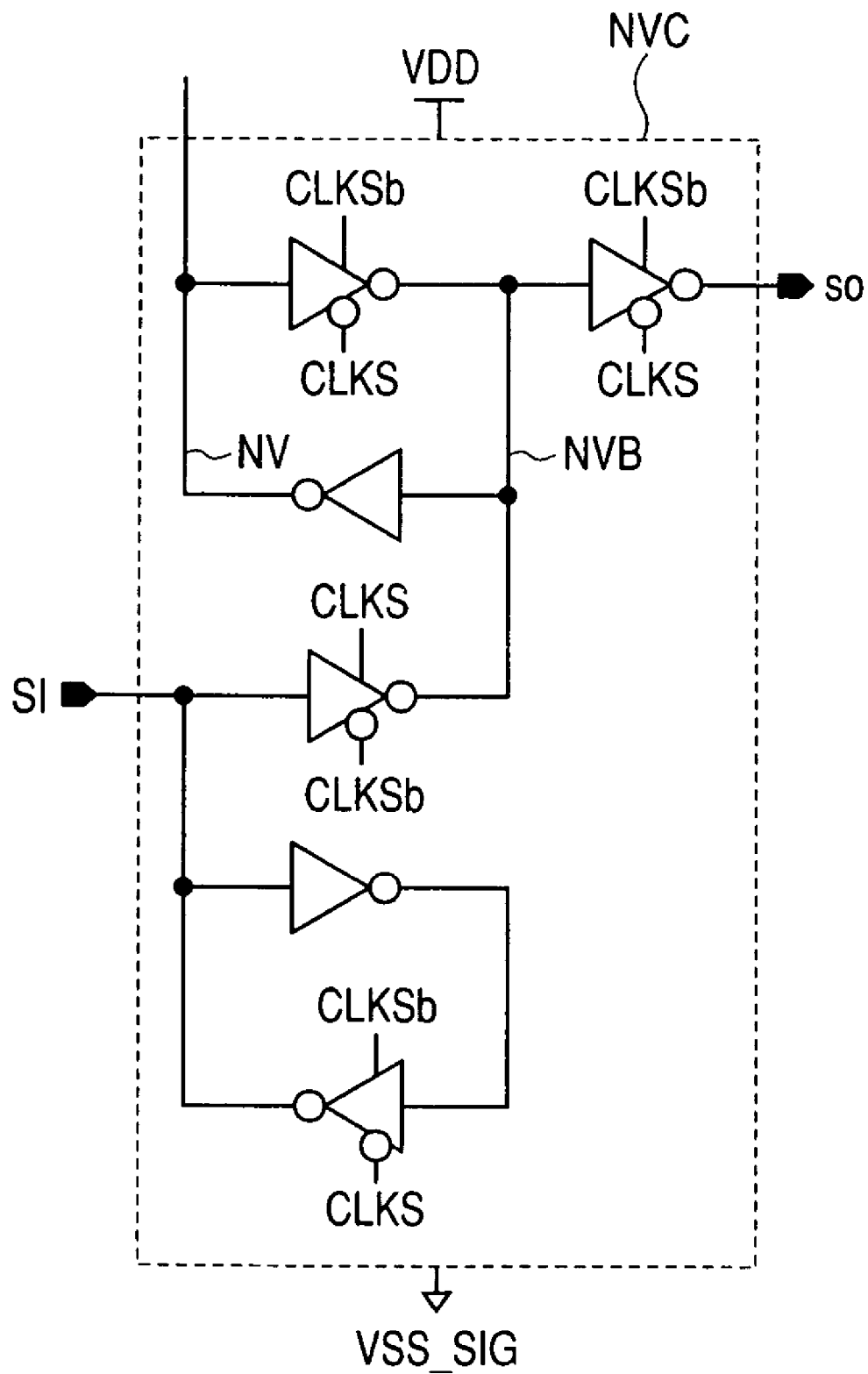
FIG. 20 is a schematic circuit diagram which shows a modified embodiment in a case of providing the scan function to the circuit in FIG. 18A or FIG. 18B.

FIG. 20 shows an example of a circuit for providing a scan function to the nonvolatile pulsed-latch circuit shown in FIGS. 18A and 18B. This can be attained by replacing the nonvolatile circuit NVC in communication with the node NV in FIGS. 18A and 18B with the nonvolatile circuit NVC shown in FIG. 20. In normal operation, the function of the pulsed-latch circuit is attained by putting the clock signal for scanning CLKS to the level LO and the inverted clock signal for scanning CLKSb to the level HI. On the other hand, for sending the data by the scan function, the scan input signal SI is transferred to the node NVB by setting the scan clock CLKS to level HI and the inverted clock signal for scanning CLKSb to the level LO, and then the data retained at the node NVB is transferred to the scan output SO by setting the clock signal for scanning CLKS at the level LO and the inverted clock signal for scanning CLKSb at the level HI. In the case of using the scan function, it is necessary that the input D cannot be taken by putting the clock CLK in the pulsed-latch circuit of the system to LO for avoiding the effect of the input D of the pulsed-latch circuit.

Although not illustrated, the scan function may be attained also by replacing the selector circuit capable of selecting the scan input SI and the usual data input D by the SE signal, as shown in FIG. 15, with the input part shown in FIG. 18A or FIG. 18B, and, further, by applying an additional circuit outputting the output Q and the scan output SO, as shown in FIG. 15, in the output part in FIG. 18A or FIG. 18B.

Figure 21:
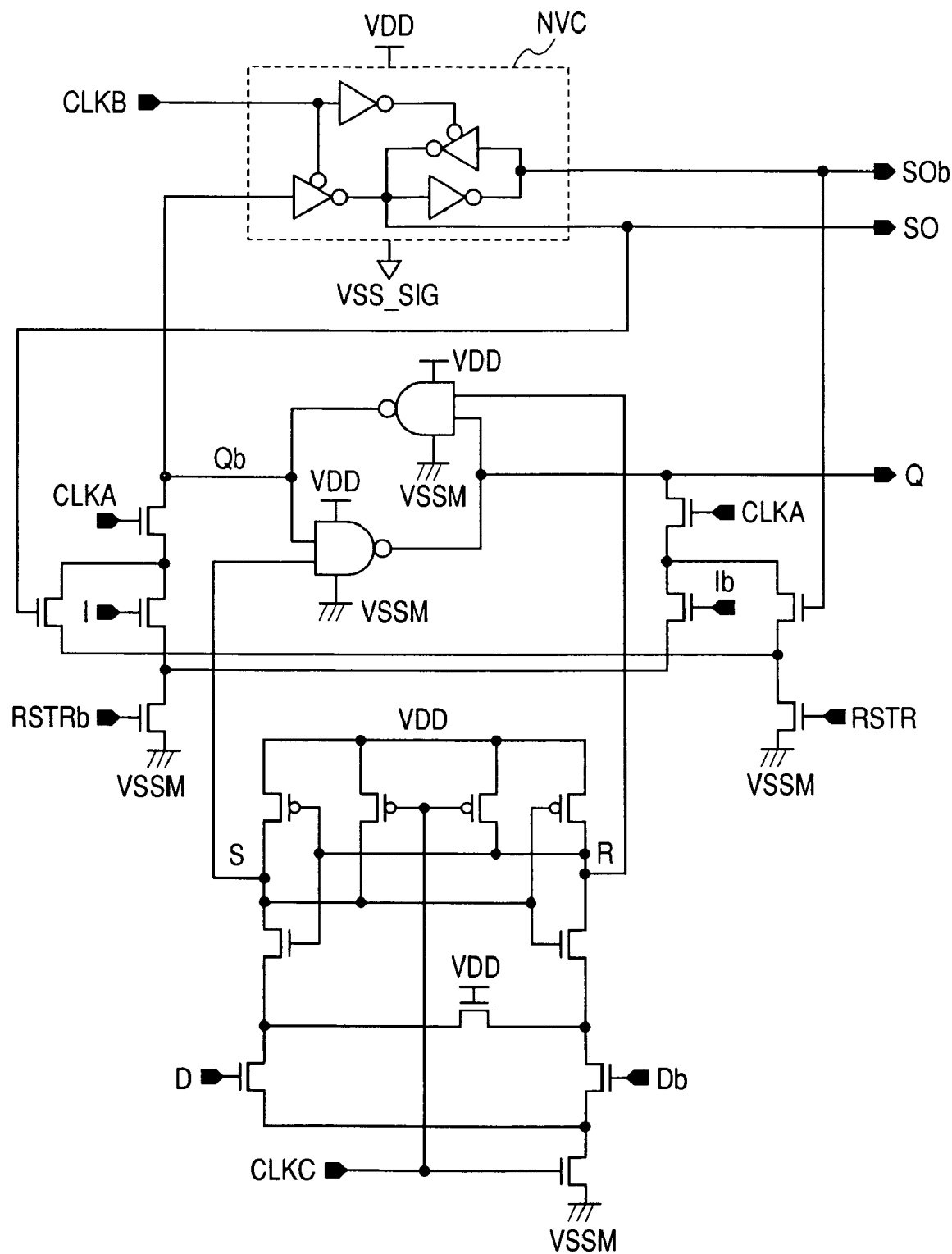
FIG. 21 is a schematic circuit diagram which shows another example of a nonvolatile flip-flop (sense-amplifier based flip-flop) in accordance with the invention.

FIG. 21 shows an example of a sense-amplifier based flip-flop circuit. The low potential side power for the nonvolatile circuit NVC is a power line for data retention VSS_SIG and the low potential side power for other circuits is a virtual power line VSSM.

Figure 22:
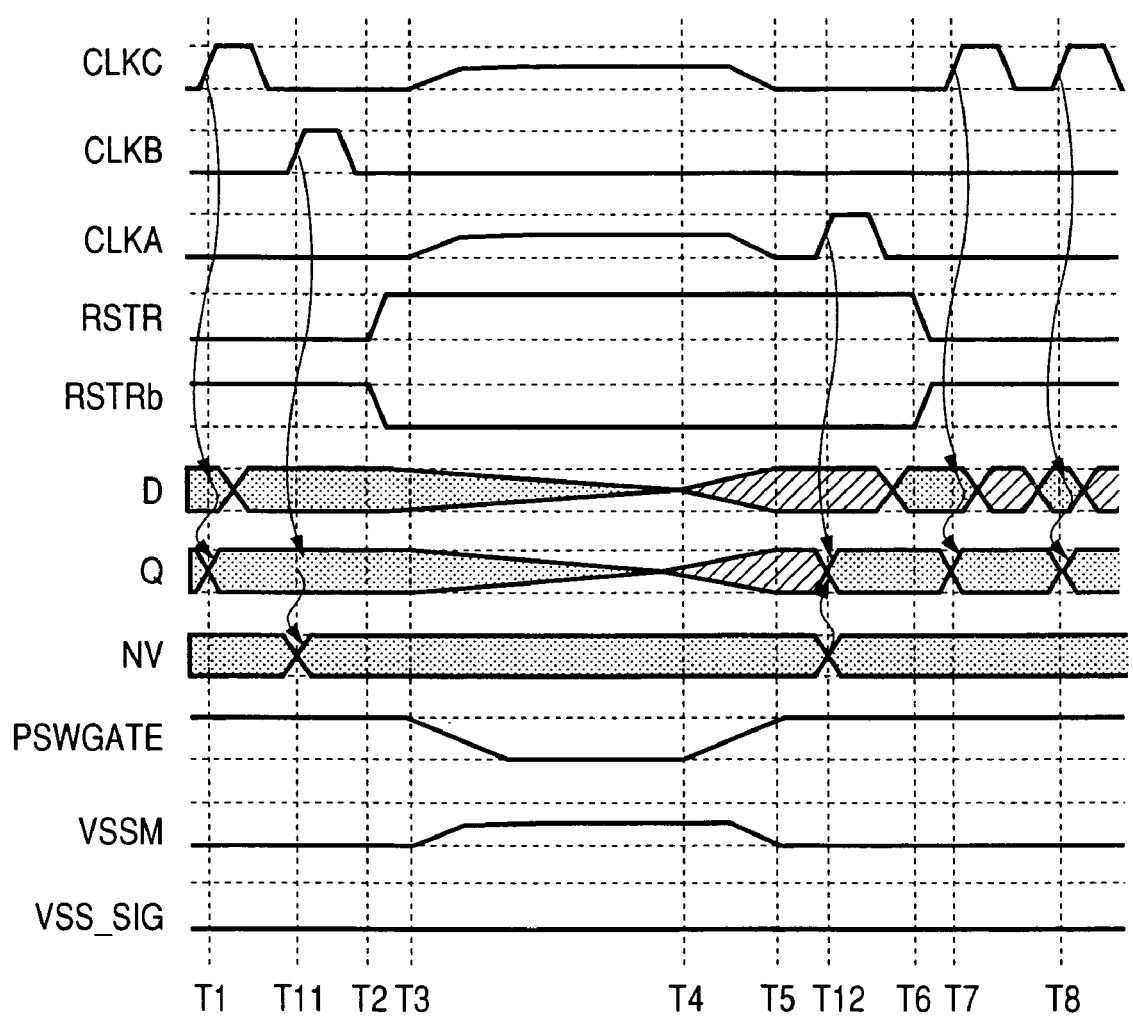
FIG. 22 is an operation waveform chart of the circuit shown in FIG. 21.

FIG. 22 is an operational waveform chart showing the operation and the control method of the nonvolatile sense-amplifier based flip-flop circuit shown in FIG. 21. At time T1, since the control signal RSTR=LO, the control signal RSTRb=HI, the control signal CLKB=LO, and the control signal CLKA=LO, the state of clock rising state during the normal operation is shown. The input D is taken in accordance with the rising of the clock signal CLKC and the output Q is outputted corresponding to the value.

Now, description will be made of a case in which power shutdown is conducted. At first, the clock signal CLKC is put to the level LO such that the data of the input D of the sense-amplifier based flip-flop circuit is not captured. The control signal CLKB is put to the level HI at time T11 to intake the level data at the node Qb to the nonvolatile circuit NVC and then the control signal CLKB is put to the level LO. This electrically disconnects the nonvolatile circuit NVC from the flip-flop main body. Also, in this case, the control signal CLKA is controlled to the level LO. Then, the control signal RSTR is put to the level HI and the control signal RSTRb is put to the level LO for providing a feedback route from the nonvolatile circuit NVC at time T2. This state means that the electrical route of the node Q and the node Qb to the ground is controlled by the feedback route from the nonvolatile circuit NVC. While FIG. 22 shows an example of controlling the control signal RSTR and the control signal RSTRb substantially simultaneously, the control order of asserting these control signals has no particular restriction. This is because the data necessary for the nonvolatile circuit NVC has already been retained. Further, as shown in FIG. 11 and FIG. 13, it is possible to be controlled by two signal lines from the outside, or the RSTRb signal may be generated in the flip-flop by using an inverter circuit.

Subsequently, power shutdown control is conducted at time T3. Like the example in FIG. 11, it is assumed that the potential of the virtual power line VSSM rises toward the high potential side due to the leakage current in the internal circuit by the control of putting the PSWGATE signal to LO. A sufficient period is set for the internal operation between times T3 and T2 sufficient to retract the data of the nonvolatile FF in the chip. The timing control can be conducted by the same method as the control used for FIG. 11.

When the power shutdown control is conducted, the potential for the virtual power line VSSM rises and other retention data than in the nonvolatile circuit NVC are eliminated. In this case, since the power for the nonvolatile circuit NVC and the control signal CLKB is supplied from data retention circuit VSS_SIG, the internal nodes SO and SOb in the nonvolatile circuit NVC can be retained continuously at a desired value.

On the other hand, in the power on state, the PSWGATE signal is driven to the level HI at time T4 firstly. As a result, the potential of the virtual power line VSSM is gradually driven to 0 V and the data is transferred from the nonvolatile circuit NVC to the output Q. Further, since the power is shut down also for the driving circuit of the clock signal, the LO level for the clock signal CLKC cannot be kept exactly at the ground level (0 V). However, it is desired to control the clock CLKC such that the level LO is outputted rapidly after the re-supplying of the power.

Then, after confirming that the power switch has been turned ON completely and, therefore, that the potential of the virtual power line VSSM has been driven to 0 V, the control signal CLKA is put to the level HI at time T12. Since the data in the nonvolatile circuit NVC is written back to the nodes Q and Qb, the output is determined. After putting the control signal CLKA to the level LO, the RSTR signal is put to the level LO and the RSTRb signal is put to the level HI at time T6. The state where the RSTR signal is at LO and the RSTRb signal is at HI indicates that scan inputs I and Ib are selected upon writing to the nodes Q and Qb. Therefore, it is possible that these signals are controlled as follows: the RSTR signal is put to LO and the RSTRb signal is put to HI for the case of scanning, and the RSTR signal is put to HI and the RSTRb signal is put to LO in other cases. A sufficient period is necessary for the interval between times T5 and T6 sufficient to turn ON the power switch completely. For this purpose, control may be conducted by using, for example, an acknowledge signal from the power switching controller.

Subsequently, the normal operation of the conventional sense-amplifier based flip-flop, which captures the data at the rising edge of the clock, as shown in time T7, T8 is attained.

This constitution provides a data retention mechanism during power shut-down without substantial deterioration of the characteristics of the sense-amplifier based flip-flop and provides the advantage of attaining data retention during power shut-down at a reduced cost by applying the sense-amplifier based flip-flop to a system LSI.

Figure 23A:
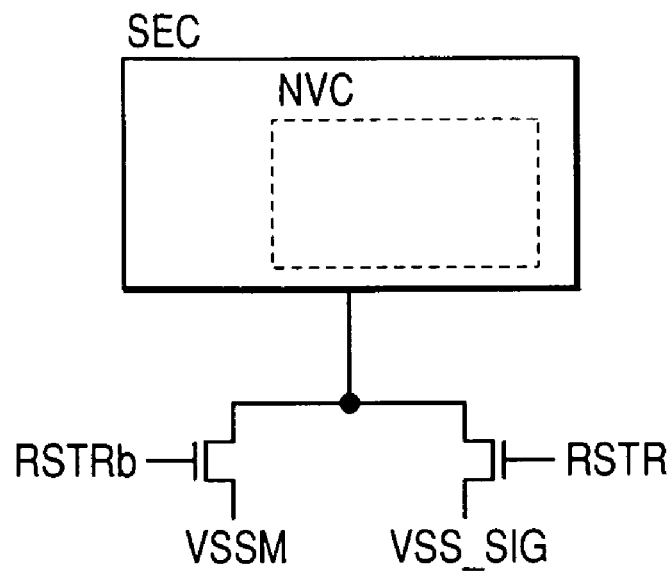
FIG. 23A is a diagram showing power connection control for a data retention storage element circuit of a nonvolatile flip-flop.
Figure 23B:
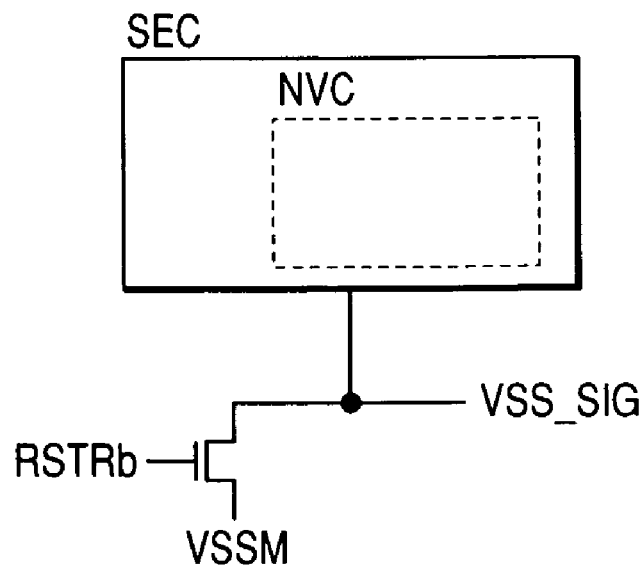
FIG. 23B is a diagram showing power connection control for a data retention storage element circuit of a nonvolatile flip-flop.

FIG. 23A and FIG. 23B show modified examples of the connection of a power line for data retention VSS_SIG to a storage element for data retention SEC. The storage element for data retention SEC is a collective name for circuit elements to be supplied with power by the power line for data retention VSS_SIG in each of FIGS. 13, 15, 18, 20 and 21, which includes, for example, a nonvolatile circuit NVC and a clocked inverter CINV1 (FIG. 11). FIG. 23A shows an example of switching the power supply to the storage element for data retention SEC by the RSTR signal and the RSTRb signal between the virtual power line VSSM and the power line for data retention VSS_SIG. This provides an effect capable of obtaining a desired large current in a case where it is intended to supply a large current to the storage element for data retention SEC by enabling the power supply from the virtual power line VSSM. For example, in the case of the pulsed-latch circuit shown in FIG. 18A, the pulse generator PG1 requires a great amount of current, and use of the constitution described above provides an effect capable of supplying necessary and sufficient operation current during operation of the pulse generator PG1 and not causing deterioration in the speed. Since the data can be retained only by a minute current (standby mode), connection is made with the power line for data retention VSS_SIG to attain reduced current consumption.

FIG. 23B shows a modified example of conducting ON-OFF control for the connection of the virtual power line VSSM and the power line for data retention VSS_SIG by the RSTRb signal. In a case where a large current is necessary, it is connected with the virtual power line VSSM to obtain a desired large current. On the other hand, a minute current is supplied from the power line for data retention VSS_SIG during the standby mode, thereby attaining reduced power consumption.

While the two modified examples show the case of control by the RSTR signal and the RSTRb signal, control may be conducted by an independent signal line separately from the signals. In this case, an independent signal line is added by the number of one in a cell image shown in FIG. 9. In a case of control by the independent control line, although the number of pins is increased, since the current can be controlled independently of the RSTR signal, the power can be shut down on the side of the power line for data retention VSS_SIG and can be kept at a substantially high impedance state during operation. This provides an effect capable of attaining further reduced power consumption.

Figure 24:
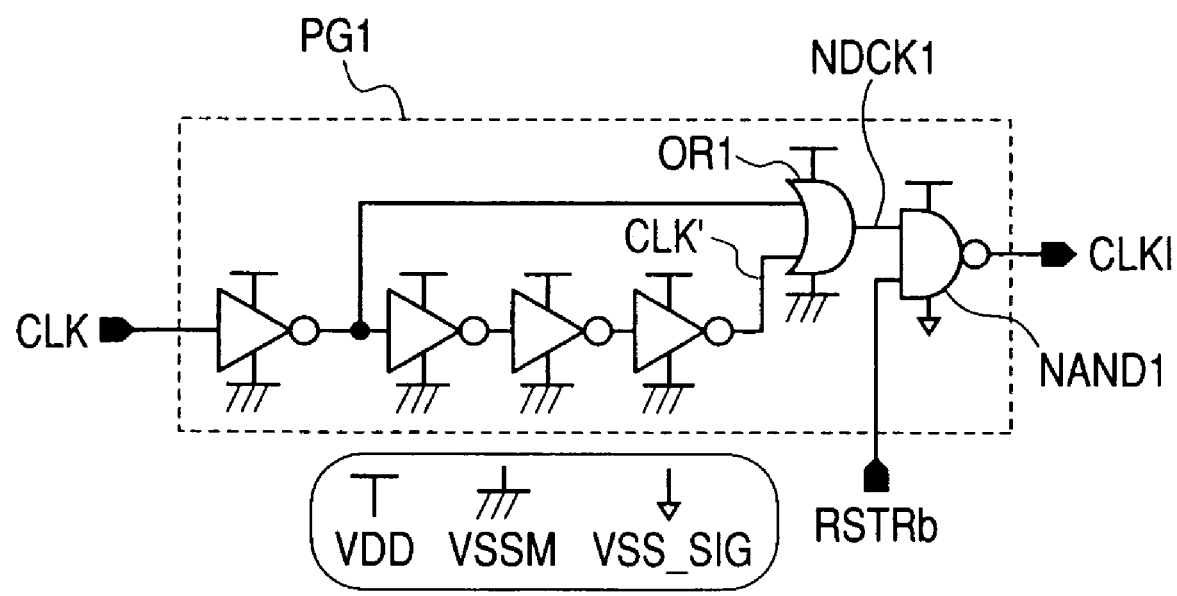
FIG. 24 is a schematic circuit diagram which shows a modified example of a pulse generator of the pulse latch shown in FIG. 18A and FIG. 18B.

FIG. 24 shows an example of controlling by means of one control signal NVCTL using a pulsed-latch circuit in practicing the control of the power line for data retention VSS_SIG shown in FIG. 23. This is a modified example of the pulse generator PG1 shown in FIG. 18A. This example is based on the premise that nonvolatilizing control is attained at the control signal RSTRb=LO by using the RSTRb signal. In a case of using the circuit shown in FIG. 23B, the number of the control signal line may be reduced to one with such a constitution. The operation in this case corresponds to that in FIG. 19 in which the RSTR signal therein is changed with the RSTRb signal as an inverted signal thereof. Also, in this case, operation of other signals and a mutual relation may be controlled in the same manner. It will be apparent that a desired nonvolatile control can be attained in FIG. 23A also by reversing connections between the RSTRb signal and the RSTR signal.

Figure 25A:
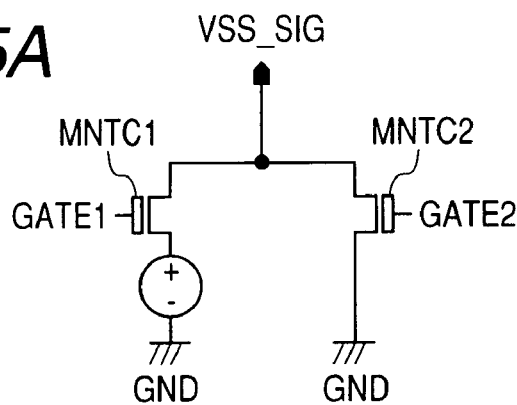
FIG. 25A is a schematic circuit diagram showing an example of the method of generation of a power line signal for data retention VSS_SIG.
Figure 25B:
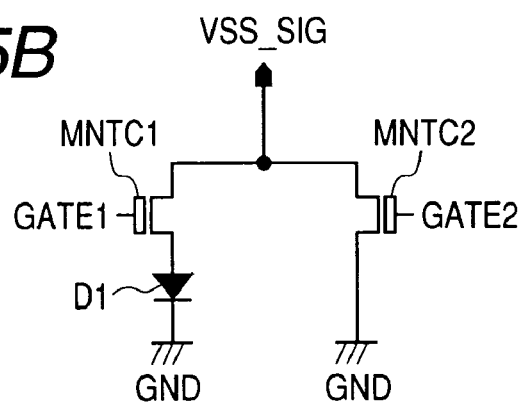
FIG. 25B is a schematic circuit diagram showing an example of the method of generation of a power line signal for data retention VSS_SIG.
Figure 25C:
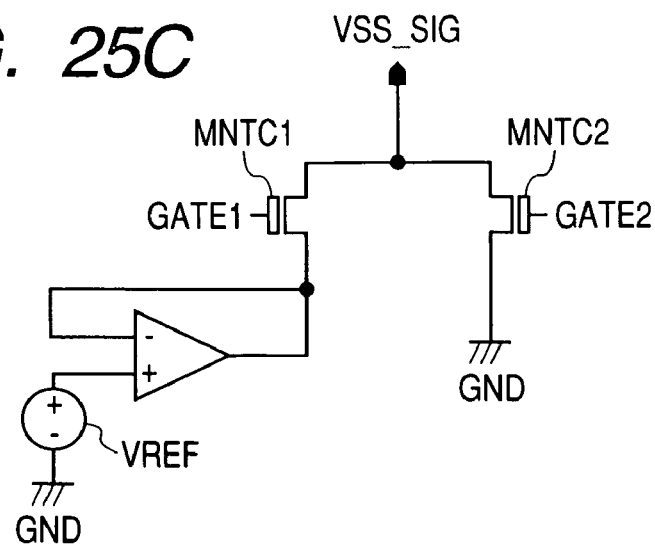
FIG. 25C is a schematic circuit diagram showing an example of the method of generation of a power line signal for data retention VSS_SIG.

FIGS. 25A to 25C show examples of forming the power line for data retention VSS_SIG. In these examples, for further reducing the power consumption during the standby mode, the value for the power line for data retention VSS_SIG can be controlled dynamically. FIG. 25A has a constitution capable of selecting the route to the power line for data retention VSS_SIG between the route connected with the ground GND by way of an N-type MISFET MNTC1 and a voltage source, and a route connected with the ground GND only by way of an N-type MISFET MNTC2 by using GATA1 signal and GATA2 signal, respectively. As shown in the drawing, for controlling the transistor, it is desirable to use a MISFET in an I/O having a large gate dielectric film thickness. Further, FIG. 25B shows an example of obtaining the voltage source in FIG. 25A by a diode connection, while FIG. 25C shows an example of a circuit for supplying a constant voltage from a constant voltage generator using a reference voltage generator VREF.

Figure 26:
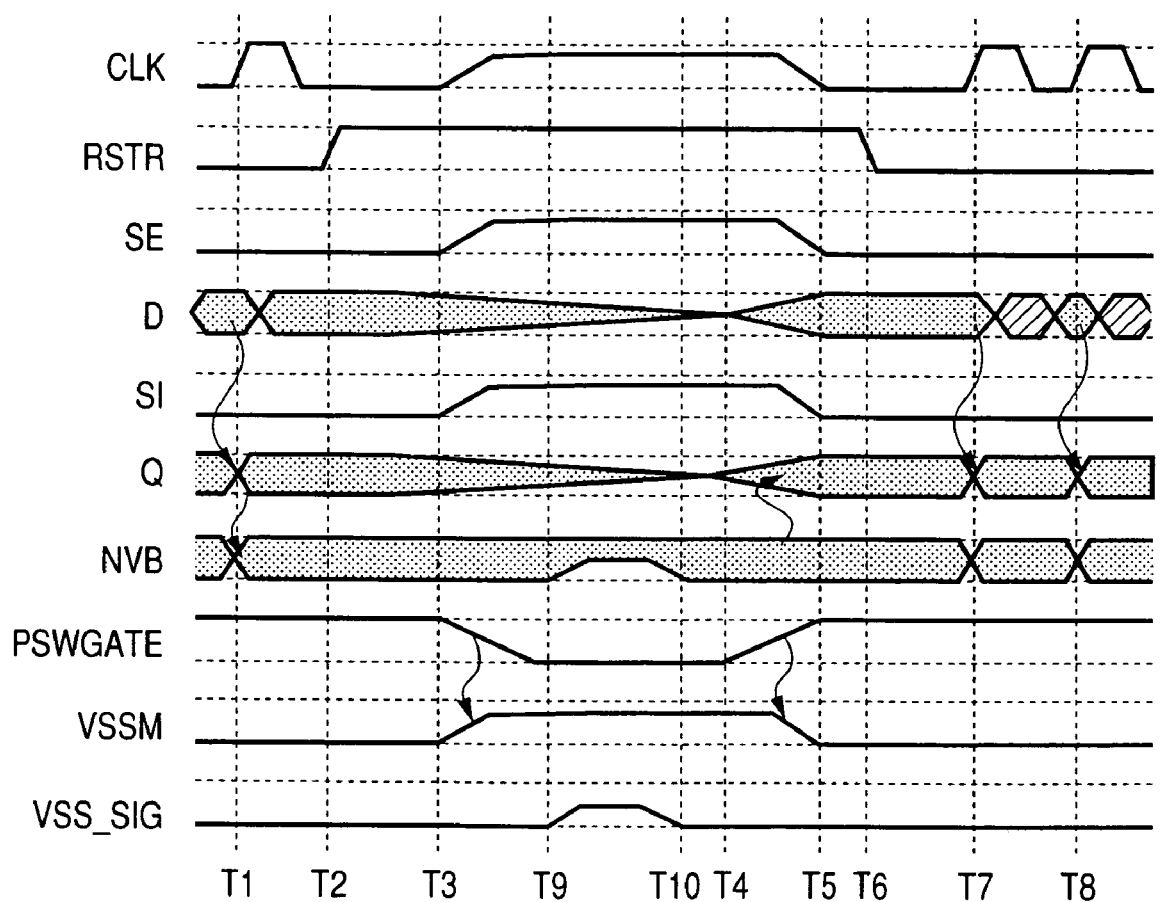
FIG. 26 is an operation waveform chart showing a case where the control method for generation of a power line signal for data retention VSS_SIG in FIG. 25 is applied to the nonvolatile flip-flop shown in FIG. 11.

FIG. 26 is a graph showing an operation waveform in a case of applying the VSS_SIG generation method shown in FIGS. 25A to 25C to the master-slave latch shown in FIG. 11. The method has a feature in that the value of the power line for data retention VSS_SIG is controlled to an intermediate level from time T9 to time T10. It is desired that control is conducted at time T9 after complete power shut-down and the level is returned to 0 V at time T10 before entering the power applying operation. This is conducted for preventing destruction of retained data in the nonvolatile circuit NVC by the effect of the noise caused by the operation of the internal circuit upon shut-down and power-on sequence, which enters the power line for data retention VSS_SIG. Time T9 may be controlled after shut-down of power at time T3 based on a signal indicating the complete shut-down of the power (for example, acknowledge signal) generated from a power switching controller. For determining the time T10, it is possible to adopt a method of decreasing the driving power of a driver MNTC2 in FIG. 25A to FIG. 25C, measuring a time until the potential at the basis of the power line for data retention VSS_SIG reaches a predetermined threshold value or lower and turning the power switch to ON after a period several times as long as the measured time.

Figure 27:
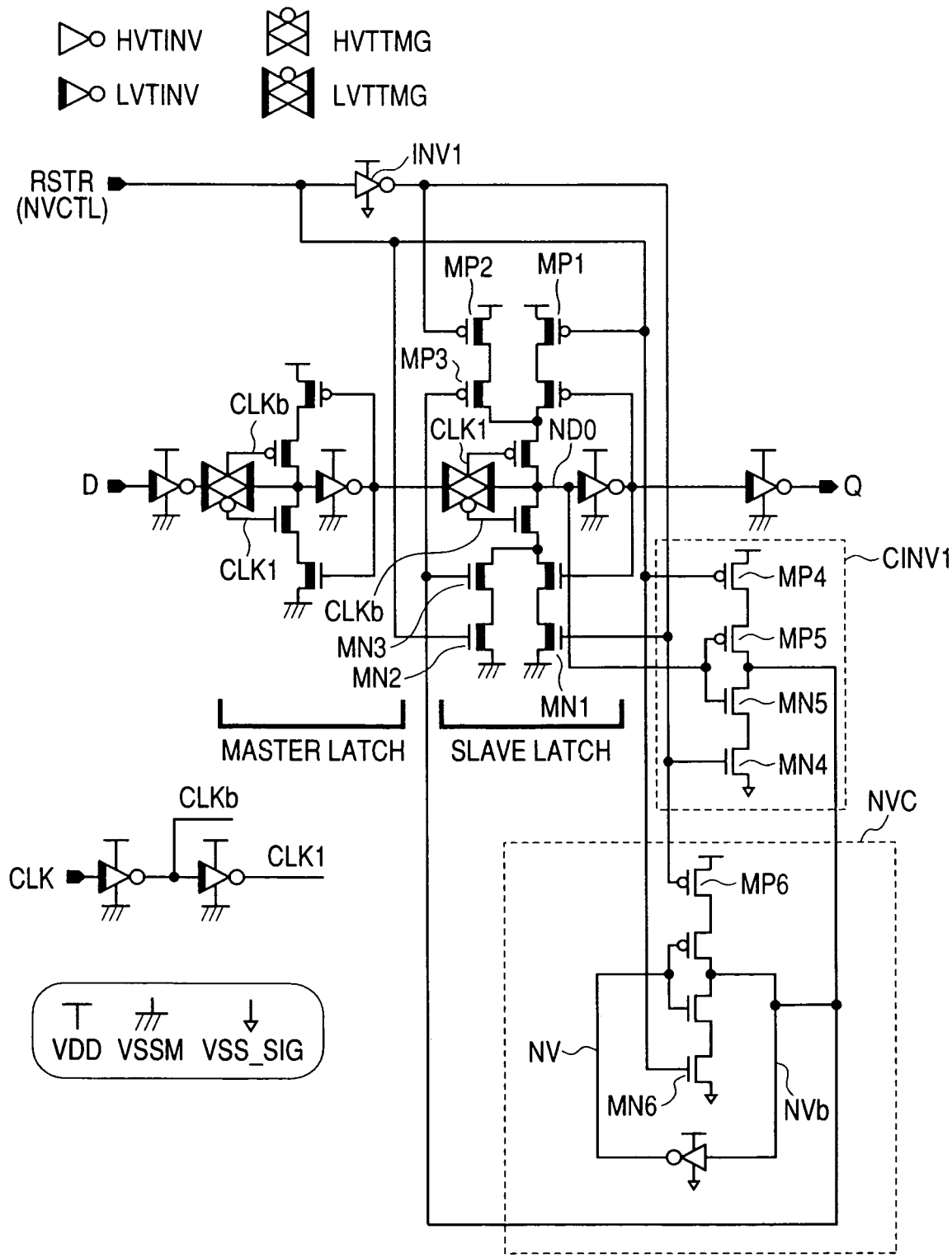
FIG. 27 is a schematic circuit diagram showing a circuit constituting the nonvolatile flip-flop in FIG. 11 by using plural kinds of MISFET.

Further, in accordance with the invention, an increase in the speed and a reduction in the power consumption can be attained further by using two kinds or more of transistors. FIG. 27 shows a modified example of a master-slave latch as shown in FIG. 11. The constitutional example has a feature in using a MISFET having a low threshold voltage for a master-slave latch that operates during normal operation and a logic gate LVTINV and a transmission gate LVTTMG using the same low threshold voltage MISFETs. This can increase the speed of the normal operation. On the other hand, for the circuits necessary during the standby mode, the leakage current can be suppressed by using a MISFET having a high threshold voltage and a logic gate HVTINV and a transmission gate HVTTMG, which consist of high threshold voltage MISFETs. Further, in a case where the gate dielectric film thickness of a MISFET constituting a circuit necessary in the standby mode (INV1, CINV1, NVC) is made thicker, it also provides an effect capable of saving the gate leakage current.

In this case, it is desired that the selection of the gate dielectric film thickness is based on that of a SRAM. It is expected that gate leakage currents for the memory cell in a SRAM will result in problems in the future. For example, in a case where the EOT (equivalent gate-dielectric thickness) for the MISFET used in the core is about 1.5 nm, the gate leakage current flowing through the SRAM can be decreased drastically by increasing the thickness of the dielectric film of the SRAM gate to about 2.0 nm to 2.2 nm by EOT. This is because the gate leakage current decreases by one digit on every increase in the thickness of 0.2 nm for EOT. In view of the above, in a system LSI fabricated by a multi-gate insulative film process (multi TOX process) which realizes such a SRAM, when the data retention part (INV1, CINV1, NVC) of a nonvolatile FF is constituted by using a MISFET having large thickness such as used for a SRAM memory cell, the nonvolatile FF with less leakage can be attained advantageously without additional process steps.

Such a modification is applicable also to a pulsed-latch circuit as shown in FIG. 18 or the sense-amplifier based flip-flop circuit as shown in FIG. 21. Also, in this case, a MISFET of low threshold voltage may be used in circuits other than a storage element for data retention SEC, or the gate-dielectric thickness of the transistor of the storage element for data retention SEC may be made identical with that of a SRAM.

FIGS. 28A to 28D show examples of adding a capacitance element to the nonvolatile circuit NVC. This is for improving various kinds of noise margins such as noise immunity against α-particles, neutron, cosmic rays, etc. in a nonvolatile circuit NVC. Particularly, the noise error becomes remarkable when the applied voltage for the storage element circuit SEC is reduced in order to reduce the leakage current by controlling the power source line for data retention VSS_SIG, as shown in FIG. 26, during the standby mode. This capacitance element is connected between the nodes NV and NVb of the nonvolatile circuit NVC in FIG. 11, FIG. 13, FIG. 15, FIG. 18, FIG. 20, and FIG. 21. In this figure the latches including two inverters are shown, but it is applicable in the same manner in a case where the latches are constituted with clocked inverters, as shown in FIG. 11, or a switching MISFET is provided. FIG. 28A shows an example of providing a capacitance element between the node NV and the node VCb and FIG. 28B is an actual example thereof. As shown in FIG. 28B, by bidirectionally connecting a MISFET as capacitance elements, since one of the MISFETs always functions as the capacitance element in accordance with the value for NV and NVb, a stable operation is possible.

FIG. 28C shows an example of a capacitive coupling between storage nodes NV, NVb and the power line for data retention VSS_SIG. The virtual power line VSSM is not suitable to be coupled, because it results in many noises upon power-on and shut-down of power and noises during operation. Therefore, capacitive coupling to the power line for data retention VSS_SIG is desirable. Such a capacitance element can be obtained by using an N-type MISFET, connecting the gate of the N-type MISFET to the node NV and the node NVb, and connecting the source and the drain to the power line for data retention VSS_SIG. In a case of using a P-type MISFET, connection between the gate and the drain and the source are inverted or reversed. Further, FIG. 28D shows coupling to the high potential power source VDD. This can also be attained by using an N-type MISFET, connecting the gate N-type MISFET to the high potential side power source VDD and connecting the source and the drain to the side of the node NV and the node NVb. In a case of using a p-type MISFET, the connection between the gate and the drain and the source may be reversed. Application of them provides an effect of improving the noise immunity.

In a case of shut-down of the power line for data retention VSS_SIG, the capacitance element may be disposed so as to avoid coupling to the virtual power line VDDM wired in the cell.

Figure 29:
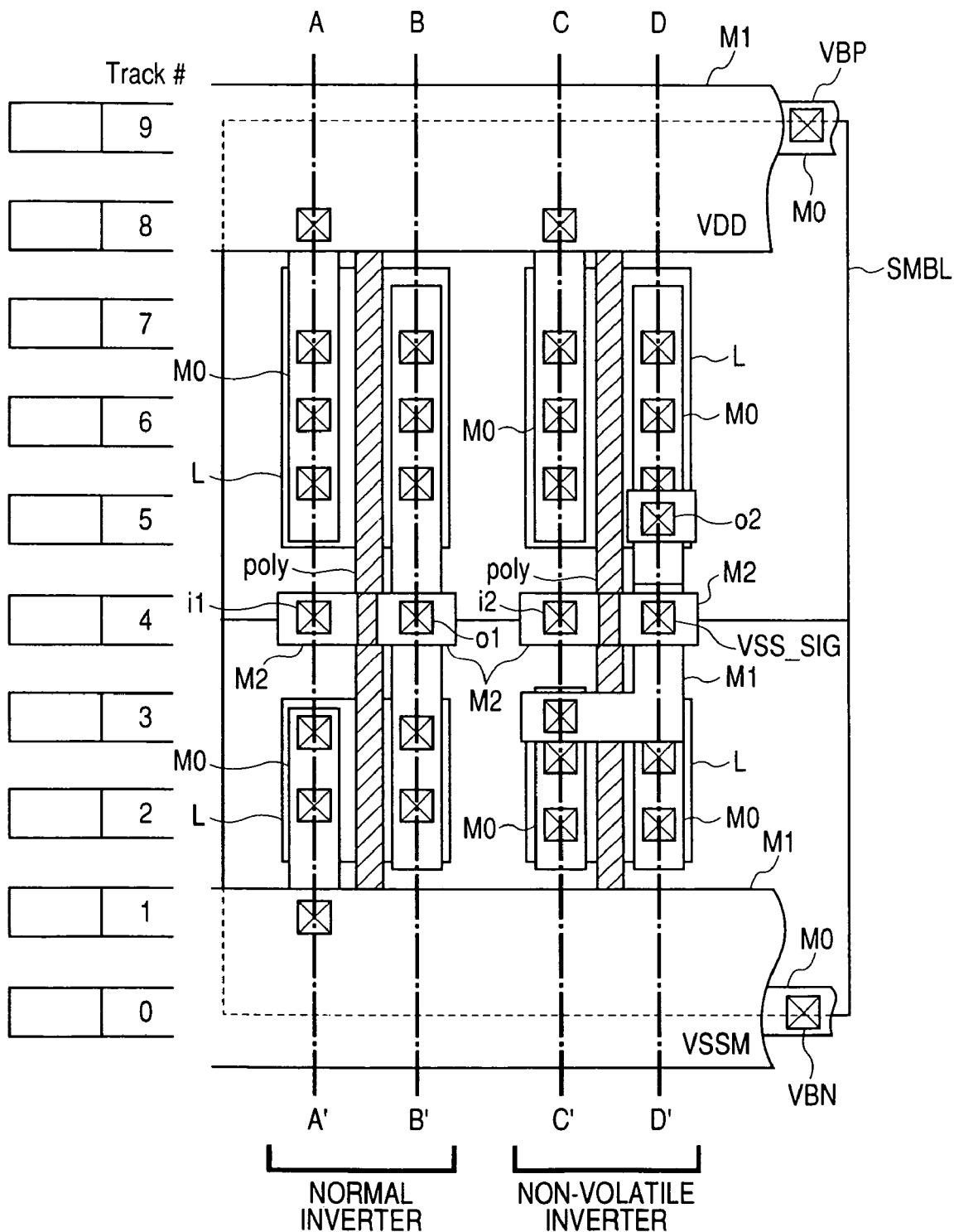
FIG. 29 is a diagram which shows an example of element layout for a nonvolatile flip-flop in accordance with the invention.

FIG. 29 shows an example of the layout for standard cells for attaining the present invention. This shows a so-called standard cell with 9-grid height which can be laid out with nine minimum-width metals. This shows an example having VSSM wiring riding over the No. 0 track and the No. 1 track, and VDD wiring riding over the No. 8 track and the No. 9 track. In a case of using metal of such a large width for the power line, it is necessary to also enlarge the space in view of the condition in the resolution upon exposure, and the wiring is inhibited for the No. 2 track and No. 7 track in many cases. Accordingly, No. 3 track, No. 4 track, and No. 5 track are allocated to the wirings in the cell, and the No. 6 track is allocated as the inter cell wiring channel.

Figure 30A:
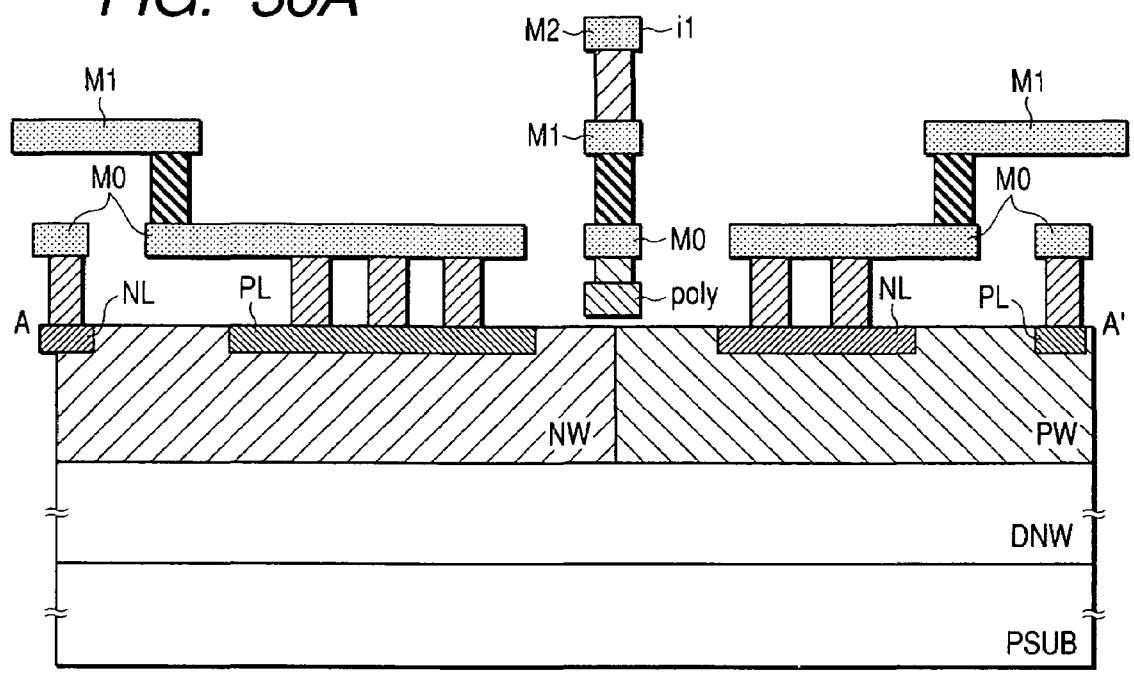
FIG. 30A is a cross sectional view of a normal inverter as shown in FIG. 29.

For explaining the wiring structure of the transistors in the cell, two inverters are shown in the drawing. One of them is a normal inverter which is supplied with power from the virtual power line VSSM. This inverter has an input terminal i1 and an output terminal o1. The other of them is a nonvolatile inverter which is supplied with power by using a power line for data retention VSS_SIG. This inverter has an input terminal i2 and an output terminal o2. The normal inverter is connected from the power supply metal (M1) in which two power sources (VDD and VSSM) are wired in the cell by way of an M0 wiring layer to a diffusion layer (L). This corresponds to the view seen along line A–A' in the figure and a cross sectional view thereof is shown in FIG. 30A. As is apparent from the figure, the two power sources are connected with power wiring. The drawing shows an example of leading from the second metal (M2) and the substrate power supply is used in common with the normal inverter and the nonvolatile inverter. While the substrate power sources can be constituted separately for the normal inverter and the nonvolatile inverter, this needs well isolation for the isolation of the substrate power sources to lower the area efficiency.

The cross sectional structure will be described simply. This example consists of a triple well structure in which an N-type well DNW is prepared to a deep depth on a P-type substrate PSUB, on which a P-type well PW for forming an N-type MISFET and an N-type well NW for forming a P-type MISFET are formed. In a case of adopting such a substrate structure, it is possible for a substrate bias control to control the substrate potential thereby decreasing the leakage current. When the substrate bias control is used, the absolute value of the threshold voltage is effectively increased. Therefore, the leakage current can be decreased by controlling the substrate voltage lower than the source voltage of the N-type MISFET in a case of the N-type MISFET and by controlling the substrate voltage higher than the power source voltage of the P-type MISFET in a case of the P-type MISFET. Also, in accordance with the invention, the power consumption can be further reduced by conducting such substrate bias control during the standby mode. Although not illustrated, it is also applicable to a so-called double well structure not provided with the N-well DNW.

Figure 30B:
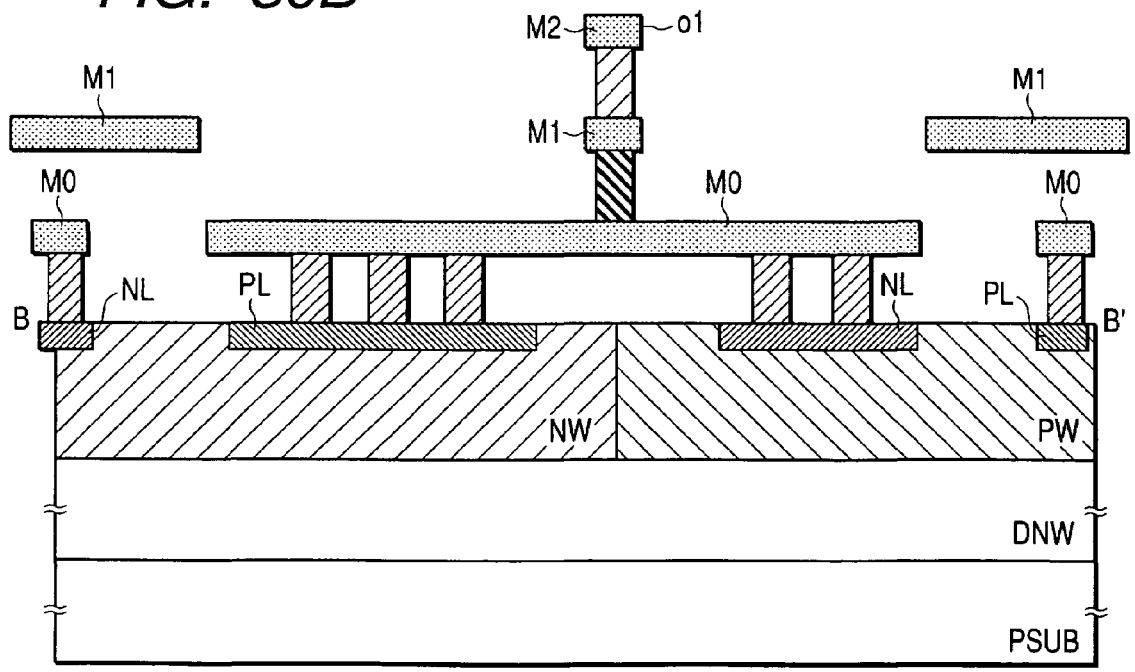
FIG. 30B is a cross sectional view of a normal inverter as shown in FIG. 29.

The output O1 is connected to metal wirings M1 and M2 by way of via holes after connecting the diffusion layers of the P-type MISFET and the N-type MISFET together. This corresponds to the view seen along line B–B' in FIG. 29 and the cross section is shown in FIG. 30B.

Figure 31A:
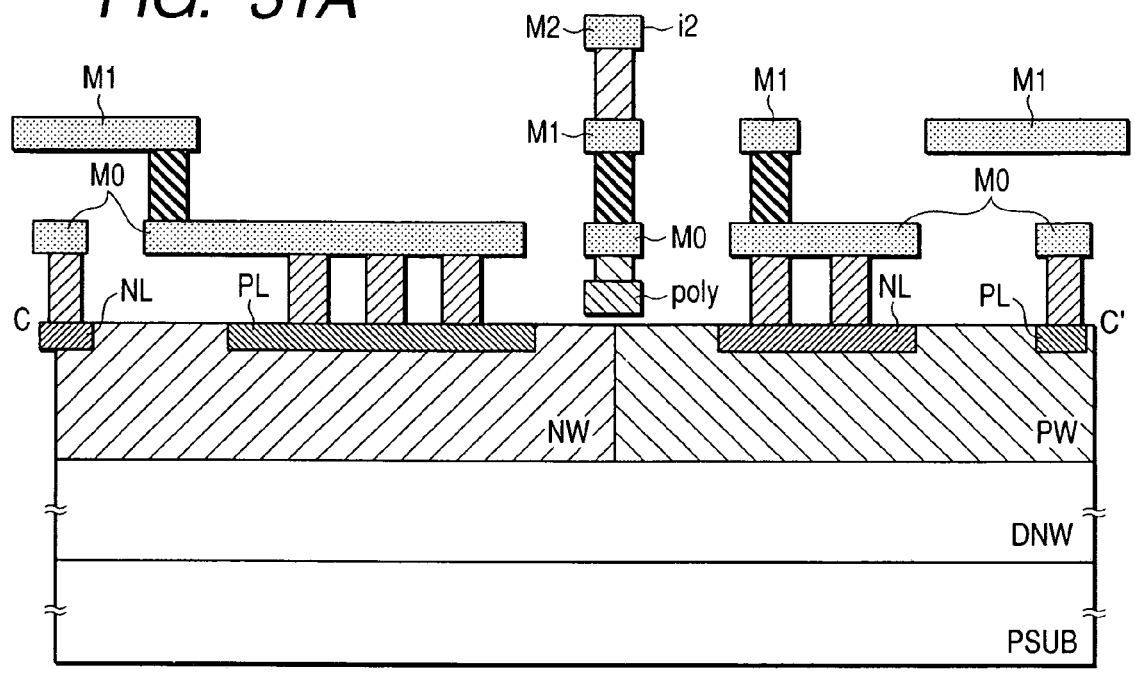
FIG. 31A is a cross sectional view of a nonvolatile inverter as shown in FIG. 29.
Figure 31B:
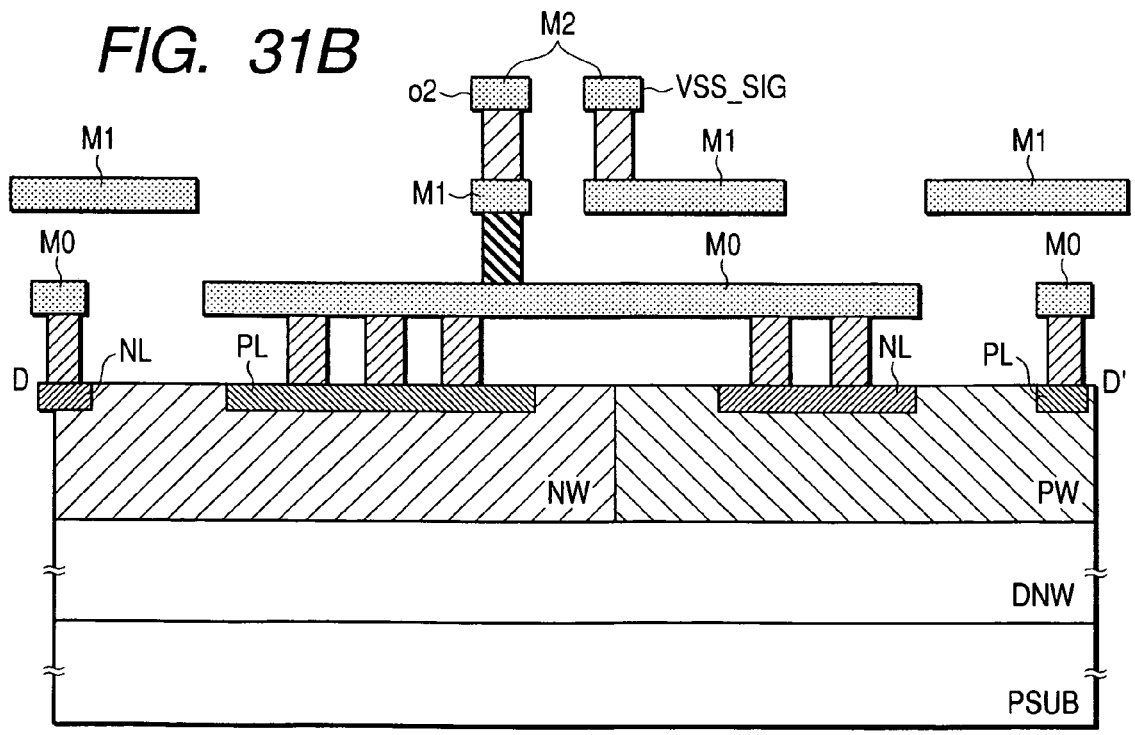
FIG. 31B is a cross sectional view of a nonvolatile inverter as shown in FIG. 29.

On the other hand, the nonvolatile inverter has a feature in that the power source on the side of VDD is connected from the VDD power wiring by way of metal layer M0 and the ground side is wired from the pin of VSS_SIG, which situated about at the center of the cell height. This connection corresponds to the view seen along line C–C' in the FIG. 29 and the cross section is shown in FIG. 31A. As apparent from the drawing, the source of the N-type MISFET is not connected with the virtual power line VSSM. The output O2 is connected by way of the via hole VIA to the metal wirings M1 and M2 after connecting both of the diffusion layers of the P-type MISFET and N-type MISFET together. This corresponds to the view seen along line D–D' in FIG. 29 and the cross sectional view is shown in FIG. 31B.

Figure 32:
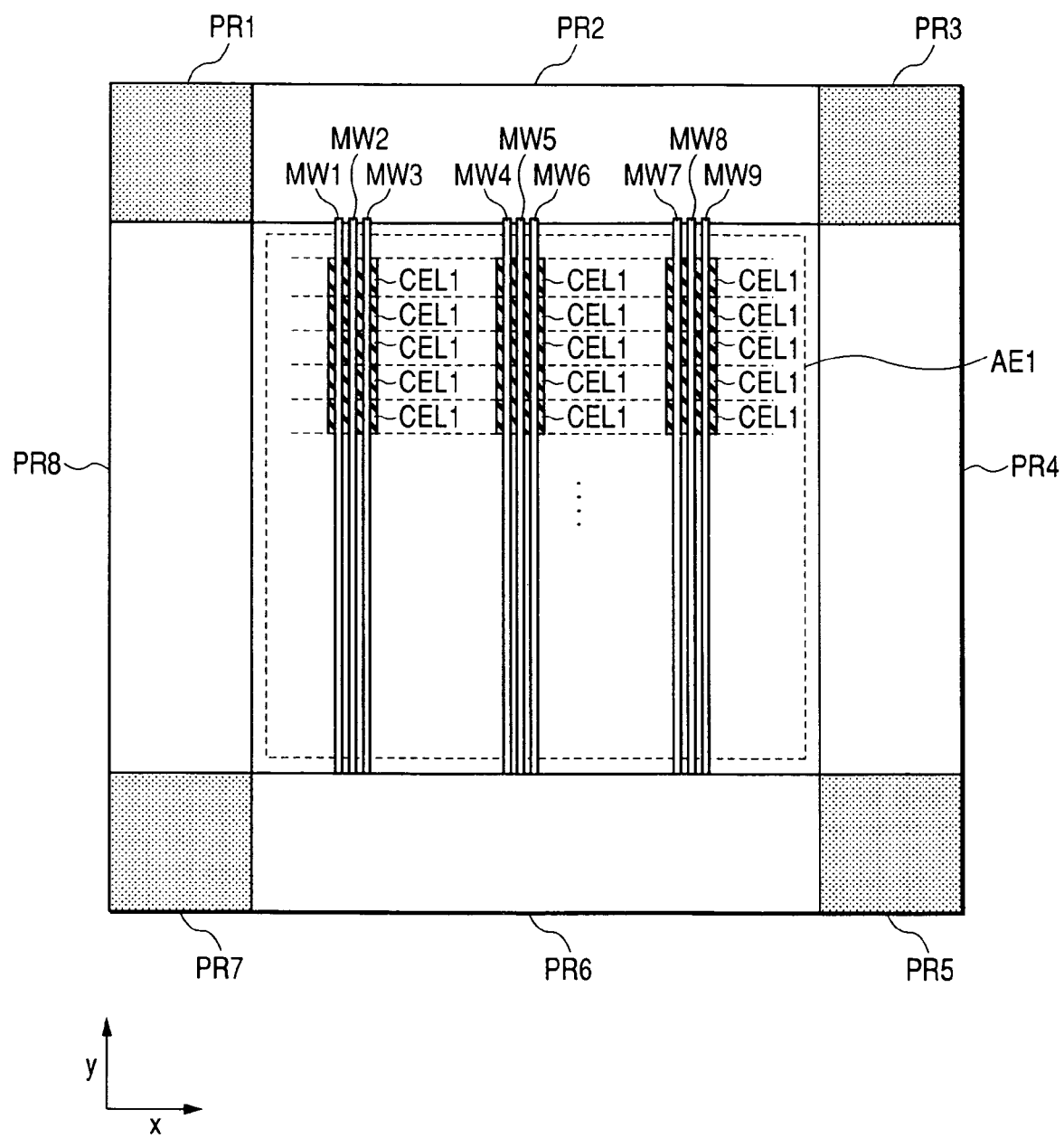
FIG. 32 is a layout diagram for a first region AE1.

FIG. 32 is a layout view of a first area AE1. A circumferential main power line (power ring region) is laid out so as to surround the first region AE1. Power lines VDD, power lines VSS, visual power lines VSSM and various kinds of control signals are wired. When a control circuit for the standby mode STBYC and such are arranged below the power ring region PR1 to PR8 in FIG. 38, the area can be utilized effectively. Since the main power line of the first metal layer and regions PR4 and PR8 are situated on both ends of the cell row, it is advantageous to provide a MISFET for power shut-down. Since a MISFET for power shut-down requires large a current supply performance, it is preferably laid out as plural MISFETs. Further, it is preferred that the power switching controller, VSS_SIG generator and NVCTL control circuit for generating the control signal group of the nonvolatile circuit NVC shown in FIG. 25A to FIG. 25C are laid out below regions PR1, PR3, PR5, and PR7 at four corners of the power ring region.

Further, FIG. 32 shows an example in which power line MW1 to power line MW9 at the second metal layer for power reinforcing are laid out in the longitudinal direction. In the drawing, there are three power lines (power line VDD and VSS and virtual power line VSSM) as a group of power main lines extending in the direction Y of the drawing (referred to as "group of longitudinal main line"), but they are not restricted to three. Further, in an actual layout, various power supply lines can be laid out using multiple layers, or such power supply lines can be laid out only with one wiring layer (for example, M2 layer).

In placing and routing by using a CAD, layout is facilitated by the constitution of arranging by using cells CEL1 in which only the longitudinal main lines are laid out each at an equal interval. Generally, MISFETs are not prepared, but only the power wirings are laid out in the cells CEL1.

In a case where the control signal NVCTL of a number of nonvolatile FF are driven only by a single driver of the control circuit in the standby mode CTBYC, the driving force cannot sometimes be obtained sufficiently. In this case, a repeater cell is advantageously disposed in the cell CEL1. Since the power line VSS which is always supplied with power can be wired in the cell CEL1, it is possible to dispose a driver capable of operating also in the standby mode. For the layout of the driver, wiring may be conducted as the wiring of the nonvolatile inverter on the source of NMOS in the layout of FIG. 29.

Figure 33:
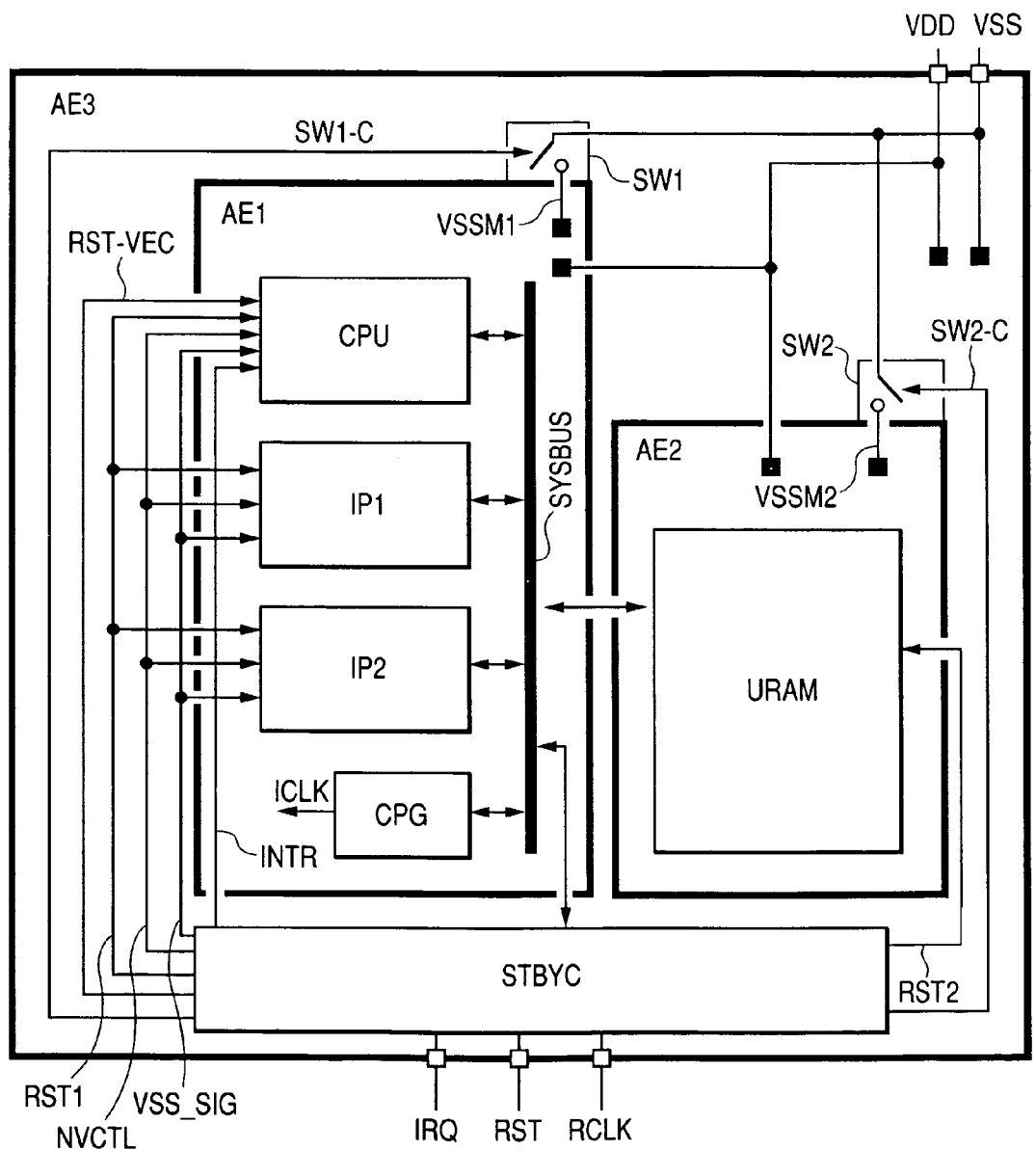
FIG. 33 is a diagram showing the chip constitution of an integrated circuit using the invention.

FIG. 33 shows a constitutional example of an LSI chip to which the invention is applied. The LSI chip is shown as a block diagram in a case of application to an information processing device, particularly, a micro processor. The LSI chip (system LSI) is preferably formed monolithically on one single semiconductor substrate.

The system LSI has a first region AE1, a second region AE2 and a third region AE3 as regions capable of controlling the power supply independently. The first region AE1 comprises a processor CPU, embedded circuit modules IP1 and IP2, a system bus SYSBUS, and a clock generator CPG. The power supply of this region is controlled by a power switch SW1. It is preferable that all flip-flops or latches in the first region AE1 are constituted with a nonvolatile FF. But, it is also possible to constitute only a minimal number of the flip-flops or latches necessary for retaining the status with the nonvolatile FF. The second region AE2 contains a built-in user memory URAM. The power supply of this region is controlled by a power switch SW2. Finally, the third region AE3 contains a control circuit for standby mode STBYC. This region is always supplied with power so long as power is supplied to the system LSI. In this case, the power switches SW1 and SW2 are supposed to be put between the ground potential VSS and the virtual ground potential VSSM for each of the regions. But of course they may be put between the power supply VDD and virtual power supply VDDM for each of the regions. Particularly, in a case of providing a voltage regulator, the voltage regulator can also be used in place of the power switch. Further, it may be disposed both between the ground potential VSS and the virtual ground potential for each of the regions and between the power supply VDD and the virtual power supply VDDM for each of the regions.

The CPU controls the entire system LSI. The embedded circuit module IP1 is not necessary when the CPU fetches the instruction, for example, an accelerator for MPEG. The embedded circuit module IP2 is necessary when the CPU fetches the instruction, for example, a bus state controller. The system bus SYSBUS is connected with each of the circuit modules including the CPU and it includes a not illustrated data bus and address bus. The clock generator CPG receives the clock signal RCLK and generates an internal clock signal ICLK. The internal clock signal ICLK is supplied to each of the circuit modules and the system LSI operates in accordance with the internal clock signal ICLK. The built-in user memory URAM has a large capacity and retains necessary data such as data under processing. In the constitutional example of FIG. 33, each of the circuit modules contained in the first region AE1 is collectively arranged and each of the circuit modules contained in the second region AE2 is collectively arranged. With such an arrangement, since the power switches SW1 and SW2 can be provided in common with plural circuit modules, the area can be decreased. Further, in FIG. 33, the embedded circuit modules disposed in the first region AE1 can also be arranged in different regions independently for enabling power shutdown relative to each other. In this case, since the power shut-down control can be conducted on every module if they are not in use, power shut-down for the embedded circuit modules not in operation can be conducted even during operation of the CPU to provide an effect capable of saving the leakage current during operation.

In the standby mode utilizing the nonvolatile FF of the invention (referred to as "first standby mode STBY1"), the power switch SW1 is put to the off state and the power switch SW2 is kept in the ON state. Since this shuts down the power supply to the processor CPU, the embedded modules IP1 and IP2 and the clock pulse generator CPG, the current consumption can be decreased. Also in this case, since the power can be supplied to all of the nonvolatile FF in the first region AE1, the data can be retained continuously.

The transition operation will be described. The internal data in the first region AE1 is retained by the nonvolatile FF. Further, cash data, etc. are retracted to the built-in user memory URAM as required. The nonvolatile FF is supplied with power and the control signal by the control circuit in the standby mode STBYC in the third region AE3. Then, the power switch control signal SW1-C puts the power switch SW1 to the OFF state to stop the supply of current to each of the circuit modules contained in the first region AE1. Since the main power switch SW2 is kept ON, current is supplied to the circuit modules to the nonvolatile FF in the first region AE1 and the circuit modules in the second region AE2, and the internal data of the system LSI is retained. Thus, the interruption upon returning from the first standby mode can be conducted by returning the data of the nonvolatile FF or the data retained in the internal built-in user memory URAM to a predetermined circuit in the first region AE1 by the interruption request from the outside. In a case where the interrupt request is given, the control circuit in the standby mode STBYC turns the power switch SW1 to ON as explained, for example, with reference to FIG. 11 and FIG. 12. After the power is supplied to the first region AE1, the data retained in the nonvolatile circuit NVC of the nonvolatile FF is reflected to the output of the nonvolatile FF. Therefore all states of the random logic of the first region AE1 are recovered to the state before power shutdown. In a case where the data retracted to the built-in user memory URAM is present, the retracted internal data of the system LSI is returned to the first region AE1.

Since the operation is conducted in a shorter time compared with the resetting sequence which requires booting of software, such as an OS, it can be returned at a higher speed compared with U standby losing internal data where the internal data is eliminated. While a description has been made with respect to an example in which the internal data is retracted to the build-in user memory URAM, it can also be retracted to an external memory.

Further, in the system LSI, another standby mode, for example, an existent software standby (refer to as "second standby mode STBY2") or U standby (refer to as "third standby mode STBY3") mode can be used together. This can set a low current mode flexibly depending on the state of the system LSI being used. FIG. 34 shows a table for each of the modes.

The first standby mode STBY1 is a state where the power for the first region AE1 is shut down, and power is supplied but the clock is stopped in the second region AE2. Since the internal data in the first region AE1 can be retained by the nonvolatile FF, the internal data is retained and can be returned by an external interrupt. Accordingly, for the returning time, only the time up to the restarting of the clock, which is done in parallel with the operation time of the power switch, may be taken into consideration, and it can be returned in about several hundred μ seconds. Transition to the first standby mode can be attained by setting a mode setting register STBCR of the control circuit in the standby mode STBYC. In the first standby mode, since the power for most of the circuits in the first region AE1 is shut down by the power switch, the current consumption is suppressed to about 100 μA.

In the second standby mode STBY2, while the power is supplied to all of the first region AE1, the second region AE2 and the third region AE3, distribution of the clock signal to the first region AE1 and the second region AE2 is stopped. Accordingly, since the circuit modules in the first region AE1 and the second region AE2 are not operated, the system can stand by with a consumption power of about the transistor leakage current. Also in this case, since the internal data can be retained continuously, the internal data is nonvolatile. Further, for the returning time, since returning can be conducted by the interruption processing described above, it may be only about the time for restarting the clock and it can be returned in about several hundred μseconds. The transition to this mode can also be attained by setting the mode setting register STBCR of the control circuit in the standby mode STBYC.

The third standby mode STBY3 is a mode for shutting down the power for all regions other than the third region AE3; and, while the consumption current is about 10 μA, since the internal data is evaporated, it can be returned only by resetting and it needs about several hundred milliseconds for returning. The transition to this mode can also be attained by setting the mode setting register STBCR of the control circuit in the standby mode STBYC.

As can be seen from the table in FIG. 34, since the first standby mode STBY1 and the second standby mode STBY2 are different only with respect to the current consumption, the first standby mode and the second standby mode can be collected into one low current mode. Further, power and clock signals are supplied to all of the first region AE1, the second region AE2 and the third region AE3 during normal operation, and supply of the power is shut down to all of the circuits upon turning OFF of the power.

Various combinations of mode shown are possible herein for the standby mode. In this case, the constitution of the system LSI is also modified to such an extent as necessary for the combination. For example, in a system LSI not having a third standby mode, the second region AE2 in FIG. 33 is eliminated and the circuit module in the second region AE2 is disposed in the third region AE3. Further, instead of the power switch in the system LSI, the power may also be shut down by a power control circuit external to the system LSI. Further, instead of controlling all nonvolatile FF in the first region AE1 with one control circuit in the standby mode STBYC, a standby control circuit may also be provided on every module.

Figure 35:
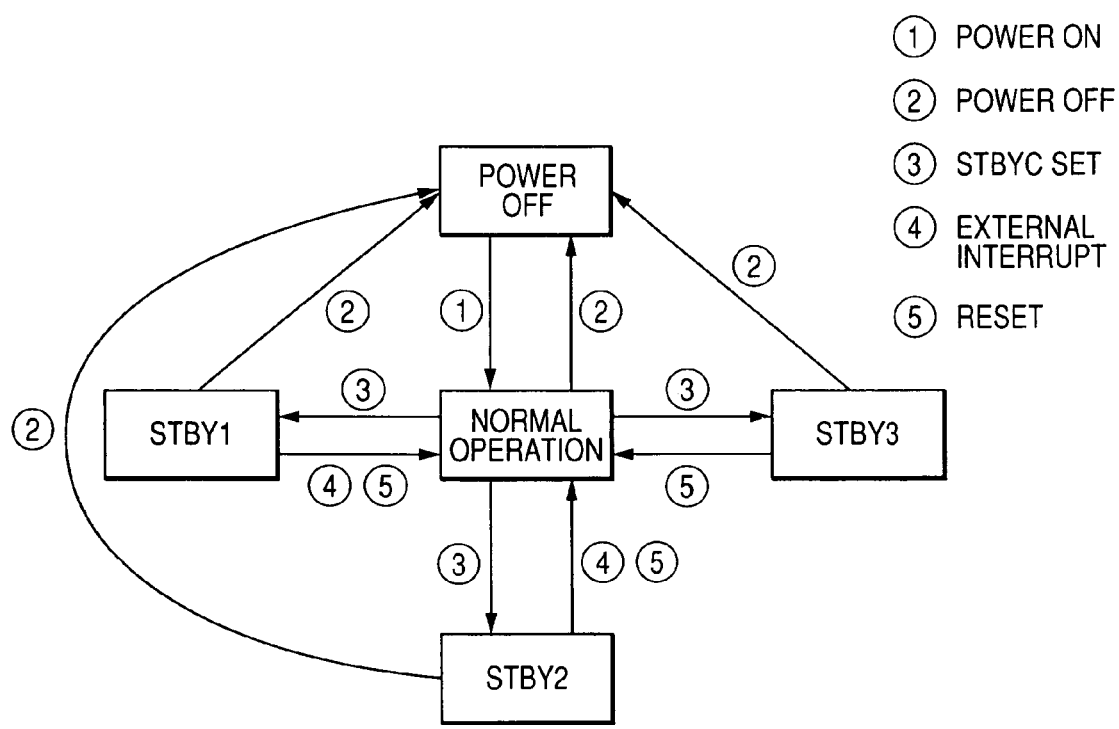
FIG. 35 is a diagram showing transition of state between types of modes.

FIG. 35 is a view showing the transition between each of the modes. The power off mode transits to the normal operation mode by turning ON the power. Conversely, the normal operation mode transits to the power off mode by turning off the power.

The normal operation mode transits to the third standby mode STBY3 by setting the register STGCR. Conversely, the third standby mode STBY3 returns to the normal operation mode by resetting. The third standby mode STBY3 transits to the power off mode by turning OFF the power.

The normal operation mode transits to the first standby mode STBY1 by setting the register STBCR. Conversely, the first standby mode STBY1 transits to the normal operation mode by external interruption or resetting. The first standby mode STBY1 transits to the power OFF mode by turning OFF the power.

The normal operation mode transits to the second standby mode STBY2 by setting the register STBCR. Conversely, the second standby mode STBY2 transits to the normal operation mode by external interruption or resetting. The second standby mode STBY2 transits to the power OFF mode by turning OFF the power.

Figure 36:
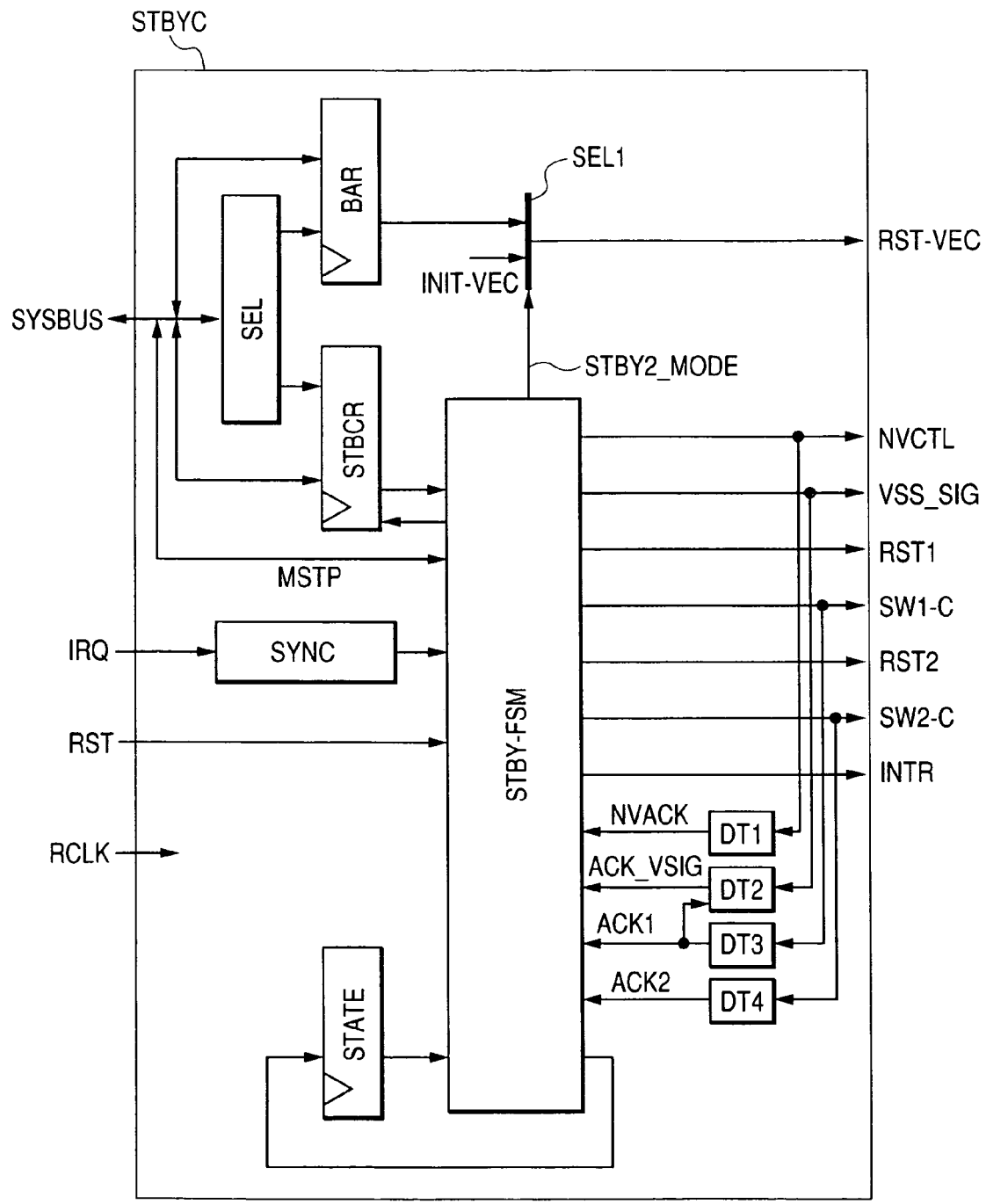
FIG. 36 is a block diagram showing an example of a control circuit in the standby mode STBYC.

FIG. 36 shows the constitution of the control circuit in the standby mode STBYC for controlling the transition and returning to and from various types of standby modes. Description is to be made at first to a case of applying the nonvolatile FF of the invention to flip-flops and registers by the required minimum number. The control circuit in the standby mode STBYC is connected with a system bus SYSBUS for reading and writing to and from the internal register and inputted with an interrupt request signal IRQ, a reset signal RSK and a clock signal RCLK. The output from the control circuit for the standby mode STBYC includes a nonvolatile control signal NVCTL, a power line for data retention VSS_SIG, an interrupt signal INTR notifying interruption to the CPU after returning from the second standby mode, a CPU execution start address RST-VEC (the first address for beginning the process when the CPU resumes), a reset signal RST1 for the first region AE1 and a control signal WS1-C for the power switch SW1, a reset signal RST2 for the second region AE2 and a control signal SW2-C for the power switch SW2. While the interrupt signal INTR is directly connected with the CPU in FIG. 33, it may be connected, for example, by way of an interrupt controller to the CPU.

The control circuit in the standby mode STBYC has a standby mode control register STBCR and a boot address register BAR as registers capable of reading and writing from and to the system bus SYSBUS. Reading and writing from the system bus SYSBUS are controlled by a decoder. The standby mode control register STBCR retains a value corresponding to the current standby mode. Further, writing from the system bus STSBUS to the standby mode control register STBCR forms a transition request to each of the corresponding low current modes. In this example, the control circuit in the standby mode STBYC is constituted so as to control transition to the first standby mode, the second standby mode and the third standby mode, or for returning from each of the modes. Further, transition to or returning from the first standby mode can be conducted also by directly sending a clock stop command from the CPU to the clock pulse generator CPG.

Upon returning from the second standby mode and releasing a reset state, the boot address register BAR retains the address of the instruction that the CPU should execute first. In this example, the transition request to the second standby mode is given by writing to the standby mode control register STBCR, but the transition can be requested also by using a special command such as sleep or standby, or a combination of the standby mode control register STBCR and the special instruction. In this case, the CPU can instruct by sending the transition request by way of an acknowledge signal for a sleep request, which is not illustrated here, to the control circuit in the standby mode STBYC.

A synchronizer SYNC included in the control circuit for the standby mode STBYC synchronizes the interrupt request IRQ from the outside of the chip with the external clock signal RCLK. A current mode control sequence circuit STBYC-FSM judges the necessity for the transition and return of the standby mode and outputs the sequence for transition and return as required. The input is a value of the standby mode register SBCR, the interrupt request IRQ, the status register STATE indicative of the step under execution in the sequence during transition and return, and the output is an output of the control circuit in the standby mode STBYC and a second standby mode signal STBY2-MODE that indicates whether the current state is the second standby mode or not.

Upon returning from the second standby mode when receiving the interrupt request signal IRQ from the outside, it is necessary to conduct an interruption corresponding to the interrupt request signal IRQ after returning the data retracted to the built-in user memory URAM or the external memory to each of the circuit modules in the first region AE1. The interruption is conducted by executing a predetermined instruction. Accordingly, upon returning from the second standby mode, it is necessary to retain the address of the memory which stores an instruction to be conducted at first after returning. Thus, the boot address register BAR is disposed for retaining the address of the memory storing an instruction to be executed at first upon returning from the second standby mode, and an execution starting address is set to the boot address register BAR upon transition to the second standby mode. It is also possible to set the execution starting address upon returning from the second standby mode so that it is always identical. In this case, it is possible to constitute with a hard wired structure while saving setting of the execution address upon transition to the second standby mode. According to the constitution shown in FIG. 36, a software designer can freely set the execution start address after a return by the provision of the boot address BAR and can locate the program necessary for the return of the second standby mode at an optional position in a memory space.

On the contrary, since the return from the third standby mode always involves a resetting, the boot address INIT-VEC is executed at first. In the constitution of FIG. 36, a selector SELL is provided, a second standby mode signal STBY2-MODE is outputted from the current mode control sequence circuit STBYC-FSM to select either the address stored in the boot address register BAR or the boot address INIT-VEC upon normal resetting for the first address for beginning the process when the CPU resumes. This can attain the function of outputting the boot address INIT-VEC upon resetting for returning from the third standby mode and executing the instruction from the address retained in the boot address register BAR only upon returning from the second standby mode. In the return from the first standby mode, after starting the supply of the internal block signal, an instruction is read out from the address corresponding to the kind of interrupt request IRQ in the same manner as in the interruption processing which occurs during normal operation mode.

In the constitution of FIG. 36, the execution start address upon return from the second standby mode or the third standby mode is decided by the control circuit in the standby mode STBYC, and it is inputted to the CPU. On the other hand, it is also possible to provide a register for retaining the execution start address after returning to the CPU and conduct retraction and a return for the register by the hardware using the nonvolatile FF.

While the description has been directed to a control circuit in the standby mode STBYC in a case of adopting a nonvolatile FF partially, all FF and registers included in the first region AE1 may be replaced with a nonvolatile FF. In the system described above, since data in the CPU (circuit modules) are entirely retained upon return by interruption, it is no longer necessary to write the value by the CPU execution start address RST-VEC. Accordingly, such a system can be constituted while saving the boot address register BAR and the selector SEL1.

Figure 37:
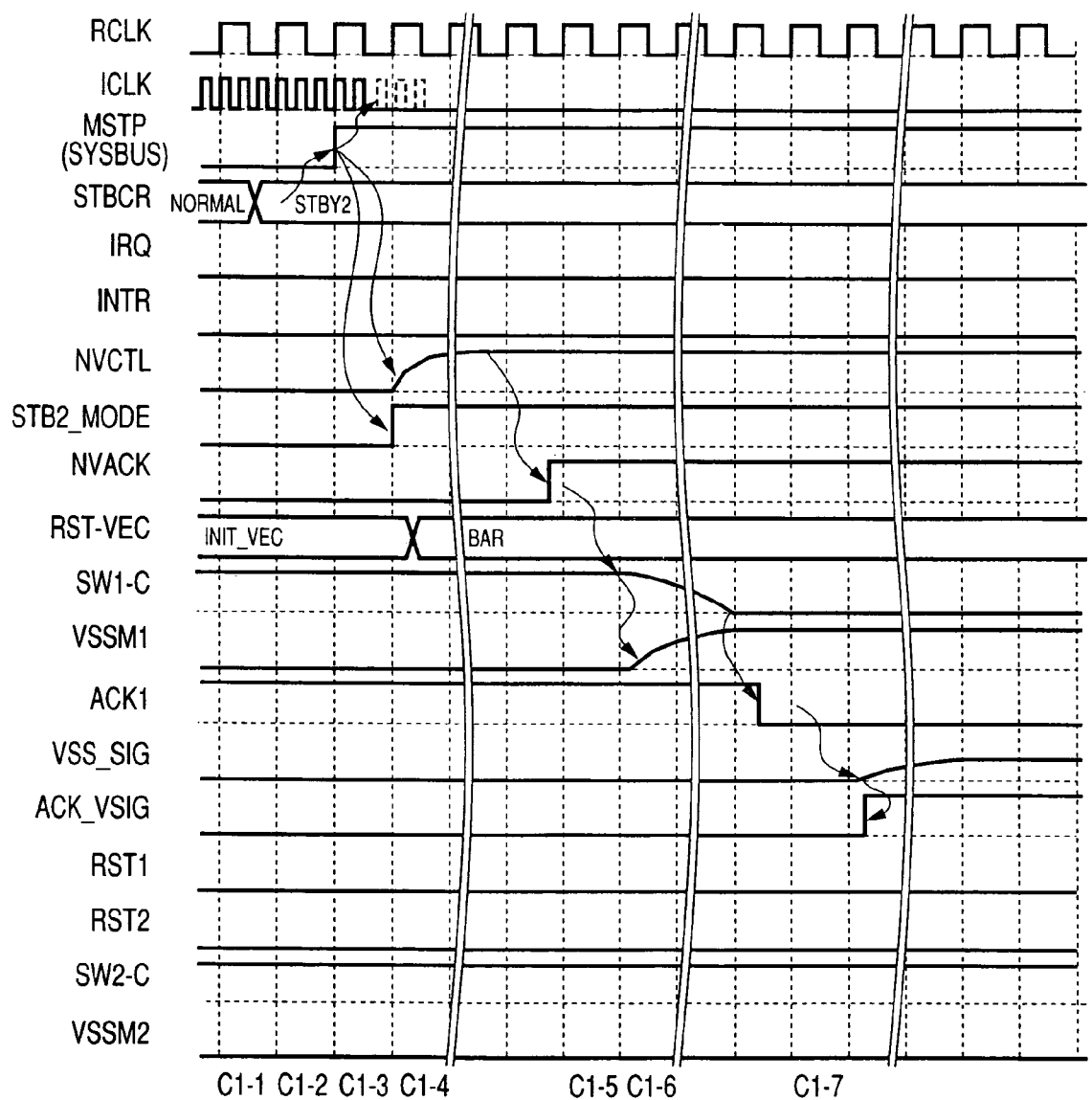
FIG. 37 is a timing chart for a transition sequence transiting from a normal operation mode to a second standby mode.

The sequence of transition to the second standby mode STBY2 and the return to the normal operation mode will be described with reference to FIG. 37 and FIG. 38. At first, FIG. 37 shows a sequence transiting from the normal operation mode to the second standby mode STBY2. In cycle C1-1, a value STY2 meaning the second standby mode is written from the system bus STYBUS to the standby mode control register STBCR. In the cycle C1-2, the control circuit in the standby mode STBYC reads the value and puts the module stop signal MSTP "1" through the system SYSBUS to stop the supply of clocks to the first region AE1 in the cycle C1-3. Then, in the cycle C1-4, it puts the second standby mode signal STBY2-MODE and the nonvolatile FF control signal NVCTL to "1" and retracts the data of the flip-flop in the modules in the first region AE1 to the data retention part of the nonvolatile FF. Subsequently, it informs the current mode control sequence circuit STBYC-FSM (a finite state machine for selecting standby current consumption mode) that the control signal NVCTL of the nonvolatile FF has completed control to all the nonvolatile FF by putting the acknowledge signal NVACK to "1". In the cycle C1-5, it detects that the acknowledge signal NVACK is at "1" and in the cycle C1-6, the current mode control sequence circuit STBYC-FSM conducts control by putting the control signal SW1-C of the power switch SW1 to "0". As a result, the power for the first region AE1 is shut down and the ground level VSSM1 of the first region AE1 increases gradually.

Complete shutdown of the power switch SW-1 is detected by the fact that the control signal SW-C is completely "0" and this is indicated by the ACK1 signal to the current mode control sequence circuit STBYC-FSM. In the cycle C1-7, the current mode control sequence circuit STBYC-FSM detects that the ACK1 signal has turned to "0" and, subsequently, the current mode control sequence circuit STBYC-FSM conducts voltage control for decreasing leakage in the nonvolatile circuit for the power line for the data retention VSS_SIG of the nonvolatile FF. In this case, due to transmission of the voltage controlled state for the current mode control sequence circuit VSS_SIG to the current mode sequence control circuit STBYC-FSM by the ACK_VSIG signal, the current mode control sequence circuit STBYC-FSM can recognize the state of the nonvolatile FF. Thus, transition from the power on state for power shutdown has been completed while retaining the data in the nonvolatile FF.

Figure 38:
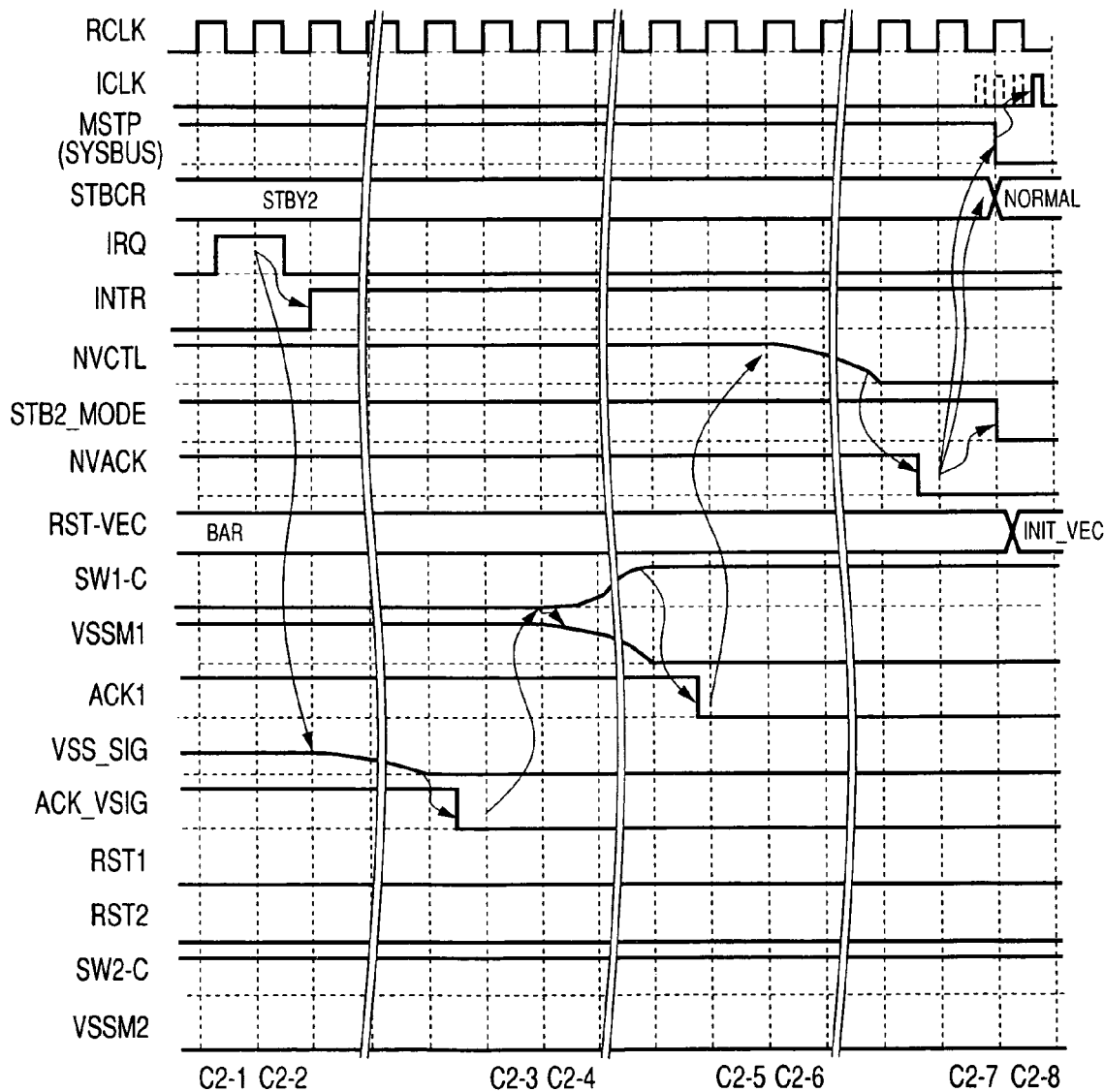
FIG. 38 is a timing chart for a return sequence returning from the second standby mode to the normal operation mode.

FIG. 38 shows a sequence of returning from the second standby mode by interruption. In the cycle C2-1, interruption occurs and then the interrupt request signal IRQ is set to "1". In the cycle C2-2, the control circuit for the standby mode STBYC receives this and then asserts the interrupt request after the return to the second standby mode INTR. At the same time, this control circuit conducts the operation of returning the voltage level of the power line for data retention VSS_SIG to the ground. In the cycle C2-3, the current mode control finite state machine STBYC-FSM detects that the ACK_VSIG signal is at "0" and receives information that the power line for data retention VSS_SIG is put to 0 V. Corresponding to the control of the ACK_VSIG signal to "0", the current mode control finite state machine STBYC-FSM turns the signal SW1-C for the power SW1 to "1" and turns ON the power for the first region AE1. Thus, the ground level VSSM1 of the first region AE1 is driven to 0 V. Then, when it is detected that the power switch has been turned to ON completely and the ACK1 signal turns to "1", the current mode control finite state machine STBYC-FSM receives information that the ACK1 signal turns to "1" in the cycle C2-5. The operation of restoring the data retracted to the nonvolatile circuit of a nonvolatile FF to the original latch is conducted by turning the NVCTL to "0", and this is started in the cycle C2-6. Completion of the data returning in all nonvolatile FF is recognized from the fact that the nonvolatile FF control signal NVCKL has turned completely to "0", which is transmitted to the current mode control finite state machine STBYC-FSM by turning the acknowledge signal NVACK to "0". In the cycle C2-7, the current mode control finite state machine STBYC-FSM detects that the acknowledge signal NVACK has turned to "0", turns module stop MST to "0", and restarts the internal clock ICLK, and then the operation of the CPU is started from the cycle C2-8. Since the value for the CPU execution start address RST-VEC is an address stored in the boot address register BAR, the operation start address of the CPU is not the boot address INIT-VEC, but is the address stored in the boot address register BAR. Subsequently, in the cycle C2-8, it is updated such that the second standby mode signal STABY2-MODE is put to zero and the value for the standby mode control register STBCR is put to "normal" indicative of the normal operation mode, by which the return has been completed.

In the constitution of FIG. 33, a built-in user memory URAM is present in the second region AE2 which does not undergo power shutdown even upon transition to the second standby mode and the data stored in the build-in user memory URAM is retained also in the second standby mode. Accordingly, in a case of mounting the nonvolatile FF by the minimum required number, the registers in the embedded circuit modules without retracting and returning by the non-volatile FF can be retracted and returned by using the build-in user memory URAM. At first, the data of the registers are retracted by executing the program which makes it possible to retract/return the data to/from the build-in user memory URAM, before writing to the standby mode control register STBCR that indicates the transition to the second standby mode. In this case, for recovery of the register value upon returning to the normal operation mode, it needs a program of transferring the data corresponding to the address indicated by the boot-address register BAR, which are stored in the built-in user memory URAM, to the register. The retracting and returning are not necessary for the registers with no requirement of retaining the value in the second standby mode. Accordingly, in a case of returning from the second standby mode at a higher speed, the number of the registers can be restricted.

Figure 39:
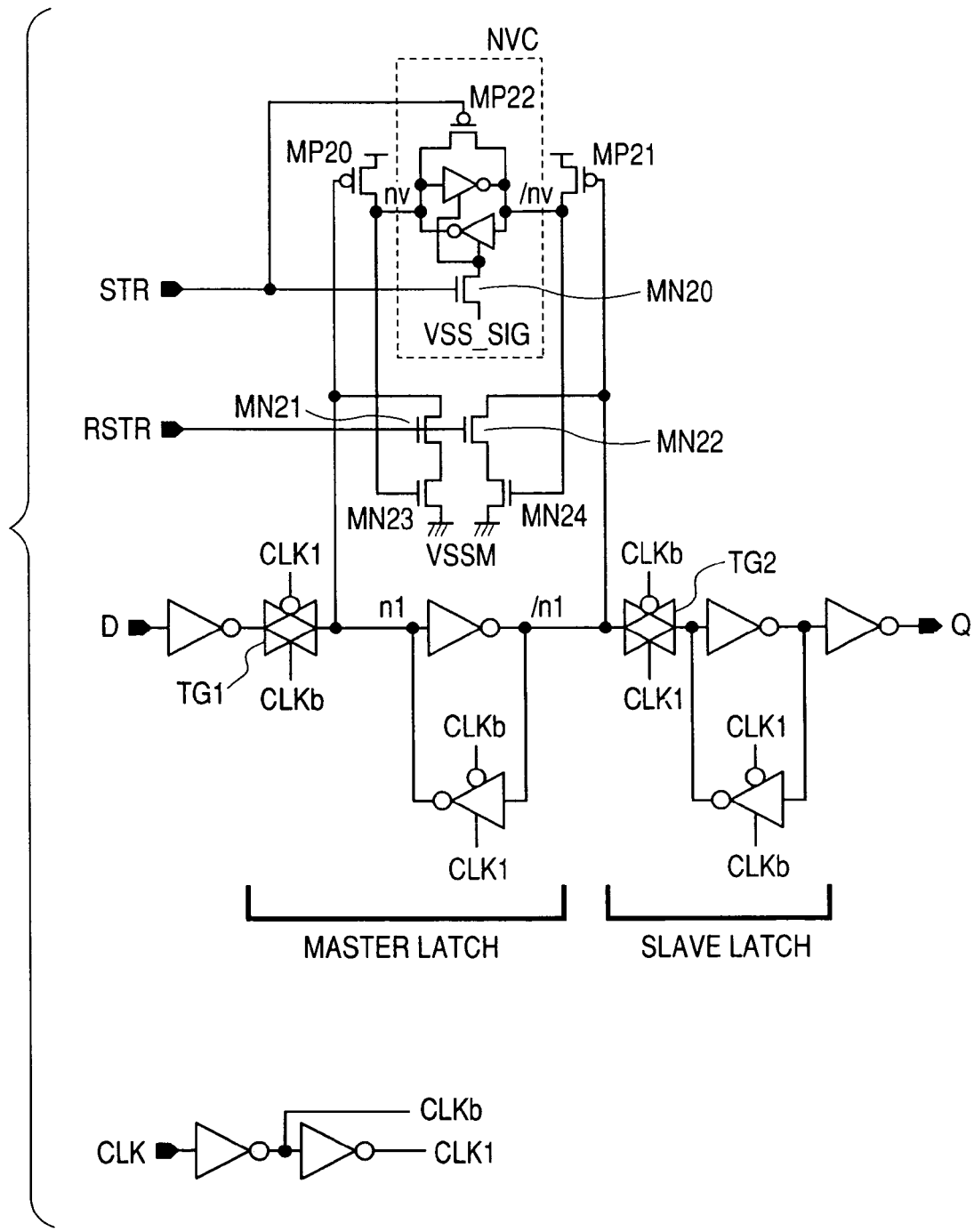
FIG. 39 is a schematic circuit diagram which shows a nonvolatile flip-flop (master-slave latch) in accordance with the invention.

FIG. 39 shows a further example of a nonvolatile FF. It has a nonvolatile circuit NVC provided to the master latch in the master-slave type latch circuit. In this constitution, data writing to the nonvolatile circuit NVC during power shutdown is conducted by using a differential amplifier. It is different from the master-slave latch shown in FIG. 10, in additionally providing a loop comprising two stages of inverters, precharge controlling transistor MN20, a nonvolatile circuit NVC including an equalizer transistor MP22, writing transistors (MP20, MP21), write back transistors (MN23, MN24), writing back control transistors (MN21, MN22), a power line for data retention VSS_SIG, a write control signal STR to the nonvolatile circuit NVC and a data writing back signal RSTR from the nonvolatile circuit NVC to the master-slave type latch circuit.

Figure 40:
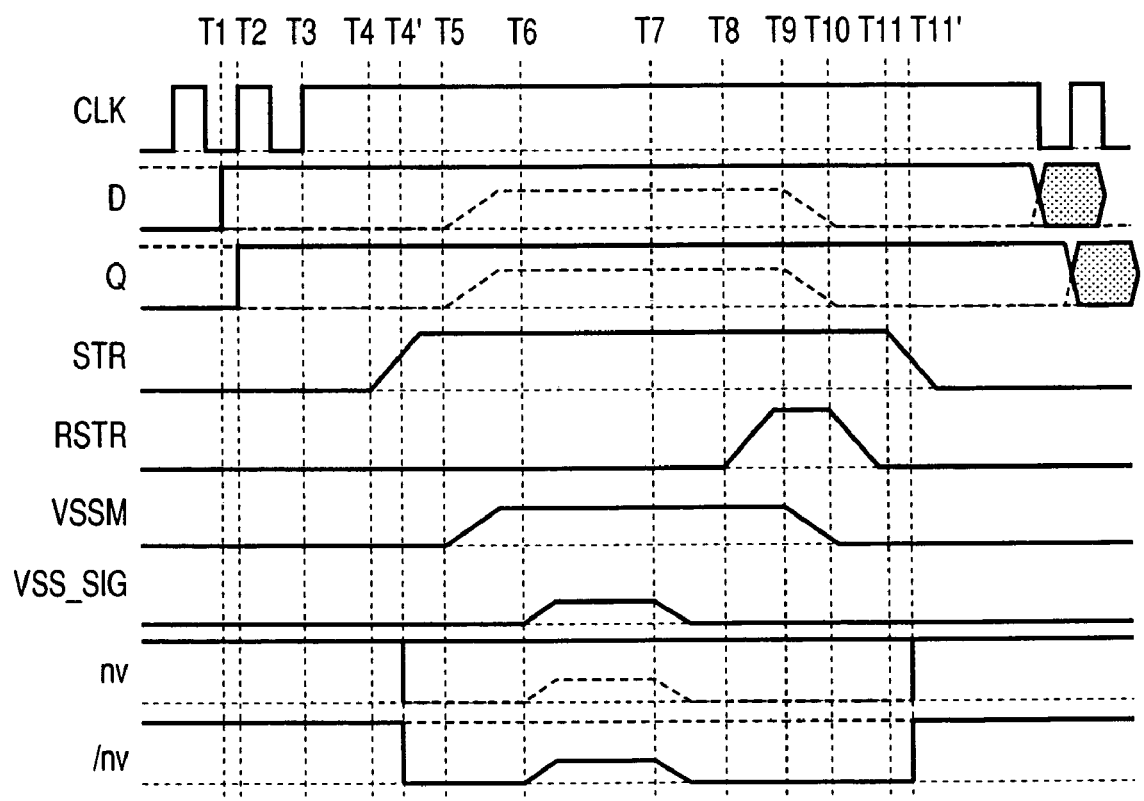
FIG. 40 is an operation waveform chart of the circuit shown in FIG. 39.

The operation of the nonvolatile FF in FIG. 39 will be described with reference to FIG. 40. The normal operation is possible in a case where both the control signal STR and the control signal RSTR are at LO and the virtual power line VSSM is at the ground level (0 V). In this step, in the master-slave type latch circuit, the input data D is taken into the master latch at the rising edge of the clock CLK and is transmitted to the output Q in the subsequent stage. When the control signal STR is at LO, since the precharge controlling transistor MN20 is turned OFF and the equalizer transistor MP22 is turned ON and, further, either the transistor MP20 or MP21 is turned ON in accordance with the value for the complementary node n1, /n1 of the master latch, the node nv, /nv is precharged to the power level VDD. When the clock CLK is at LO, the slave latch retains the data to retain the output Q to the succeeding stage. The graph shows an example where the input D changes at time T1, and the input data is outputted at the rising edge at time T2. The solid line shows a case in which the input changes from LO to HI, while the broken line shows the case where the input changes from HI to LO.

Subsequently, a sequence provided for power shut-down is conducted. At first, the clock is stopped at time T3. In this case, the clock CLK is stopped at HI in order to place the master latch in a latched state. That is, this is in a phase opposite to the case of providing the nonvolatile circuit NVC to the slave latch. Then, the latched data is retracted to the nonvolatile circuit NVC at time T4. This can be conducted by turning the control signal STR2 to the level HI. When the control signal STR is at the level HI, precharge is completed at time T4', either the transistor MP20 or MP21 in FIG. 39 turns ON and the other of them turns OFF and, in this state, the data is retracted to the latch comprising two stages of inverters. For example, in a case where the input D is at HI, since the transistor MP20 turns ON and the transistor MP21 turns OFF, the node nv is at HI while the node /nv is at LO. Subsequently, power shut-down control is conducted at time T5. In this case, the power on the ground side is disconnected. Further, for decreasing the leakage current, the voltage level for the data retention circuit power VSS_SIG at time T6 is controlled (for example, the voltage level is raised to a voltage value of higher than 0 V and about 0.6 V or lower when the power VDD is at 1.2 V). This can provide an effect of further decreasing the leakage current during the standby mode. The waveform shown by the broken line in the graph represents a case where the input data D is at LO.

Now, a description will be made regarding a sequence for returning the power. At time T7, control of returning the level for the power line for data retention VSS_SIG to 0 V is conducted, and control for returning the data of the nonvolatile circuit NVC to the original master latch corresponding to the turning of the power line for data retention VSS_SIG to 0 V is conducted. At first, a writing preparation for the data of the nonvolatile circuit NVC to the master latch is conducted. That is, this can be attained by turning the control signal RSTR to HI at time T8 thereby turning the writing control transistors (MN21, MN22) in FIG. 39 to ON. Since either the writing transistor (MN23 or MN24) is turned ON corresponding to the retained data in the non-volatile circuit NVC, either one of the complementary node n1 or /n1 of the master latch is driven to LO to attain a returning of data.

The data writing back to the master latch is attained by driving the virtual power line VSSM to the level LO. At time T9, control of the virtual power line VSSM to 0 V is started, and the latch data is written back in accordance with the data of the nonvolatile circuit NVC. Then, correspond to the driving of the virtual power line VSSM to 0 V, the control signal RSTR is put to LO at time T10 and the control signal RSTR is put to LO at time T11 thereby precharging the nonvolatile circuit NVC. Then, when the clock CLK is operated, operation is attained as usual.

Description will be made with respect to the merit of retaining data during power shutdown on the master latch. Generally, the size of transistors constituting the master latch is smaller than the transistors constituting the slave latch. Since the slave latch has to drive the load in the succeeding stage, the size of the transistor corresponding to the load is necessary. While the circuit portion for retaining the data during power shut-down (data retaining portion) is desirably constituted with transistors of a smaller size for decreasing the leakage current, the size for the data retention portion also has to be enlarged sometimes as the transistor size increases in the latch of the main body. Accordingly, in a case where the LSI system can transit to the standby mode by the clock CLK at HI, the size of transistors in the data retention portion can be made smaller by providing the data retention portion on the side of the master latch in which the transistor size is relatively small, thereby increasing the effect of saving the leakage current.

Also, in a case of providing the nonvolatile circuit NVC to the slave latch (FIG. 11 or the like), it is possible to use a differential amplifier for the writing to the nonvolatile circuit NVC. In this case, the clock upon power shutdown may be: clock CLK=LO.

Figure 41:
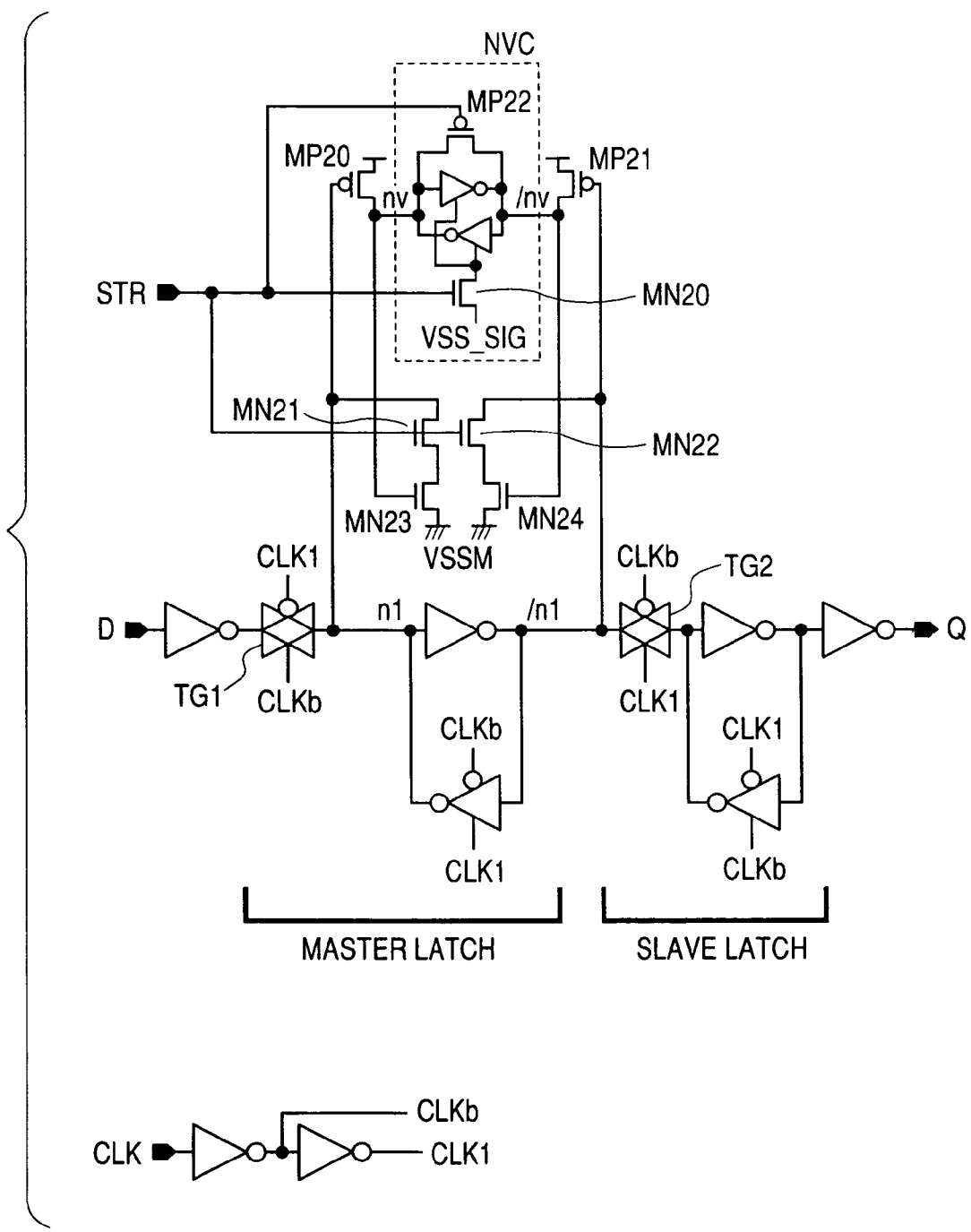
FIG. 41 is a schematic circuit diagram which shows a nonvolatile flip-flop (master-slave latch) in accordance with the invention.
Figure 42:
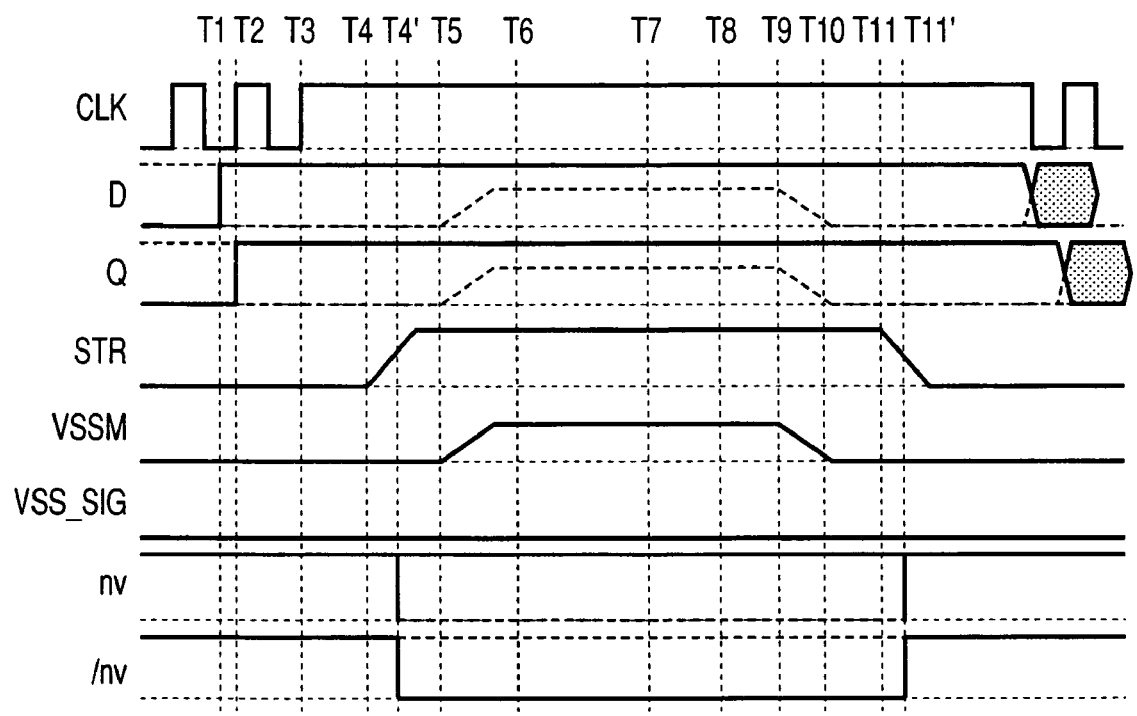
FIG. 42 is an operation waveform chart of the circuit shown in FIG. 41.

FIG. 41 shows a still further example of the nonvolatile FF, which is different from the example shown in FIG. 39 in that a single control signal is used. Accordingly, retraction and return between the nonvolatile circuit NVC and the master latch are conducted simultaneously. The fundamental control method is identical with that for FIG. 40. Description will be made with reference to FIG. 42. When the control signal STR is at HI, retention data is written into the nonvolatile circuit NVC in FIG. 41 and a route to the master latch on the side of 0 V is selectively formed in accordance with the written data to provide a state capable of retaining one identical data in the nonvolatile circuit NVC and the master latch. When the power is shut down in this state, while the data in the mater latch is eliminated, since the route to the VSSM level is ensured selectively, the data before power shut-down is returned when the virtual power line VSSM is controlled to 0 V in the next stage. Further, in the circuit shown in FIG. 41, when the voltage level for the power line for data retention VSS_SIG is changed, the gate potential of the writing transistor (MN23, MN24) increases depending on the relation between the VSSM level and the VSS_SIG level to provide a concern that none of them will be turned OFF completely in view of the relation of the potential difference with respect to VSSM corresponding to the source. However, also in such a case, this merely accelerates charging in the VSSM level to the direction of the VDD level and it has an effect of decreasing leakage in the retention circuit itself and decreasing the leakage after lapse of a sufficient time. Accordingly, in the LSI application use for which no frequent ON-OFF use is expected, an effect of reducing the power consumption can be obtained further by conducting the control for the power line for data retention VSS_SIG that is conducted at time T6, T7, as shown in FIG. 40, in addition to the timing chart shown in FIG. 42.

The feature of the example shown in FIG. 41 is that the number of control signals is reduced by one. Generally, since wirings tend to be complicated in a place where the latch is inserted, the layout can be facilitated by providing latches with a lesser number of signal lines to provide an advantageous effect in view of the operation speed and the area efficiency. Further, since the retraction and return of data while the control signal STR is at HI is interlocked with the control for the power source shut-down, that is, control for the VSSM level, it also provides an effect of facilitating the control.

The present invention concerns a semiconductor integrated circuit device and, more in particular, it is applied to a system LSI or a microprocessor requiring low power consumption.

What is claimed is:

1. A semiconductor integrated circuit device comprising plural flip-flops, plural logic circuits connected to output nodes of the plural flip-flops and first, second and third power lines, wherein:

the flip-flops each comprise a first latch circuit including an output node which is connected with the output node of the flip-flop and a second latch circuit including an input node which is connected with the output node or an input node of the first latch circuit, an operation voltage for the first latch circuit and the logic circuit is supplied from the first and the second power lines, an operation voltage for the second latch circuit is supplied from the first and the third power lines, the first and the second power lines are wired in a mesh-like form and each have a first wiring resistance, the third power line has a second wiring resistance, a wiring for connecting the input node of the second latch circuit and the output node or input node of the first latch circuit has a third wiring resistance, and a difference between the first wiring resistance and the second wiring resistance is smaller than a difference between the second wiring resistance and the third wiring resistance.

2. The semiconductor integrated circuit device according to claim 1, wherein:
the semiconductor integrated circuit device has a first mode and a second mode,
an operation voltage for the logic circuit and the flip-flops is supplied in the first mode,
supply of the operation voltage for the logic circuit and the flip-flop is supplied in the first mode, and
supply of the operation voltage to the logic circuit and the first latch circuit of the flip-flops is stopped, and the supply of the operation voltage for the second latch circuit of the flip-flops is continued in the second mode.

3. The semiconductor integrated circuit device according to claim 2, wherein:
a first MISFET having a source-drain path is provided between the first power line and the third power line, and
the first MISFET is controlled to an ON state in the first mode and the first MISFET is controlled to an OFF state in the second mode.

4. The semiconductor integrated circuit device according to claim 3, wherein:
the first latch circuit and the logic circuit include a second MISFET,
the second latch circuit includes a third MISFET, and
an absolute value for a threshold voltage of the third MISFET is larger than an absolute value for a threshold voltage of the second MISFET.

5. The semiconductor integrated circuit device according to claim 4, wherein:
an absolute value for a threshold voltage of the first MISFET is larger than the threshold voltage of the third MISFET.

6. The semiconductor integrated circuit device according to claim 2, wherein:
a fourth MISFET is provided for connecting the second latch circuit with the second power line, and
the fourth MISFET is turned ON in the first mode and the fourth MISFET is turned OFF in the second mode.

7. The semiconductor integrated circuit device according to claim 6, wherein:
a fifth MISFET is provided for connecting the second latch circuit with the third power line, and
the fifth MISFET is turned OFF in the first mode and the fifth MISFET is turned ON in the second mode.

8. The semiconductor integrated circuit device according to claim 1, wherein:
the operation voltage supplied to the second latch circuit in the second mode is made lower than the operation voltage supplied to the second latch circuit in the first mode.

9. The semiconductor integrated circuit device according to claim 1, wherein:
the second latch circuit has a capacitive element.

10. A semiconductor integrated circuit device comprising:
a first well of a first conductivity type extending in a first direction,
a second well of a second conductivity type disposed adjacent with the first well and extending in the first direction,
a first power line, disposed at an upper layer for the first well, extending in the first direction, for supplying a first potential,
a second power line, disposed at an upper layer for the second well, extending in the first direction and disposed in a layer identical with the first power line, for supplying a second potential,
a first CMOS circuit including a first MISFET of a second conductivity type formed at the first well and a second MISFET of a first conductivity type formed at the second well, and
a second CMOS circuit including a third MISFET of a second conductivity type formed at the first well and a fourth MISFET of a first conductivity type formed at the second well, wherein:
a source potential for the first MISFET of the first CMOS circuit is supplied by the first power line, and a source potential for the second MISFET of the first CMOS circuit is supplied by the second power line,
a source potential for the third MISFET of the second CMOS circuit is supplied by the first power line, and a source potential for the fourth MISFET is supplied by the third power line,
the first and second power lines are wired in a mesh-like form; and
the third power line is present in the layer identical with or below the first power line and the second power line, and has a portion in which a difference between a resistance thereof and a resistance of the first power line or the second power line is smaller than a difference of a resistance between the first power line and the second power line.

11. The semiconductor integrated circuit device according to claim 10, wherein:
plural first power reinforcing lines are provided which are connected with the first power line and which extend in a second direction crossing the first direction,
the first MISFET to fourth MISFET are arranged between adjacent first power reinforcing lines among the plural first power reinforcing lines, and
the third power line has a portion extending in the second direction.

12. The semiconductor integrated circuit device according to claim 10, wherein:
plural second power reinforcing lines are provided which are connected with the second power line and which extend in the second direction crossing the first direction,
the first MISFET to fourth MISFET are arranged between adjacent second power reinforcing lines among the plural second power reinforcing lines, and
the third power line has a portion extending in the second direction.

13. The semiconductor integrated circuit device according to claim 10, wherein:
the third power line is disposed in parallel with the first power line and the second power line.

14. The semiconductor integrated circuit device according to claim 10, wherein:
the semiconductor integrated circuit device comprises plural flip-flops and plural logic circuits connected to output nodes of the plural flip-flops,
the flip-flops each have a first latch circuit including an output node which is connected with the output node of the flip-flop, and a second latch circuit including an input node which is connected with the output node or an input node of the first latch circuit,
the first latch circuit and the logic circuit are comprised of the first CMOS circuit, and the second latch circuit is comprised of the second CMOS circuit.

15. The semiconductor integrated circuit device according to claim 10, wherein:
an absolute value for a threshold voltage of the third MISFET is larger than an absolute value for a threshold voltage of the first MISFET, and
an absolute value for a threshold voltage of the fourth MISFET is larger than an absolute value for a threshold voltage of the second MISFET.

16. The semiconductor integrated circuit device according to claim 10, wherein:
plural first power reinforcing lines are provided which are connected with the first power line and which extend in a second direction crossing the first direction,
the first MISFET to fourth MISFET are arranged between adjacent first power reinforcing lines among the plural first power reinforcing lines,
plural second power reinforcing lines are provided which are connected with the second power line and which extend in the second direction crossing the first direction,
the first MISFET to fourth MISFET are arranged between adjacent second power reinforcing lines among the plural second power reinforcing lines, and
the first and second power reinforcing lines are placed at a substantially equal distance relative to each other.

17. A semiconductor integrated circuit device comprising a logic circuit block having plural flip-flops and plural logic circuits connected with the plural flip-flops and having a first operation mode and a second operation mode, and a clock generation circuit for generating clock signals to be supplied to the logic circuit block, in which the flip-flops each comprise:
a first latch circuit including an output node which is connected with an output node of the flip-flop,
a second latch circuit including an input node which is connected with an input node or the output node of the first latch circuit and
a transfer gate disposed between an input node of the flip-flop and the input node of the first latch circuit,
wherein a first operation voltage is supplied to the first latch circuit and the logic circuit and a second operation voltage is supplied to the second latch circuit,
wherein the clock generation circuit supplies clock signals to the transfer gate in the first operation mode,
wherein, when supply of the first operation voltage to the first latch circuit and the logic circuit is stopped, the second operation voltage is supplied to the second latch circuit and the clock generation circuit stops supply of the clock signal to the transfer gate in the second operation mode,
wherein the transfer gate is turned off for a predetermined period upon transition from the second operation mode to the first operation mode, after the first operation voltage for the first latch circuit of the flip-flop arrives at a predetermined level, and before starting the supply of the clock signal to the transfer gate, wherein data of the second latch circuit is written back to the first latch circuit for the predetermined period of time,
wherein the first operation voltage is supplied from the first and second power lines,
wherein the second operation voltage is supplied from the first power line and the third power line,
wherein the first and second power lines are wired in a mesh-like form,
wherein the first power line has a first wiring resistance,
wherein the second power line has a second wiring resistance,
wherein the third power line has a third wiring resistance, and
wherein a difference between the first wiring resistance and the third wiring resistance is smaller than a difference between the first wiring resistance and the second wiring resistance.

18. The semiconductor integrated circuit device according to claim 17, wherein:
a clock inverter supplied with the second operation power is provided between the node of the first latch circuit and the input node of the second latch circuit, and
the clocked inverter is shut off in the second operation mode.

19. The semiconductor integrated circuit device according to claim 17, wherein:
an amount of current supplied to the second latch circuit in the first mode is controlled to be larger than an amount of current supplied to the second latch circuit in the second mode.

20. The semiconductor integrated circuit device according to claim 17, wherein:
the second operation voltage in the second mode is made lower than the second operation voltage in the first mode.

21. The semiconductor integrated circuit device according to claim 17, wherein
the second latch circuit has a capacitance element.

22. The semiconductor integrated circuit device according to claim 17, wherein:
the first latch circuit and the logic circuit include a first MISFET,
the second latch circuit includes a second MISFET, and
an absolute value for a threshold voltage of the second MISFET is larger than an absolute value for a threshold voltage of the first MISFET.

23. The semiconductor integrated circuit device according to claim 17, wherein:
a wiring for connecting the input node or the output node of the first latch circuit with the input node of the second latch circuit has a fourth wiring resistance, and
the difference between the first wiring resistance or the second wiring resistance and the third wiring resistance is smaller than a difference between the fourth wiring resistance and the third wiring resistance.

* * * * *